(12) United States Patent
Ogura

(10) Patent No.: US 7,816,206 B2
(45) Date of Patent: Oct. 19, 2010

(54) SEMICONDUCTOR DEVICE AND METHOD FOR FABRICATING THE SAME

(75) Inventor: Jusuke Ogura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 11 days.

(21) Appl. No.: 12/318,580

(22) Filed: Dec. 31, 2008

(65) Prior Publication Data

US 2009/0176359 A1 Jul. 9, 2009

Related U.S. Application Data

(62) Division of application No. 11/253,739, filed on Oct. 20, 2005, now abandoned.

(30) Foreign Application Priority Data

Mar. 31, 2005 (JP) .............................. 2005-105507
Jul. 29, 2005 (JP) .............................. 2005-222119

(51) Int. Cl.
*H01L 21/336* (2006.01)

(52) U.S. Cl. .................. 438/257; 438/258; 438/297; 438/593; 257/E21.625; 257/E21.628; 257/E21.679

(58) Field of Classification Search ......... 438/257–258, 438/297, 593; 257/314
See application file for complete search history.

(56) References Cited

U.S. PATENT DOCUMENTS 6,034,416 A 3/2000 Uehara et al.
6,121,670 A 9/2000 Hisamune
6,537,880 B1 3/2003 Tseng
2002/0197795 A1* 12/2002 Saito .......................... 438/257
2005/0093047 A1* 5/2005 Goda et al. ................. 257/300

FOREIGN PATENT DOCUMENTS

| CN | 1581462 A | 2/2005 |
|---|---|---|
| JP | 07-066276 A | 3/1995 |
| JP | 10-98170 A | 4/1998 |
| JP | 2000-323564 A | 11/2000 |
| JP | 2002-26152 A | 1/2002 |
| JP | 2002-076148 A | 3/2002 |
| JP | 2002-158281 A | 5/2002 |
| JP | 2003-289114 A | 10/2003 |

OTHER PUBLICATIONS

Office Action issued by Chinese Patent Office on Jul. 18, 2008 in Chinese Appln. No. 200510125091.2.
Japanese Office Action dated May 11, 2010, issued in corresponding Japanese Patent Application No. 2005-222119.

* cited by examiner

*Primary Examiner*—A. Sefer
(74) *Attorney, Agent, or Firm*—Westerman, Hattori, Daniels & Adrian, LLP

(57) ABSTRACT

The semiconductor device comprises a silicon substrate 14 having a step formed in the surface which makes the surface in a flash memory cell region 10 lower than the surface in a peripheral circuit region 12; a device isolation region 20a formed in a trench 18 in the flash memory cell region 10; a device isolation region 20c formed in a trench 24 deeper than the trench 18 in the peripheral circuit region 12; a flash memory cell 46 including a floating gate 32 and a control gate 40 formed on the device region defined by the device isolation region 20a; and transistors 62, 66 formed on the device regions defined by the device isolation region 20c.

12 Claims, 59 Drawing Sheets

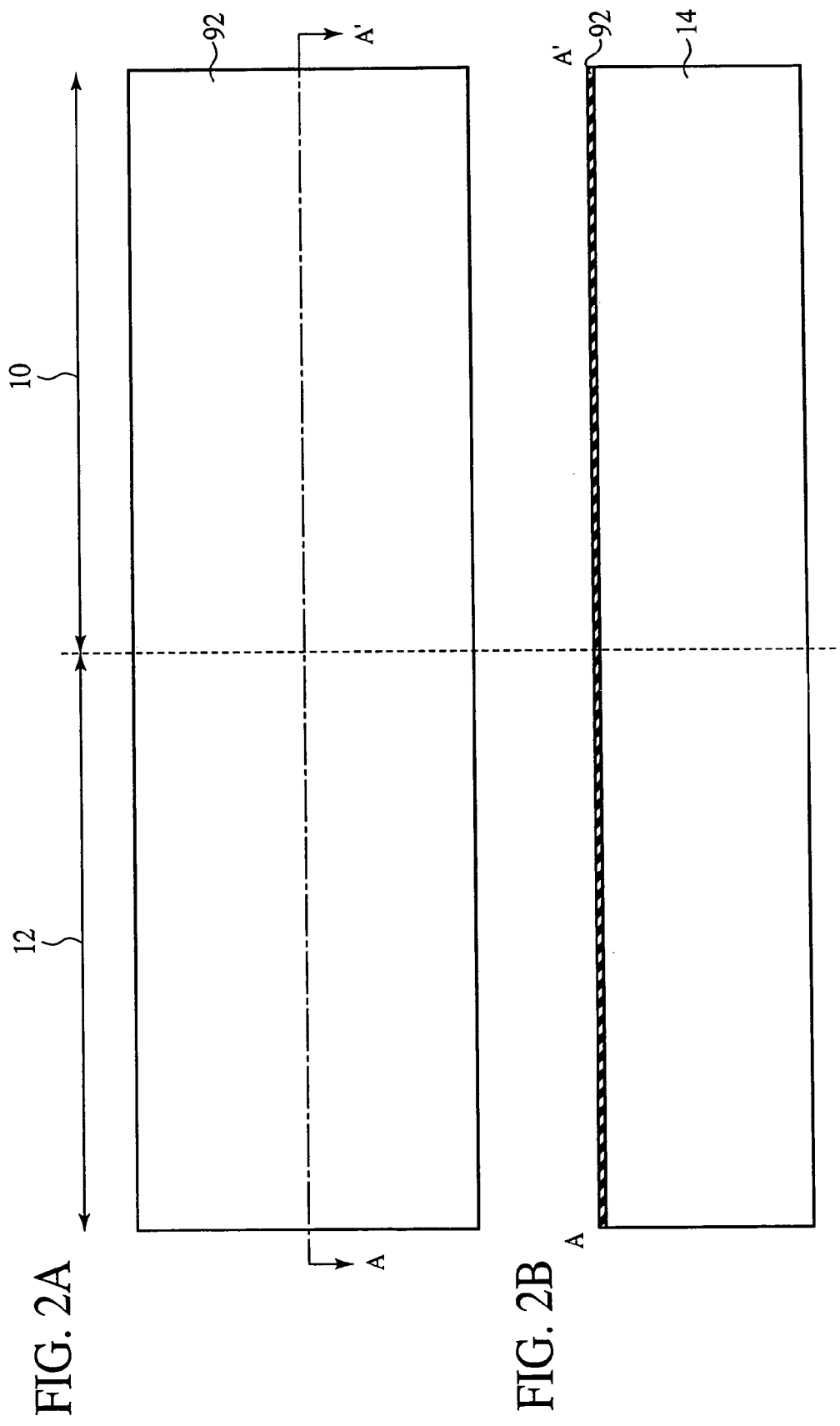

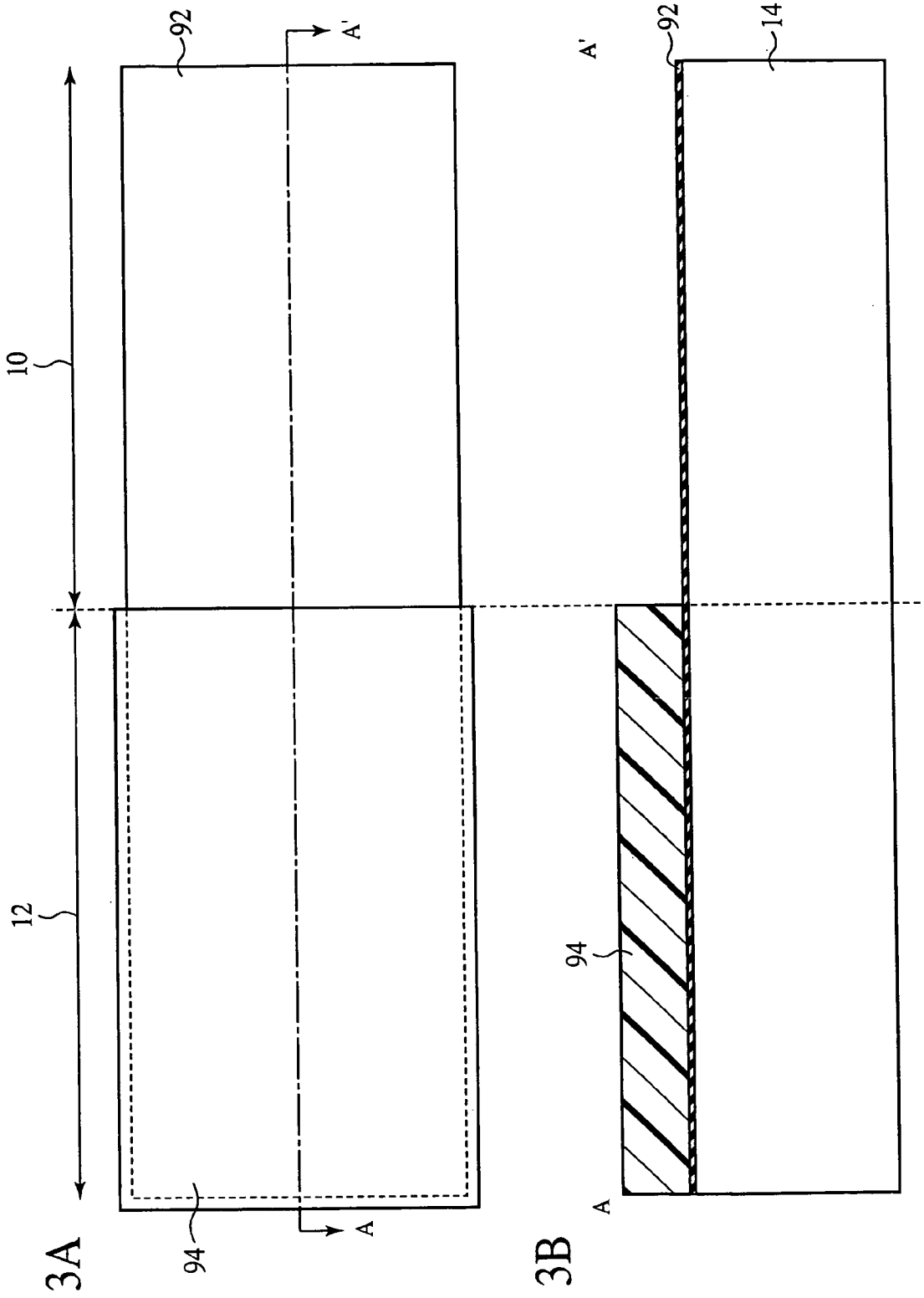

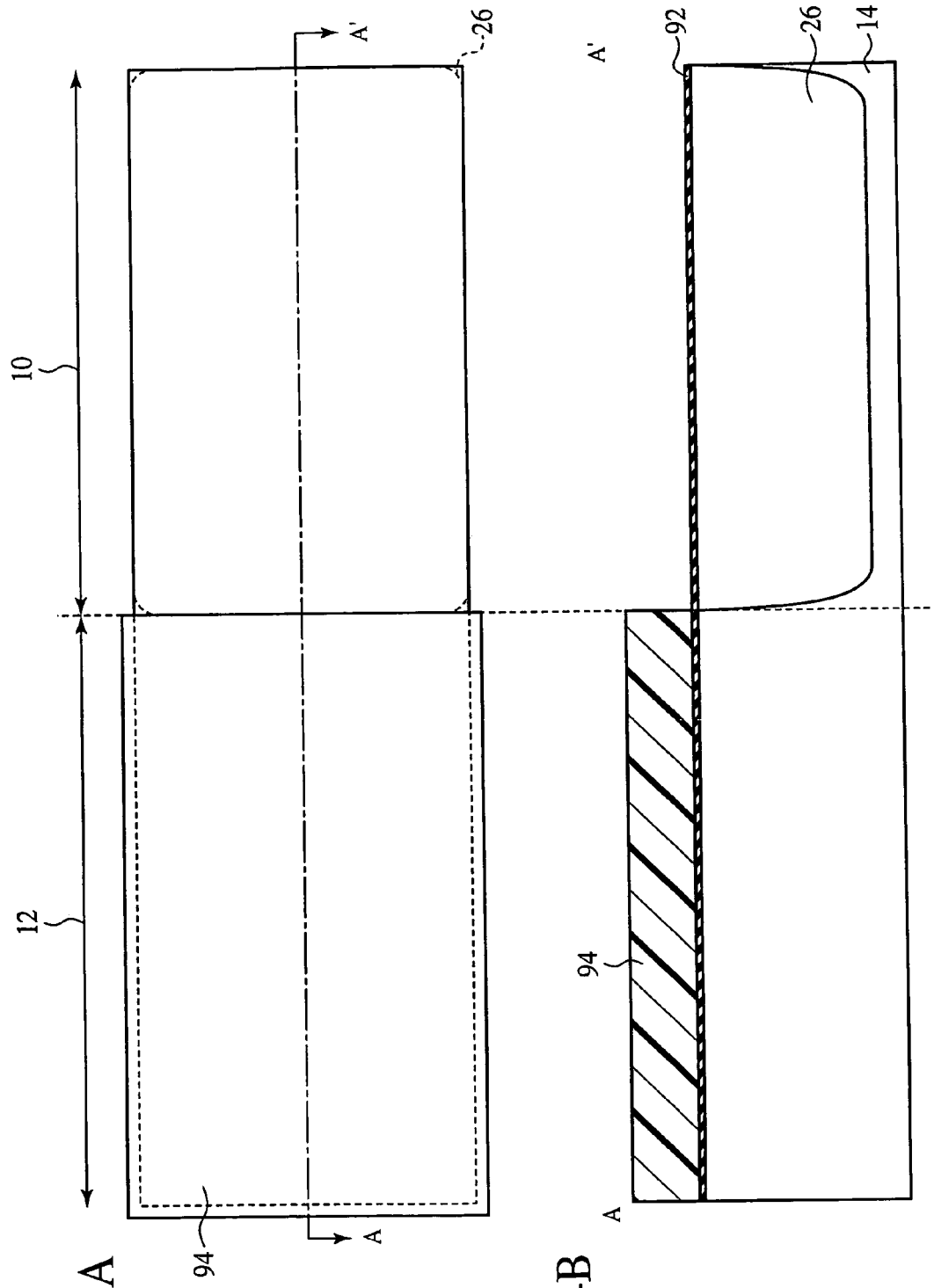

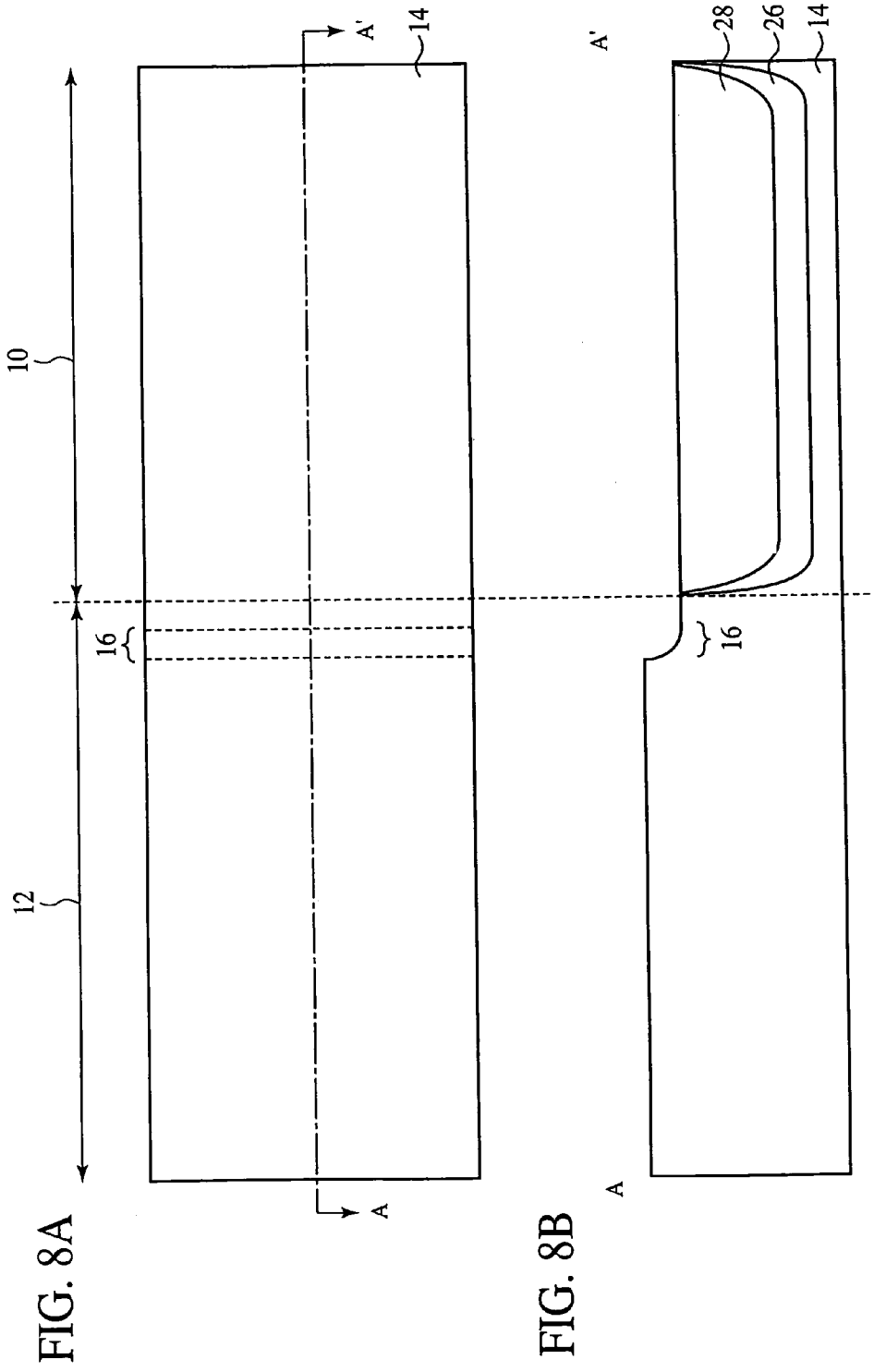

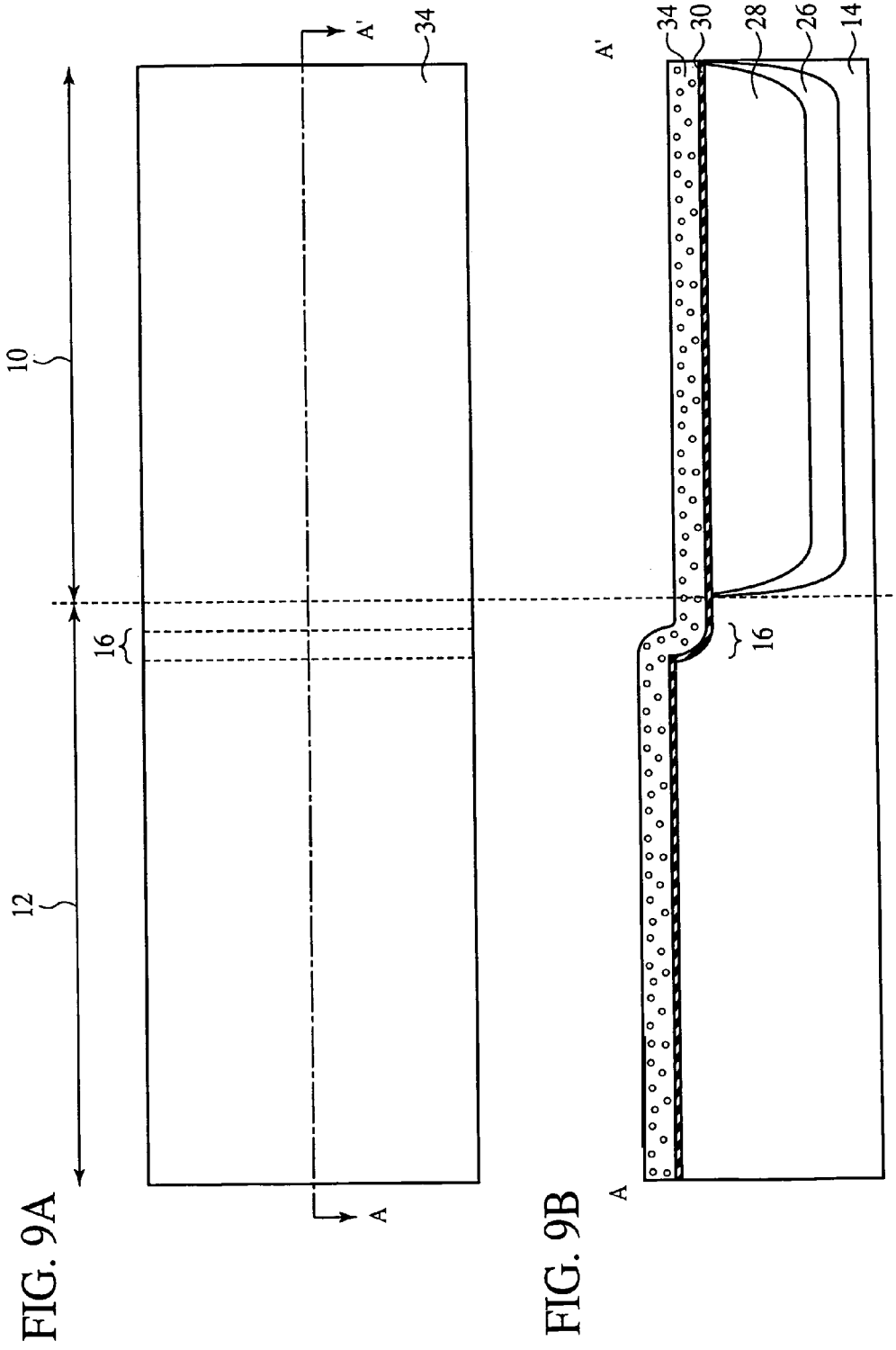

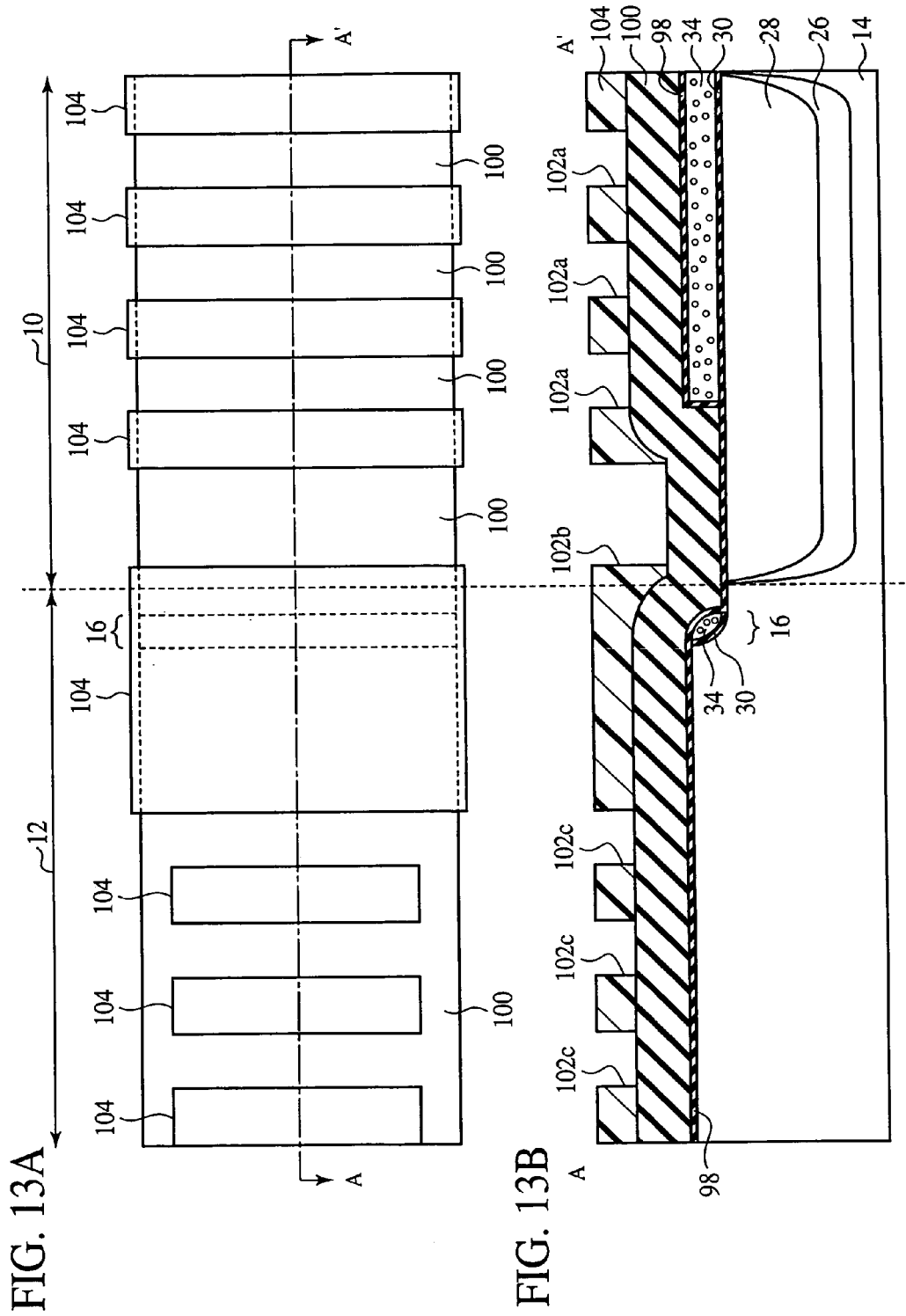

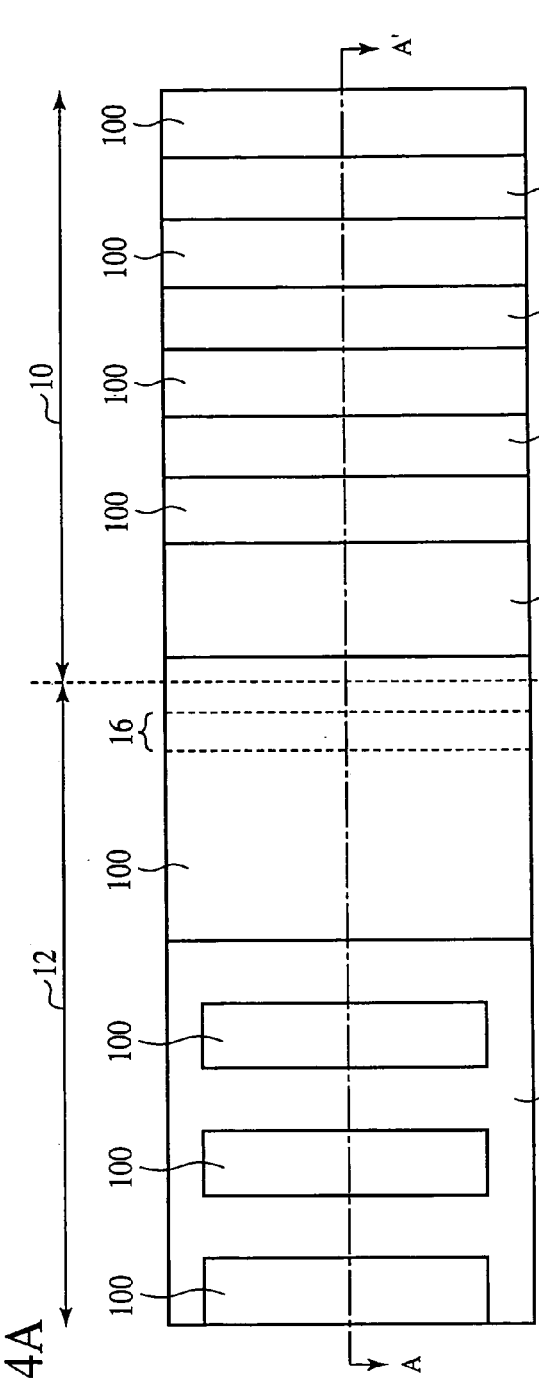
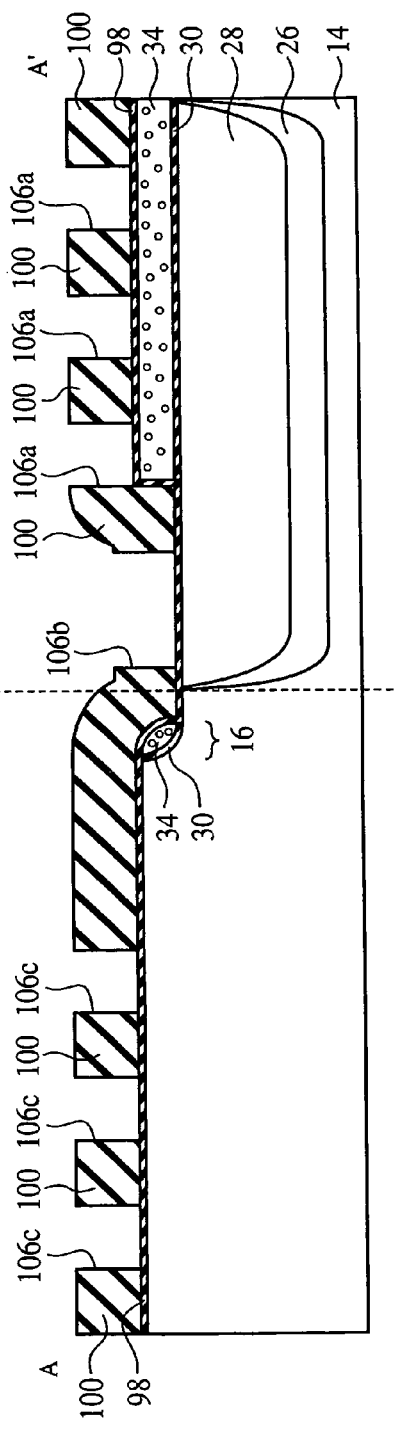
FIG. 14A
FIG. 14B

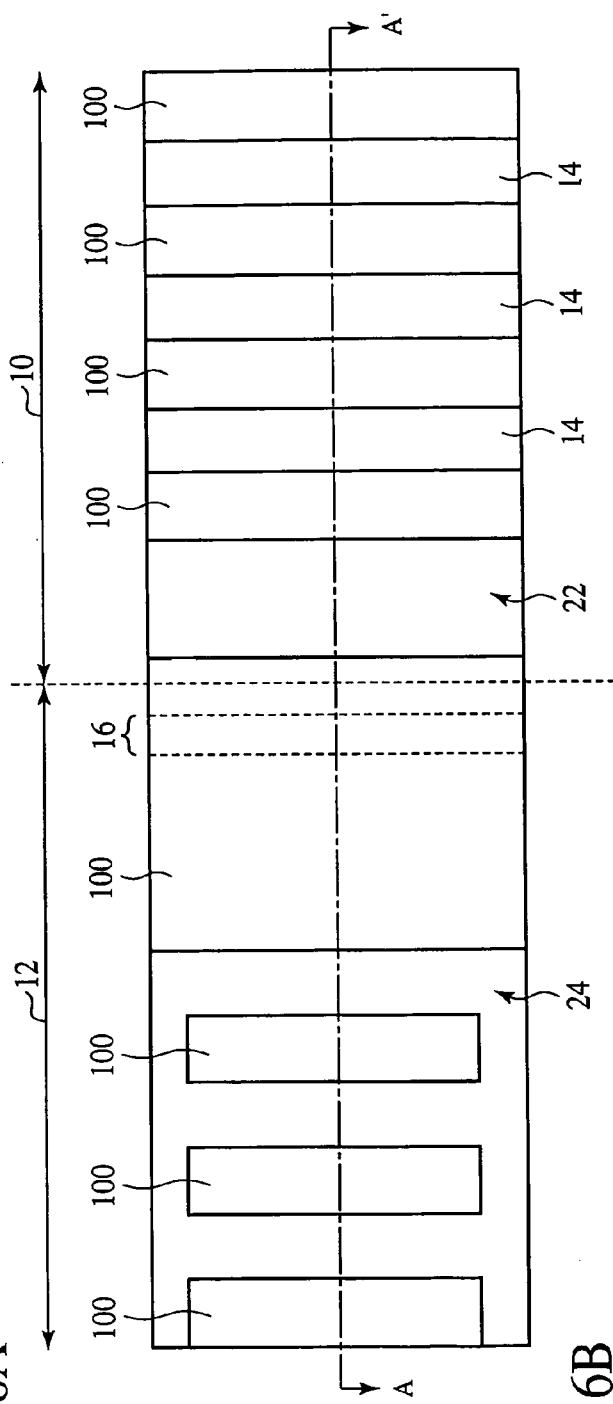
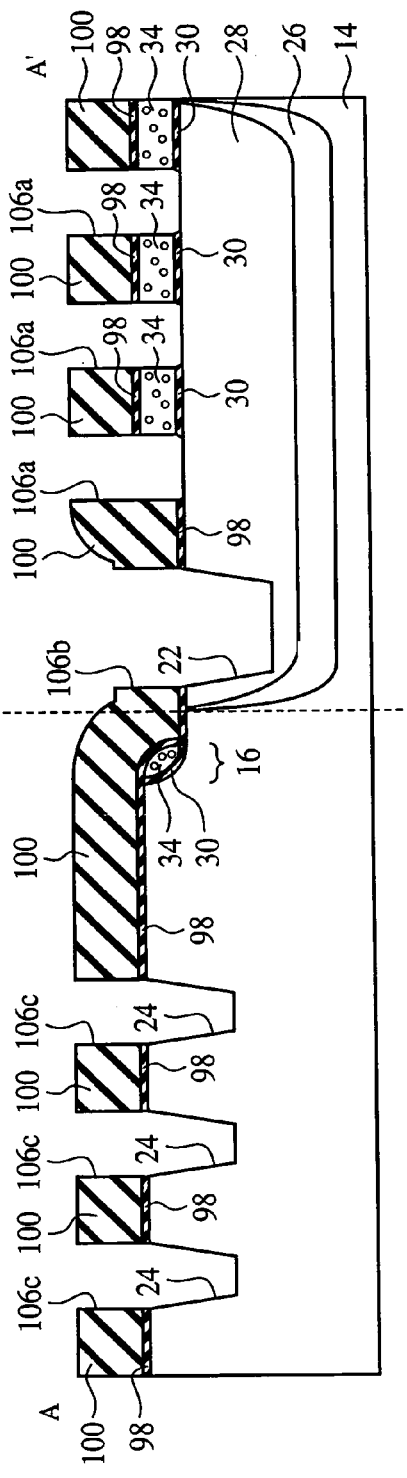
FIG. 16A
FIG. 16B

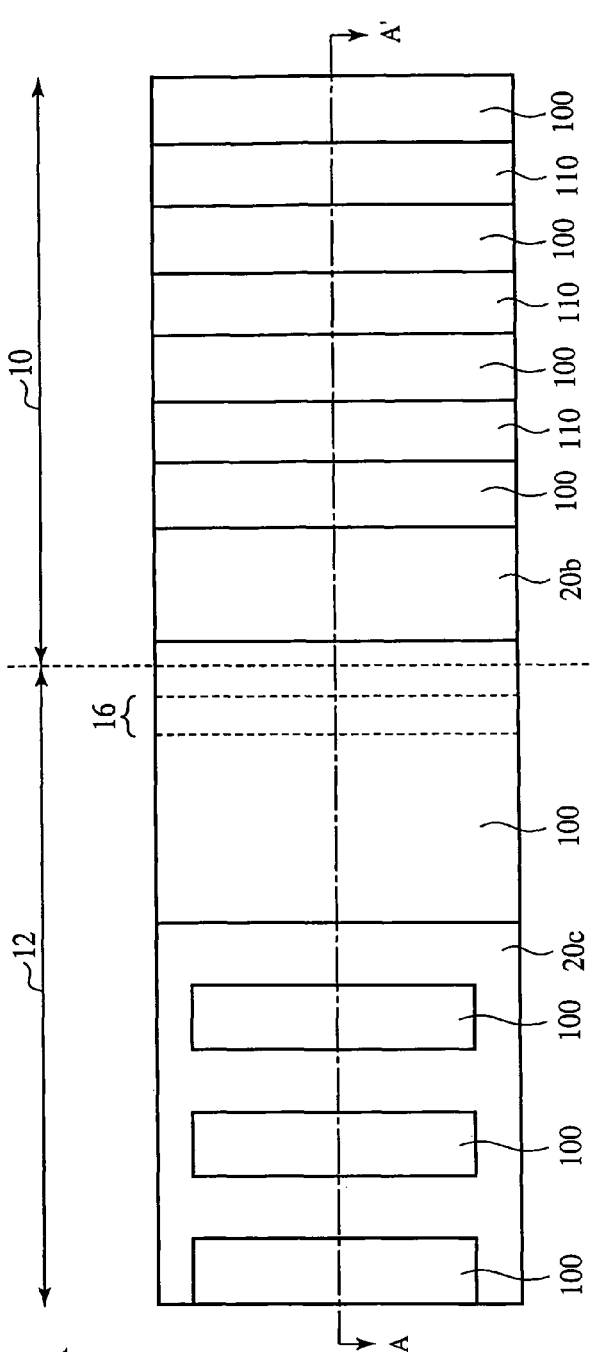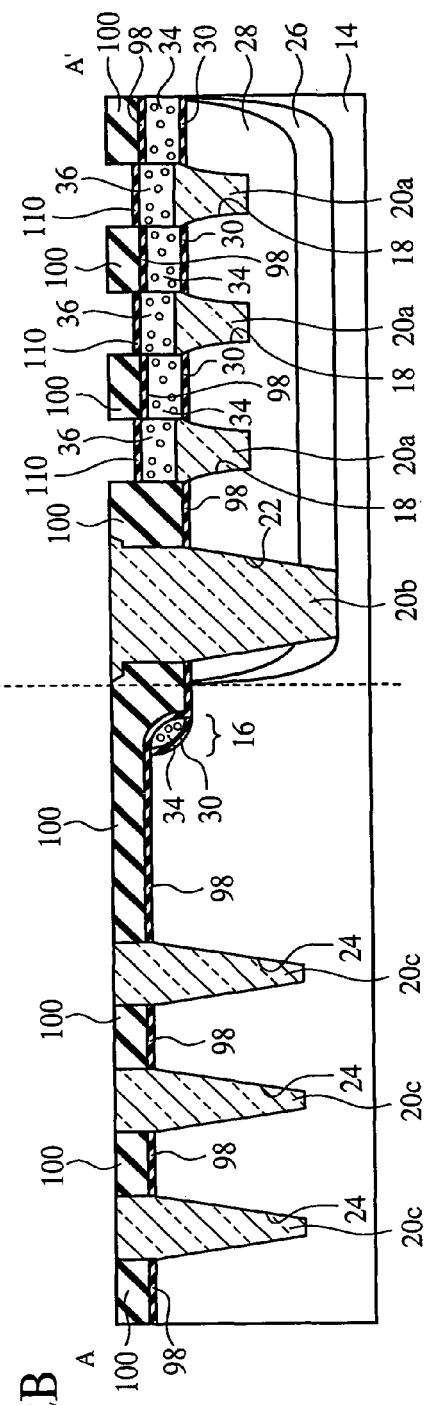
FIG. 22A
FIG. 22B

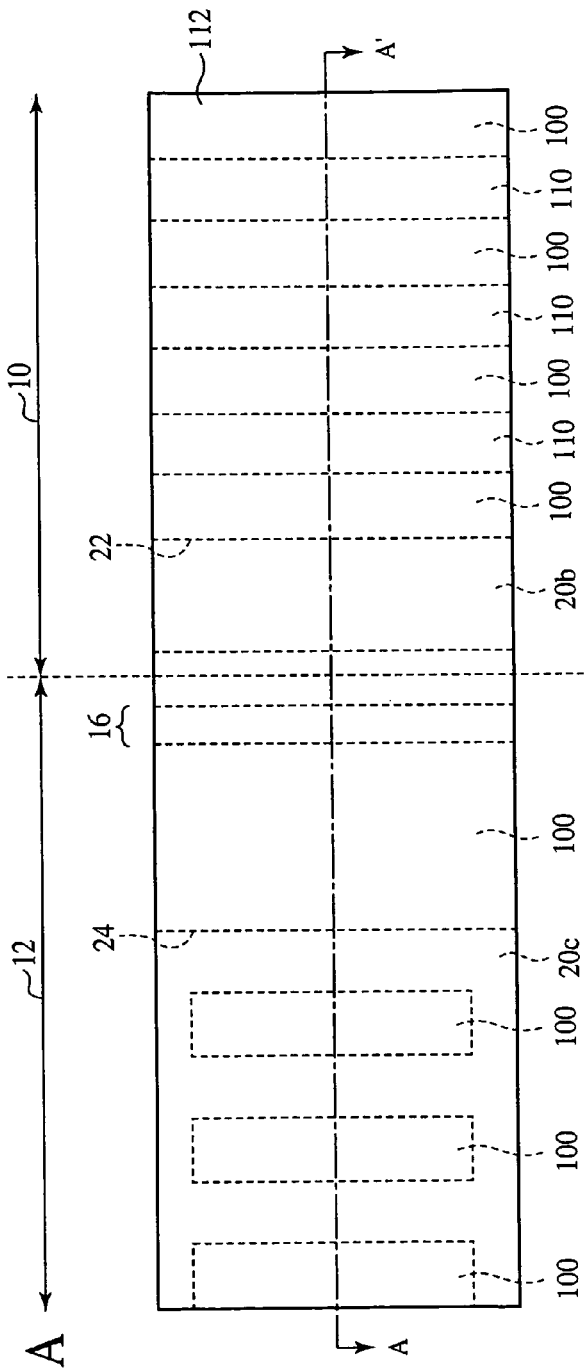
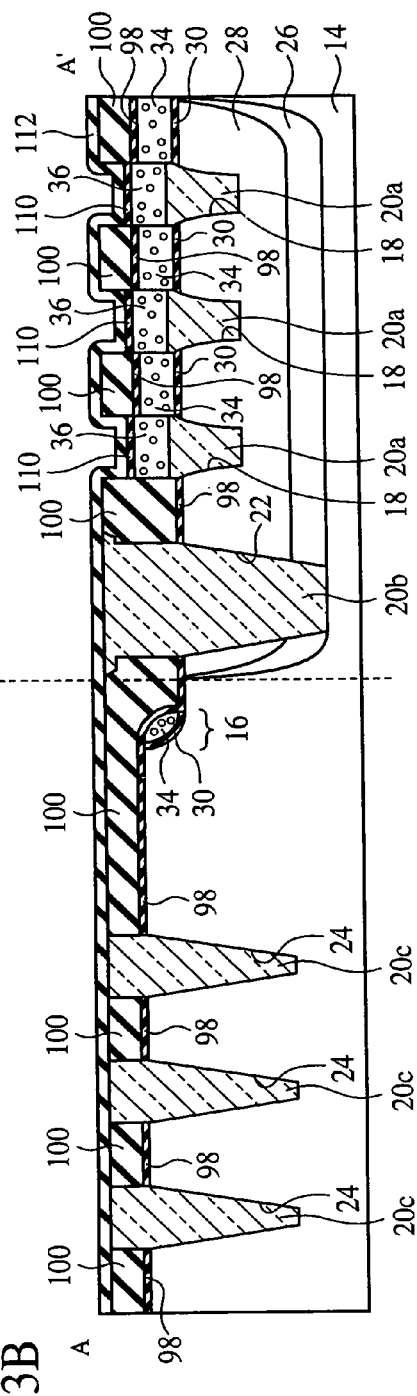
FIG. 23A
FIG. 23B

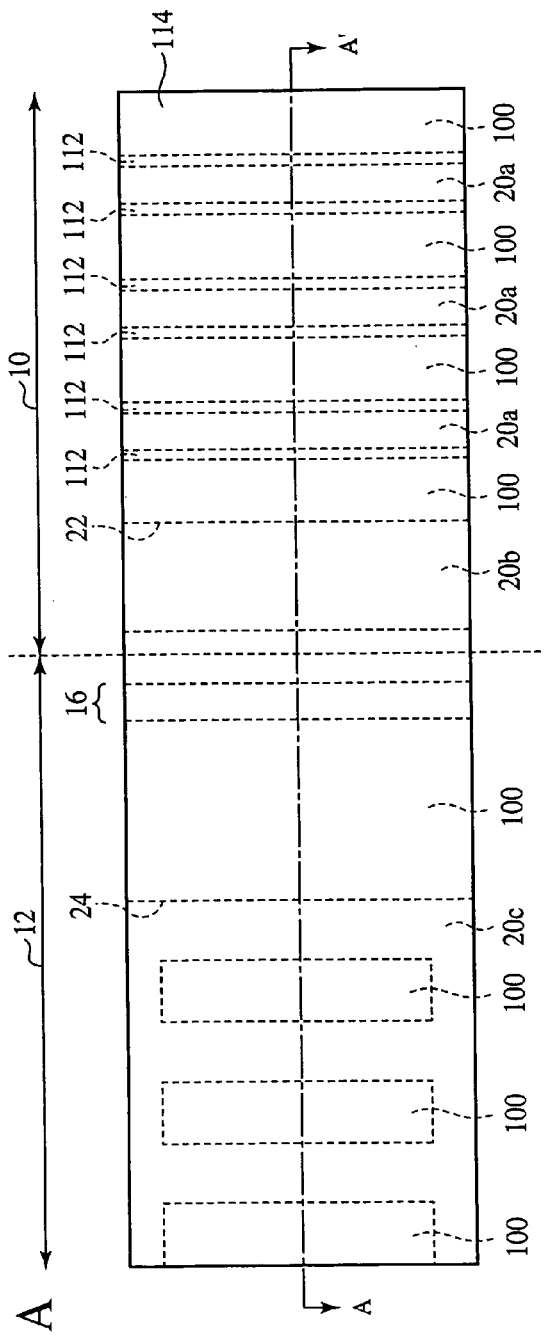
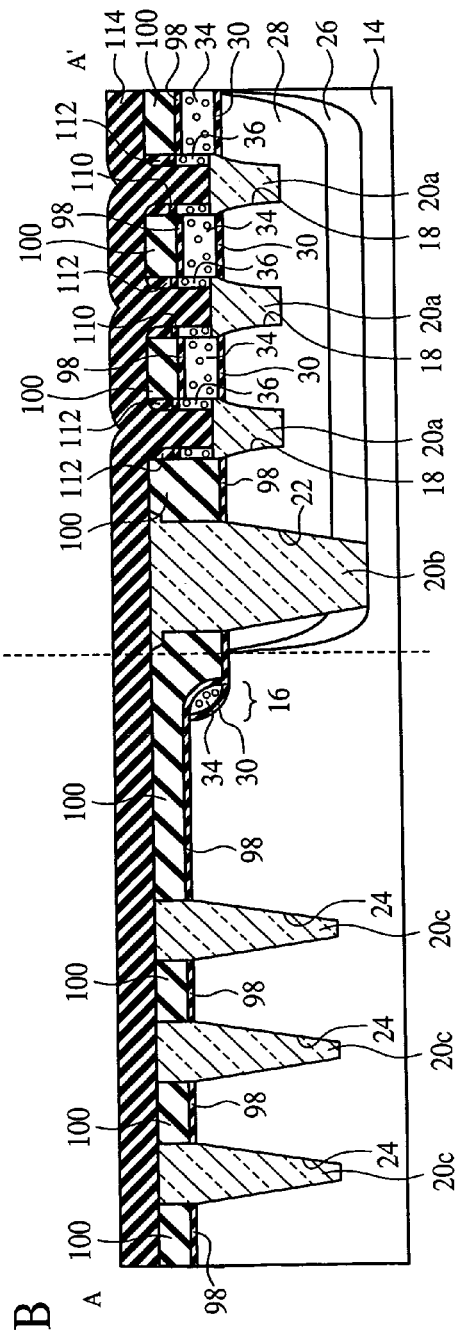
FIG. 25A
FIG. 25B

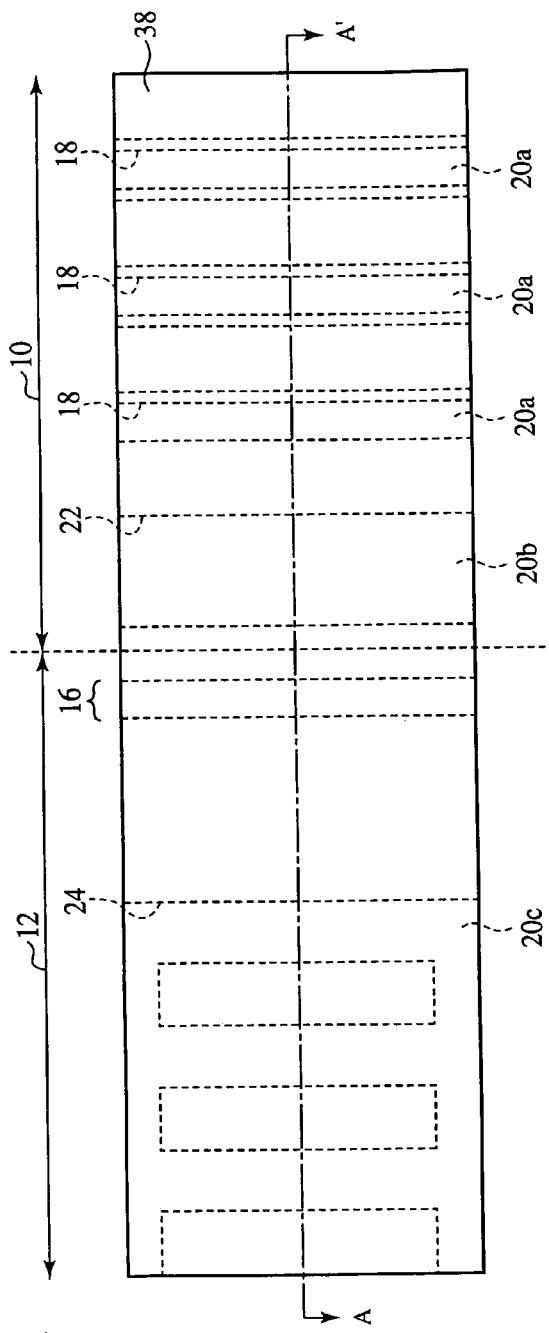
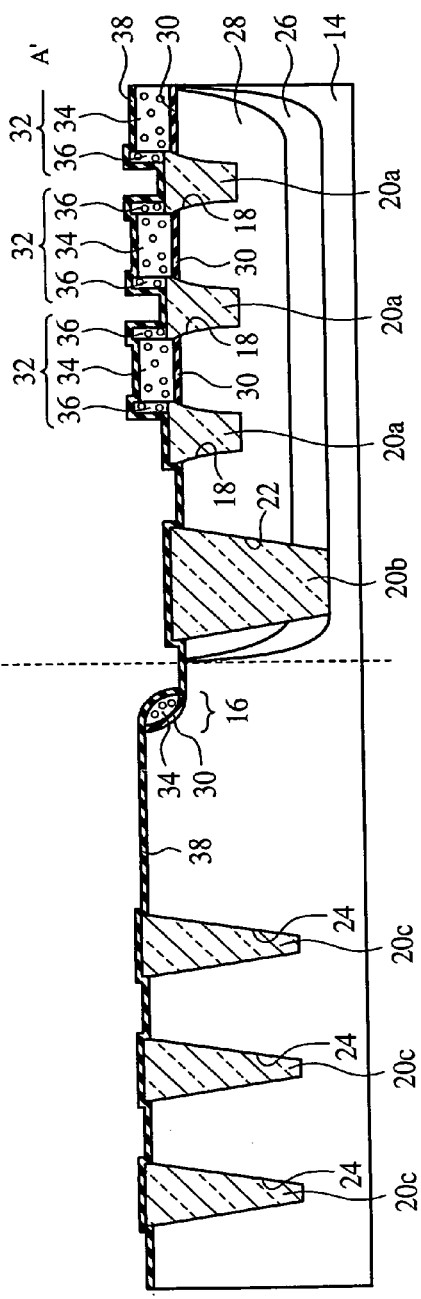
FIG. 29A
FIG. 29B

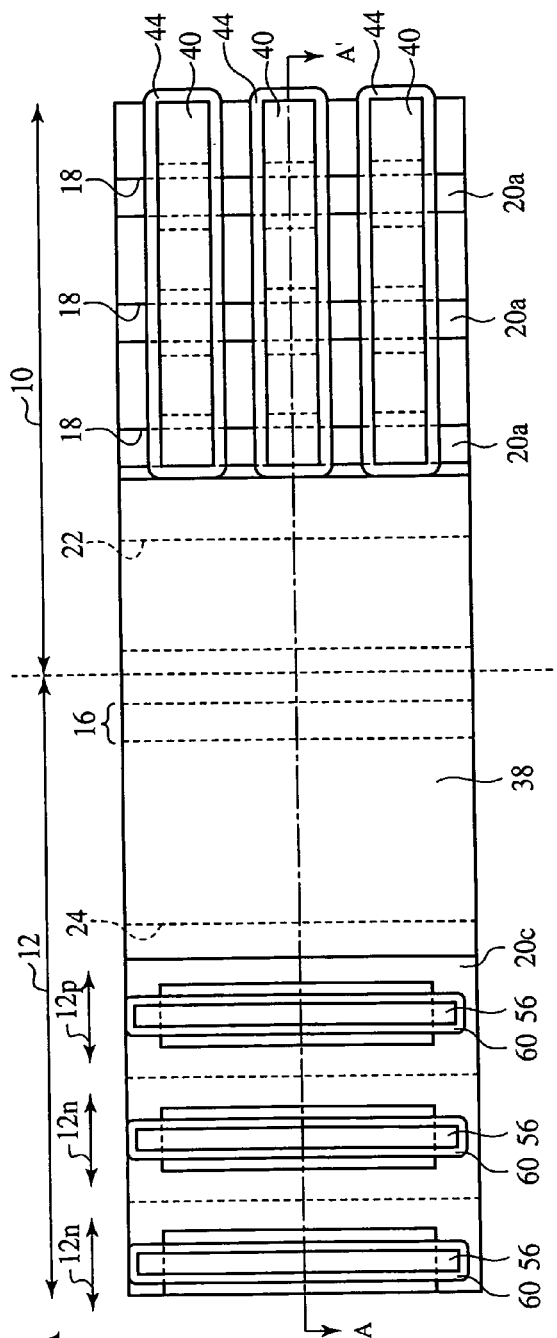
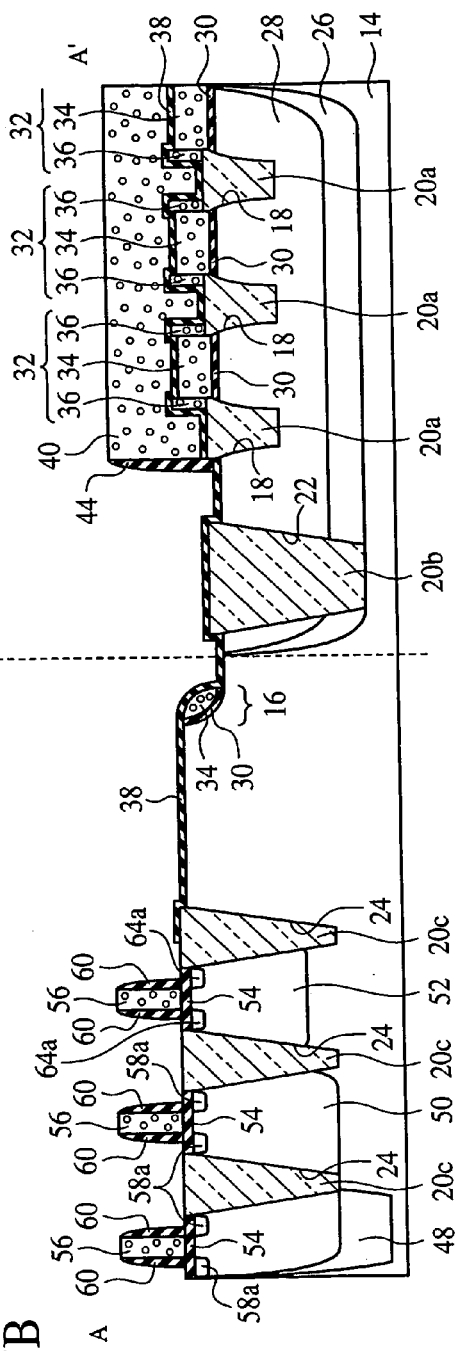
FIG. 37A
FIG. 37B

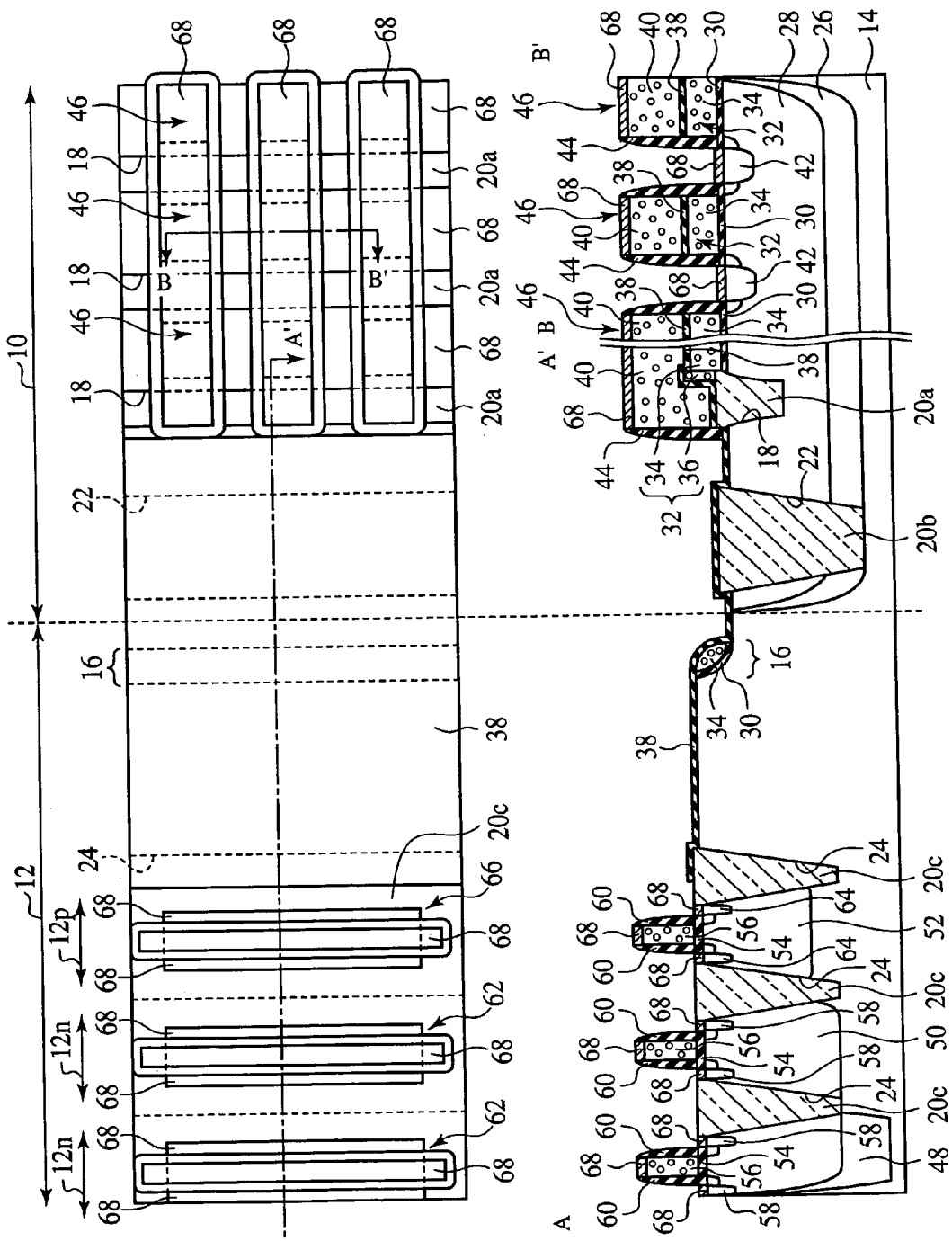

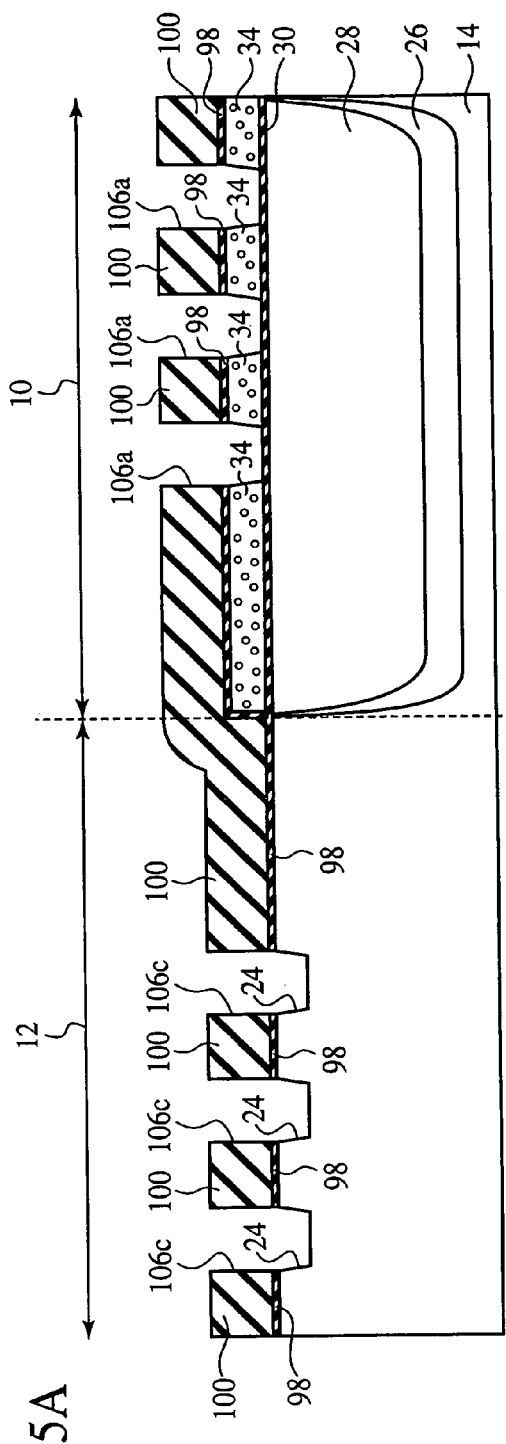
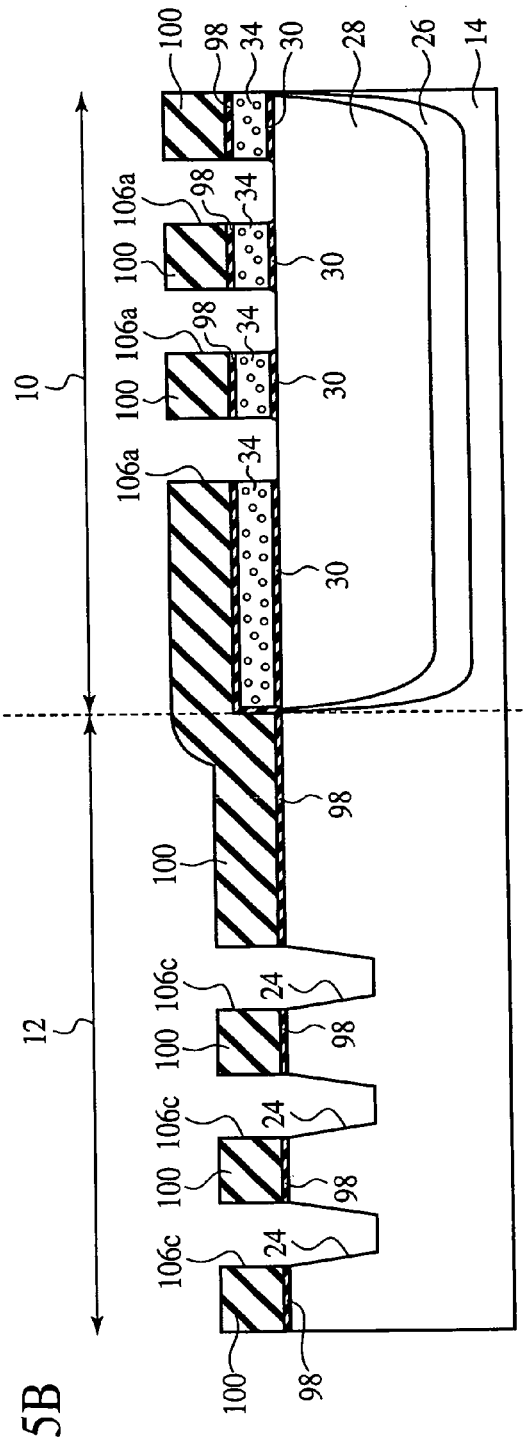
FIG. 45A
FIG. 45B

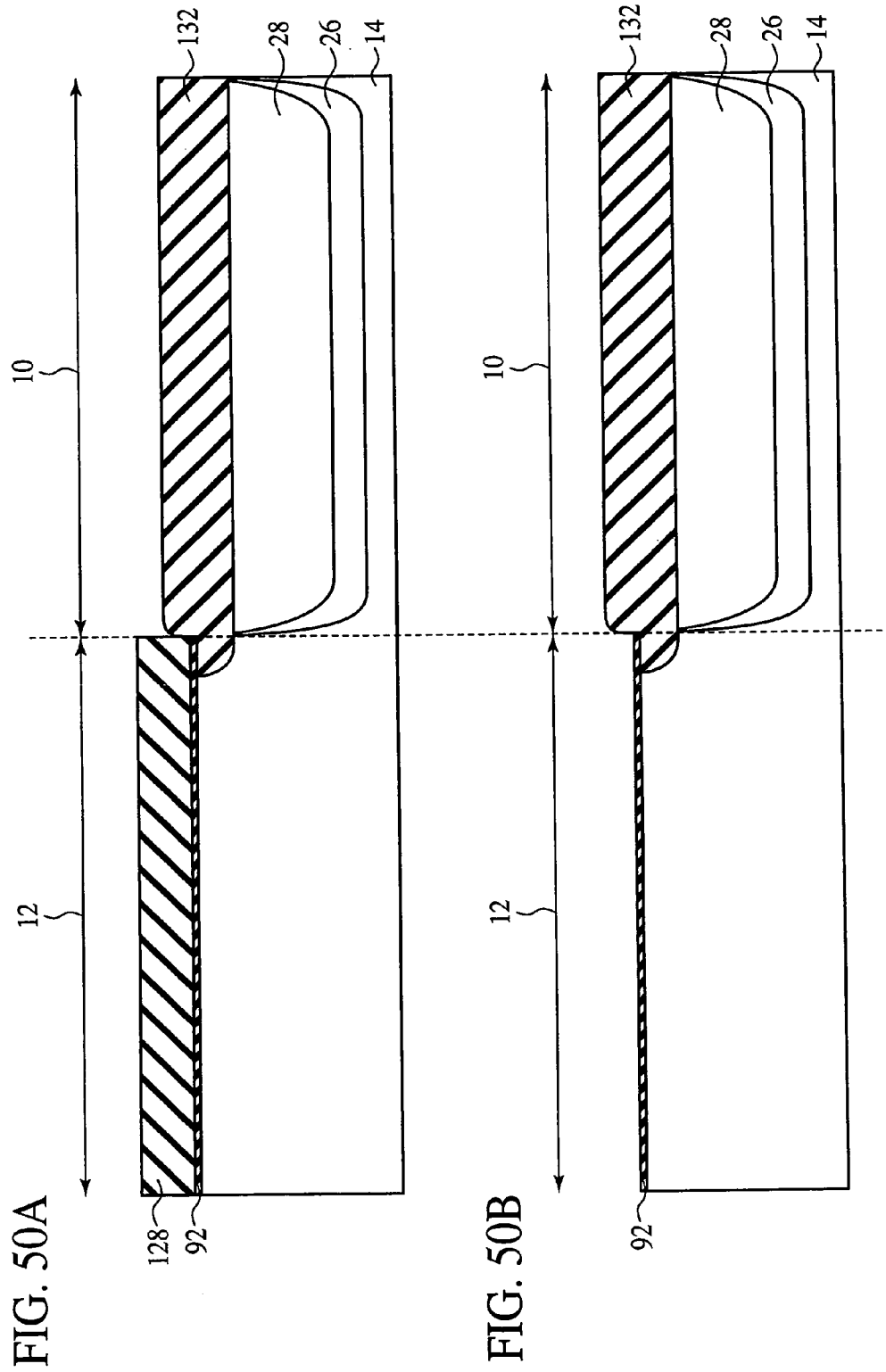

SEMICONDUCTOR DEVICE AND METHOD FOR FABRICATING THE SAME

CROSS-REFERENCE TO RELATED APPLICATIONS

This application is a divisional of U.S. patent application Ser. No. 11/253,739, filed Oct. 20, 2005 now abandoned, which is based upon and claims the benefit of priority from the prior Japanese Patent Application No. 2005-105507, filed on Mar. 31, 2005 and the prior Japanese Patent Application No. 2005-222119, filed on Jul. 29, 2005, the entire contents of which are incorporated herein by reference.

BACKGROUND OF THE INVENTION

The present invention relates to a semiconductor device and a method for fabricating the same, more specifically a semiconductor device including a nonvolatile memory and a method for fabricating the same.

In a semiconductor device including a nonvolatile memory, in addition to flash memory cells, high-voltage transistors for controlling the flash memory, and low-voltage transistors for a high-performance logic circuit are integrated on one semiconductor chip. The flash memory cell has a gate electrode of the stacked structure of a control gate and a floating gate laid the one on the other, which is different from the gate electrodes of the single-layer structure of the high-voltage transistor and the low-voltage transistor. Accordingly, the semiconductor device including the nonvolatile memory has the specific fabrication process that the gate electrodes of the single-layer structure and the gate electrode of the stacked structure are respectively formed by one and the same process.

For example, in fabricating a semiconductor device including a flash memory cell of a fine stacked structure after the 90 nm technology, the depth of trenches formed in the device isolation by STI (Shallow Trench Isolation) must be different between the peripheral circuit region and the flash memory cell region. That is, in the peripheral circuit region, the trenches formed by STI must be deeper to some extent that the insulation between transistors high voltages are applied to is ensured. On the other hand, in the flash memory cell region, the trenches formed by STI must be shallower in comparison with those of the peripheral circuit region so as to prevent defects, as of insufficient filling of the device isolation regions, etc.

A technique of forming trenches by STI, whose depth is different between the peripheral circuit region and the flash memory region, will be the device isolation by STI conducted independently in the peripheral circuit region and the flash memory cell region.

However, high overlay accuracy is required for fine device patterns after, e.g., the 90 nm technology. Accordingly, the device isolation by STI conducted independently in the peripheral circuit region and the flash memory cell region requires unrealistic step administration. It will not be able to meet the requirement of the downsizing of device patterns that the design rules of the peripheral circuits, etc. are mitigated to make the margin for forming patterns larger so as to meet the requirement of the overlay accuracy.

Additionally, high overlay accuracy is required for impurity diffused layers to be formed in the semiconductor substrate. The impurities in such impurity diffused layers are diffused by thermal processing. When the times of the thermal processing are increased as in a case, such as the device isolation by STI is conducted independently in the peripheral circuit region and the flash memory cell region, it is difficult to satisfy the overlay accuracy required for the impurity diffused layers. In this case as well, increasing the margin for forming the patterns cannot meet the requirement of downsizing the device patterns.

A technique for forming trenches of different depths in the device isolation by STI is as exemplified in Reference 1 (Japanese published unexamined patent application No. Hei 7-66276 (1995)).

However, the technique described in Reference 1 has the following disadvantages.

First, a dielectric, such as polysilicon or others, is buried in trenches of different depths formed by STI. Accordingly, it is difficult to ensure the insulation by the device isolation, which is required by a semiconductor device including a flash memory cell. If the technique described in Reference 1 is applied to the device isolation of a semiconductor device including a flash memory cell, required device characteristics will not be able to be obtained.

In one of the techniques described in Reference 1, thermal processing for forming trenches of different depths is frequently conducted, and the diffusion of the impurities in the well is unavoidable. Such diffusion of the impurities is a barrier to downsizing the semiconductor device.

In another one of the techniques described in Reference 1, polysilicon film patterns are formed below an NSG (Non-doped Silicate Glass) film used as a mask for the etching. Steps formed by the absence and presence of the polysilicon film are provided in the mask film. The steps in the mask film are utilized to form trenches of different depths in the silicon substrate. However, it will be very difficult to form the fine patterns, based on the up-and-down steps.

The background arts of the present invention are disclosed in e.g., Japanese published unexamined patent application No. 2002-76148 and Japanese published unexamined patent application No. 2003-289114.

SUMMARY OF THE INVENTION

An object of the present invention is to provide a semiconductor device including a nonvolatile semiconductor memory which allows trenches of different depths to be formed without complicating the steps and a fine memory cell to be formed with high accuracy, and a method for fabricating the same.

According to one aspect of the present invention, there is provided a semiconductor device comprising: a semiconductor substrate having a step in a surface which makes a surface of a first region lower than a surface of a second region; a first device isolation region formed in a first trench formed in the semiconductor substrate in the first region; a second device isolation region formed in a second trench formed in the semiconductor substrate in the second region, the second trench being deeper than the first trench; a memory cell including a floating gate formed on a first device region defined by the first device isolation region, with a first insulation film formed therebetween, and a control gate formed on the floating gate with a second insulation film formed therebetween; and a transistor formed on a second device region defined by the second device isolation region.

According to another aspect of the present invention, there is provided a method for fabricating a semiconductor device comprising the steps of: forming a first conduction film to be a floating gate on a semiconductor substrate in a first region with a first insulation film formed therebetween, the first insulation film having etching characteristics different from those of the semiconductor substrate; forming a mask having a first opening formed in the first region and a second opening formed in a second region on the first conduction film and the semiconductor substrate in the second region; etching the first conduction film, the first insulation film and the semiconductor substrate exposed in the first opening while etching the semiconductor substrate exposed in the second opening to form a first trench in the semiconductor substrate in the first region while forming a second trench deeper than the first trench in the semiconductor substrate in the second region, the first conduction film being patterned to be the floating gate; forming a first device isolation region in the first trench defining a first device region while forming a second device isolation region in the second trench defining a second device region; and forming a control gate on the floating gate with a second insulation film formed therebetween while forming a gate electrode of a transistor on the second device region.

According to the present invention, a first conduction film to be a floating gate is formed on a semiconductor substrate in a first region with a first insulation film formed therebetween, whose etching characteristics are different from those of the semiconductor substrate, a mask having a first opening formed in a first region and a second opening formed in a second region on the first conduction film and the semiconductor substrate in the second region is formed, the first conduction film, the first insulation film and the semiconductor substrate exposed in the first opening are etched while the semiconductor substrate exposed in the second opening is etched, whereby a first trench, where a first device isolation region for defining a first device region, is formed relatively shallow in the semiconductor substrate in the first region while a second trench, where a second device isolation region defining a second device region is formed, is formed relatively deep in the semiconductor substrate in the second region.

According to the present invention, a step is formed in the surface of the semiconductor substrate so that the surface in the first region is lower than the surface in the second region, whereby the height of the upper surface of the first conduction film forming a floating gate can be made substantially the same as the height of the upper surface of the semiconductor substrate in the second region. Thus, the semiconductor substrate in the second region and the first conduction film can be patterned with high accuracy, which makes it possible to provide a semiconductor device including fine memory cells.

According to the present invention, the step formed in the surface of the semiconductor substrate ensures the flatness of the substrate surface where the conduction film for forming a control gate in the first region and a gate electrode in the second region is to be formed, and the conduction film can be formed flat. Accordingly, the fine control gate can be formed in the first region with high accuracy while the fine gate electrode can be formed in the second region with high accuracy.

According to the present invention, when the first conduction film forming the floating gate is patterned, the first trench, where the first device isolation region in the first region is formed, is formed by self-alignment, whereby the first trench can be formed without aligning the pattern with high accuracy. Thus, the present invention can facilitate downsizing of memory cells.

According to the present invention, a sidewall portion of a second conduction film is formed on the side wall of the floating gate, which makes it possible to increase the capacitance between the floating gate and the control gate. According to the present invention, even when the memory cell is further downsized, the capacitance between the floating gate and the control gate can be sufficiently ensured. Thus, according to the present invention, even when the memory cell is downsized, the memory cell can have a required coupling ratio and good electric characteristics.

BRIEF DESCRIPTION OF THE DRAWINGS

FIGS. 2A-2B, 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B, 19A-19B, 20A-20B, 21A-21B, 22A-22B, 23A-23B, 24A-24B, 25A-25B, 26A-26B, 27A-27B, 28A-28B, 29A-29B, 30A-30B, 31A-31B, 32A-32B, 33A-33B, 34A-34B, 35A-35B, 36A-36B, 37A-37B, 38A-38B, 39A-39B, 40A-40B and 41A-41B are diagrammatic views of the semiconductor device according to the first embodiment of the present invention in the steps of the method for fabricating the same, which illustrate the method.

FIGS. 42A-42B, 43A-43B, 44A-44B, 45A-45B, 46, 47 and 48 are sectional views of the semiconductor device in the step of the method for fabricating the same which illustrate the inconvenience caused when no step is formed in the surface of a silicon substrate.

FIGS. 49A-49B, 50A-50B and 51A-51B are sectional views of the semiconductor device according to a modification of the first embodiment of the present invention in the steps of the method for fabricating the same, which illustrate the method.

DETAILED DESCRIPTION OF THE INVENTION

A First Embodiment

Figure 1A:
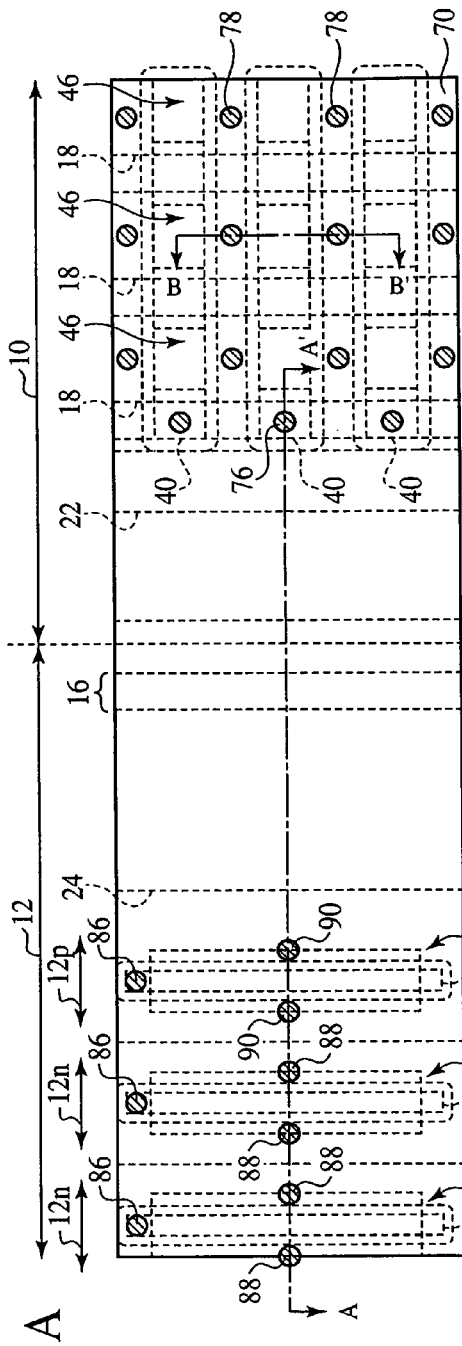
FIGS. 1A and 1B are diagrammatic views of the semiconductor device according to a first embodiment of the present invention, which illustrate a structure thereof.
Figure 1B:
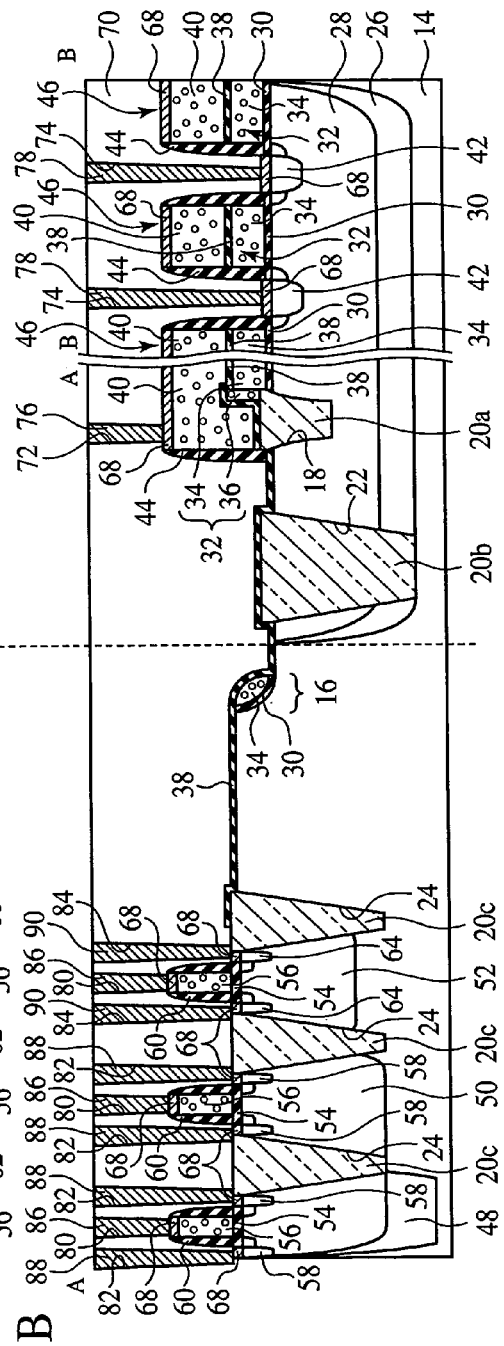

The semiconductor device and the method for fabricating the same according to a first embodiment of the present invention will be explained with reference to FIGS. 1A to 48. FIGS. 1A and 1B are diagrammatic views of the semiconductor device according to the present embodiment, which illustrate a structure thereof. FIGS. 2A to 41B are diagrammatic views of the semiconductor device according to the present embodiment in the steps of the method for fabricating the same, which illustrate the method. FIGS. 42A to 48 are sectional views of the semiconductor device in the steps of the method for fabricating the same, which illustrate the inconvenience caused when no step is formed in the surface of a silicon substrate.

First, the structure of the semiconductor device according to the present embodiment will be explained with reference to FIGS. 1A and 1B. FIG. 1A is a plan view of the semiconductor device, which illustrates the structure thereof. FIG. 1B is sectional views along the line A-A' and the line B-B' in FIG. 1A.

The semiconductor device according to the present embodiment includes a flash memory cell region 10 where flash memory cells 46 are formed, and a peripheral circuit region 12 where a peripheral circuit is formed. The peripheral circuit region 12 includes an NMOS transistor region 12n where an NMOS transistor 62 is formed, and a PMOS transistor region 12p where a PMOS transistor 66 is formed.

In the surface of the silicon substrate 14, a step is formed between the flash memory cell region 10 and the peripheral circuit region 12. That is, the surface of the silicon substrate 14 in the flash memory cell region 10 is lower than the surface of the silicon substrate 14 in the peripheral circuit region 12. The height of the upper surface of the silicon substrate 14 in the peripheral circuit region 12 is substantially the same as the height of the upper surface of a doped amorphous silicon film 34 which will be described later.

On the step 16 of the surface of the silicon substrate 14 near the boundary between the flash memory cell region 10 and the peripheral circuit region 12, as will be described later, there remain a silicon oxide film 30 and a doped amorphous silicon film 34 which have been used respectively to form the tunnel oxide film and the floating gate of the flash memory cell 46.

In the silicon substrate 14 in the flash memory cell region 10, a trench 18 for the device isolation is formed. The trench 18 is formed by etching also the silicon substrate 14 in patterning the doped amorphous silicon film 34 so as to form the floating gate 32. That is, the trench 18 is formed by self-alignment with patterning the doped amorphous silicon film 34 so as to form the floating gate 32. Device isolation region 20a of a silicon oxide film is formed in the trench 18. In the silicon substrate 14 in the flash memory cell region 10 near the boundary between the flash memory cell region 10 and the peripheral circuit region 12, a trench 22 for the device isolation which is deeper than the trench 18 is formed. In the trench 22, a device isolation region 20b of the silicon oxide film is formed.

A trench 24 of the device isolation is formed in the silicon substrate 14 in the peripheral circuit region 12. The depth of the trench 24 is deeper than the depth of the trench 18 in the flash memory region 10 and substantially the same as the depth of the trench 22 near the boundary between the flash memory cell region 10 and the peripheral circuit region 12. A device isolation region 20c of the silicon oxide film is formed in the trench 24.

In the silicon substrate 14 in the flash memory cell region 10, an n-type deep well 26 is formed. In the n-type deep well 26, a p-type well 28 which is shallower than the n-type deep well 20 is formed.

In the flash memory cell region 10, on the silicon substrate 14 in the device region defined by the device isolation region 20a formed in the trench 18, floating gates 32 are formed with the tunnel oxide film 30 formed therebetween. Each floating gate 32 has a main portion 34 formed of the doped amorphous silicon film formed on the tunnel oxide film 30, and a sidewall portion 36 formed of the doped amorphous silicon film formed on the side wall of the main portion 34 on the side of the device isolation region 20a. A plurality of the floating gates 32 are arranged on the silicon substrate 14 between the device isolation regions 20a buried in the trenches 18.

On the floating gates 32, a gate electrode (control gate) 40 of polysilicon film is formed with an ONO film 38 of silicon oxide/silicon nitride/silicon oxide therebetween. The control gate 40 is formed in a stripe extended on the plural floating gates 32 over the device isolation regions 20a in the trenches 18.

Source/drain regions 42 of the LDD structure are formed in the silicon substrate 14 on both sides of the control gate 40.

A sidewall insulation film 44 is formed on the side wall of the control gate 40 and the side wall of the floating gate 32.

Thus, flash memory cells 46 of the stacked gate structure each including the floating gate 32, the control gate 40 and the source/drain regions 42 are formed in the flash memory region 10.

In the silicon substrate 14 in a region of the NMOS transistor region 12n of the peripheral circuit region 12, where a prescribed NMOS transistor is formed, an n-type deep well 48 is formed. In the silicon substrate 14 in the NMOS transistor region 12n, which contains the region where the n-type deep well 48 is formed, a p-type well 50 which is shallower than the n-type deep well 48 is formed.

In the silicon substrate 14 in a PMOS transistor region 12p of the peripheral circuit region 12, an n-type well 54 which is shallower than the n-type deep well 48 is formed.

In the NMOS transistor region 12n, on the silicon substrate 14 in the device region defined by the device isolation region 20c formed in the trench 24, a gate electrode 56 is formed with a gate insulation film 54 formed therebetween. In the silicon substrate 14 on both sides of the gate electrode 56, source/drain regions 58 of the LDD structure are formed. A sidewall insulation film 60 is formed on the side wall of the gate electrode 56. Thus, in the NMOS transistor region 12n, an NMOS transistor 62 having the gate electrode 56 and the source/drain regions 58 is formed.

In the PMOS transistor region 12p, on the silicon substrate 14 in the device region defined by the device isolation region 20c formed in the trench 24, a gate electrode 56 is formed with a gate insulation film 54 formed therebetween. In the silicon substrate 14 on both sides of the gate electrode 56, source/drain regions 64 of the LDD structure are formed. A sidewall insulation film 60 is formed on the side wall of the gate electrode 56. Thus, in the PMOS transistor region 12p, a PMOS transistor 66 having the gate electrode 56 and the source/drain regions 64 is formed.

Silicide films 68 are formed on the control gates 40 and the source/drain regions 42 in the flash memory cell region 10. On the gate electrodes 56 and the source/drain regions 58, 64 in the peripheral circuit region 12, silicide films 68 are formed.

In the region of the flash memory cell region 10 on the side of the peripheral region 12, where no flash memory cell 46 is formed and in the region of the peripheral circuit region 12 on the side of the flash memory cell region 10, where no transistor is formed, an ONO film 38 is formed on the silicon substrate 14, the device isolation regions 20b, 20c and the doped amorphous silicon film 34 at the step 16.

An inter-layer insulation film 70 is formed on the silicon substrate 14 with the flash memory cells 46 formed in the flash memory cell region 10 and the NMOS transistor 62 and the PMOS transistor 66 formed in the peripheral circuit region 12.

In the flash memory cell region 10, contact holes 72 down to the silicide films 68 on the control gates 40 and contact holes 74 down to the silicide films 68 on the source/drain regions 42 are formed in the inter-layer insulation film 70. Electrode plugs 76 electrically connected to the control gates 40 are buried in the contact holes 72. Electrode plugs 78 electrically connected to the source/drain regions 42 are buried in the contact holes 74.

In the peripheral circuit region 12, contact holes 80 down to the silicide films 68 on the gate electrodes 56 and the contact holes 82, 84 down to the silicide films 68 on the source/drain regions 58, 64 are formed in the inter-layer insulation film 70. Electrode plugs 86 electrically connected to the gate electrodes 56 are buried in the contact holes 80. Electrode plugs 88, 90 electrically connected to the source/drain regions 58, 64 are buried in the contact holes 82, 84.

Thus, the semiconductor device according to the present embodiment is constituted.

One main characteristics of the semiconductor device according to the present embodiment is that a step is formed in the surface of the silicon substrate 14 so that the surface of the silicon substrate 14 in the flash memory cell region 10 is lower than the surface of the silicon substrate 14 in the peripheral circuit region 12, and the shallow trench 18 for the device isolation is formed in the silicon substrate 14 in the flash memory cell region 10 while the trench 24 for the device isolation, which is deeper than the trench 18, is formed in the silicon substrate 14 in the peripheral circuit region 12.

According to the present embodiment, because of the step formed in the surface of the silicon substrate 14 so that the surface of the silicon substrate 14 in the flash memory cell region 10 is lower than the surface of the silicon substrate 14 in the peripheral circuit region 12, the height of the upper surface of the doped amorphous silicon film 34 forming the floating gates 32 can be substantially the same as the height of the upper surface of the silicon substrate in the peripheral circuit region 12. As will be described later, this permits a photoresist film 104 (see FIGS. 13A and 13B) for patterning the silicon substrate 14 in the peripheral circuit region 12 and the doped amorphous silicon film 34 in the flash memory region 10 to be exposed with very high accuracy. Thus, according to the present embodiment, the silicon substrate 14 in the peripheral circuit region 12 and the doped amorphous silicon film 34 forming the floating gates 32 can be patterned with high accuracy, and accordingly a semiconductor device including fine memory cells can be provided.

Furthermore, according to the present embodiment, because of the tunnel oxide film 30, whose etching rate is low, formed below the doped amorphous silicon film 34, as will be described later, the etching rate in the flash memory cell region 10 can be low. Accordingly, the trench 24 in the peripheral circuit region 12 can be formed relatively deep while the trench 18 in the flash memory cell region 10 can be formed relatively shallow.

One main characteristic of the semiconductor device according to the present embodiment is that, as will be described later, the trench 18 is also formed when the doped amorphous silicon film 34 forming the floating gates 32 is patterned, that is, the trench 18 is formed self-alignment when the doped amorphous silicon film 34 forming the floating gates 32 is patterned.

According to the present embodiment, the trench 18 is also formed when the doped amorphous silicon film 34 forming the floating gates 32 is patterned, whereby the trench 18 can be formed without alignment of high accuracy. Thus, the present embodiment easily meets the requirement of the downsizing of the memory cell.

Furthermore, one main characteristics of the semiconductor device according to the present embodiment is that the floating gates 32 each comprise a main portion 34 which the trench 18 is formed by self-alignment with, and the sidewall portion 36 formed on the side wall of the main portion 34.

Because of the sidewall portion 36 of the floating gate 32, the capacitance between the floating gate 32 and the control gate 40 can be made larger in comparison with that between the floating gate 32 formed of the main portion 34 alone and the control gate 40. Thus, according to the present embodiment, even when the memory cells are more downsized, the capacitance between the floating gate 32 and the control gate 40 can be made sufficiently ensured. Accordingly, the present embodiment can have memory cells having a required coupling ratio and good electric characteristics even when the memory cells are downsized.

Next, the method for fabricating the semiconductor device according to the present embodiment will be explained with reference to FIGS. 2A to 41B. The drawings A of FIGS. 2 to 41 are plan views. The drawings B of FIGS. 2 to 37 are sectional views along the line A-A' in the drawings A of FIGS. 2 to 37, respectively. The drawings B of FIGS. 38 to 41 are sectional views along the line A-A' and the line B-B' in the drawings A of FIGS. 38 to 41, respectively.

First, as a sacrifice oxide film, a silicon oxide film 92 of, e.g., a 10 nm-thickness is grown on the silicon substrate 14 by, e.g., thermal oxidation (see FIGS. 2A and 2B).

Then, a photoresist film 84 covering the peripheral circuit region 12 and exposing the flash memory cell region 10 is formed on the silicon oxide film 92 by photolithography (see FIGS. 3A and 3B).

Then, ion implantation is performed with the photoresist film 94 as the mask to form the n-type deep well 26 in the silicon substrate 14 in the flash memory cell region 10 (see FIGS. 4A and 4B).

Figures 5A, 5B:
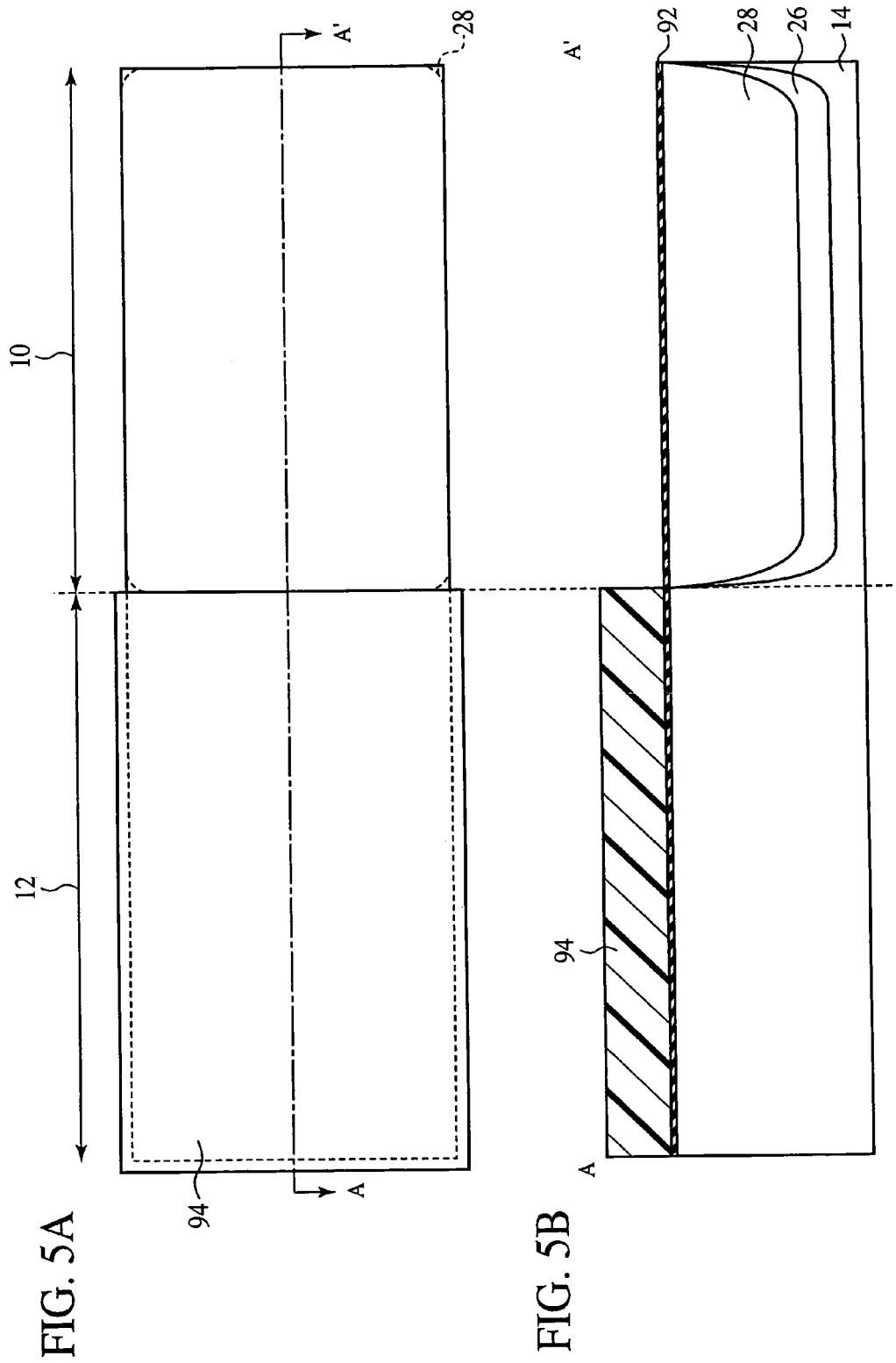

Then, ion implantation is performed with the photoresist film 94 as the mask to form the p-type well 28 in the n-type deep well 26 (see FIGS. 5A and 5B).

Figure 6A:
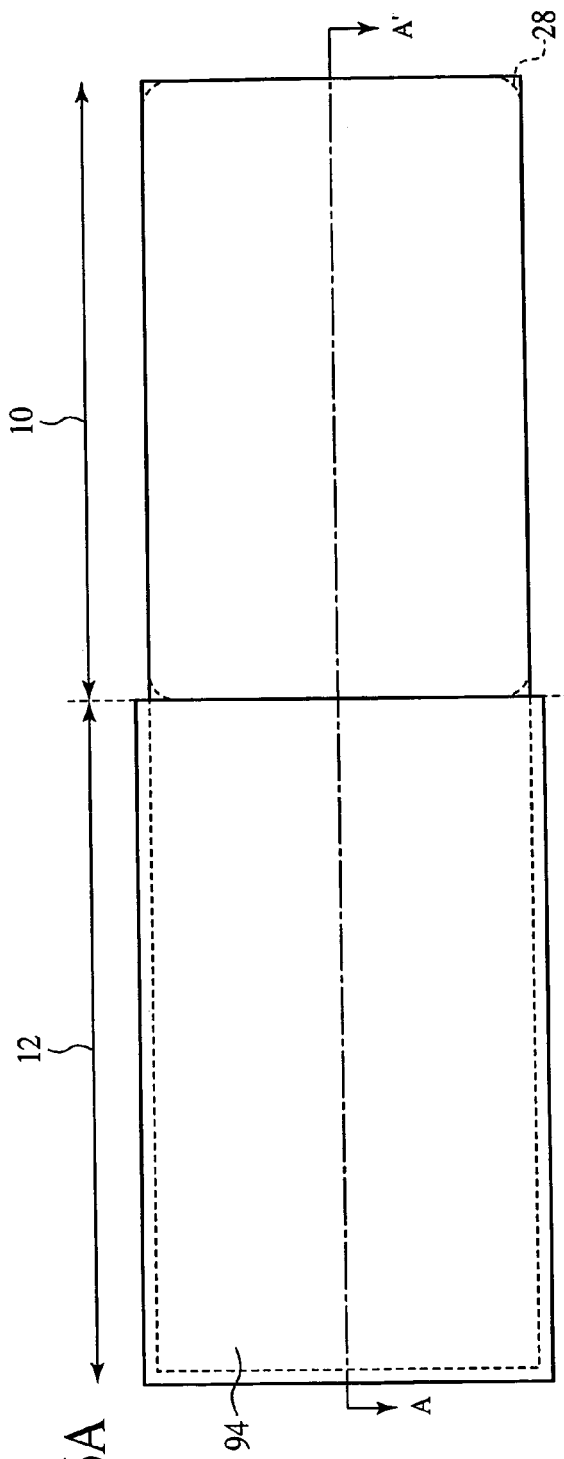
Figure 6B:
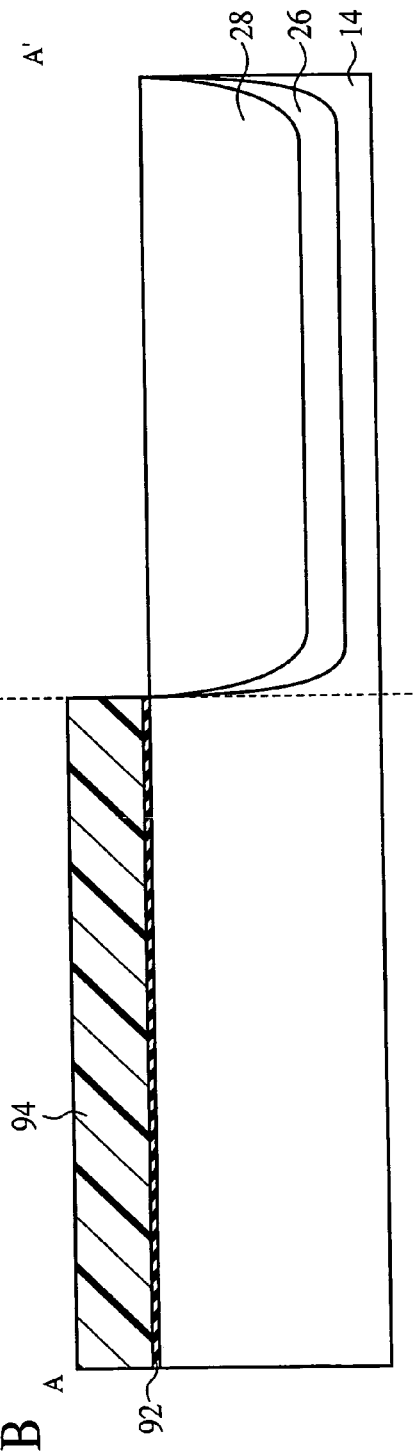

Next, by, e.g., wet etching, the silicon oxide film 92 is etched with the photoresist film 94 as the mask to remove the silicon oxide film 92 in the flash memory cell region 10 (see FIGS. 6A and 6B).

Next, the photoresist film 94 is removed by, e.g., ashing.

Figures 7A, 7B:
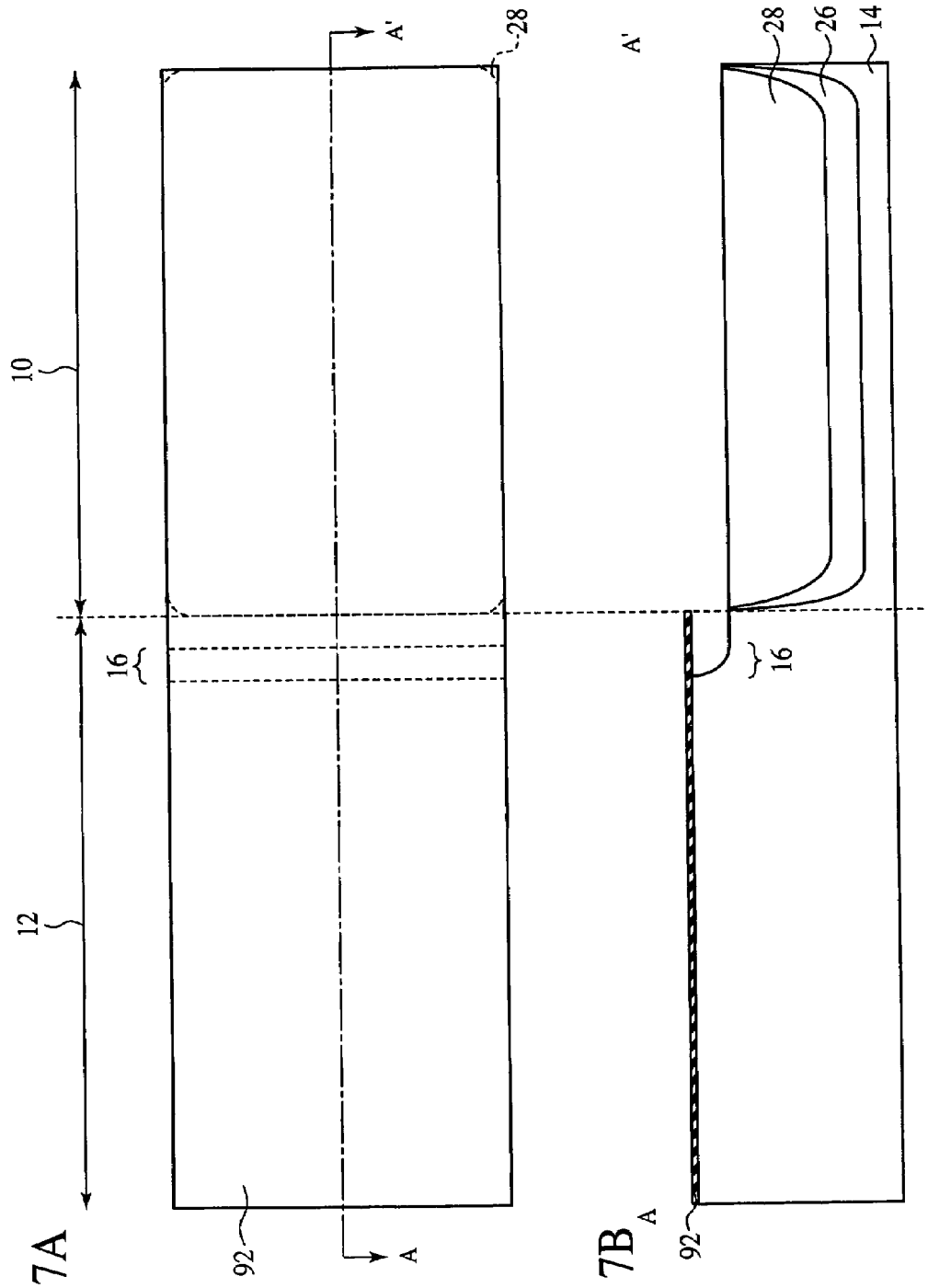

Then, by, e.g., chemical dry etching, the surface of the silicon substrate 14 is etched with the silicon oxide film 92 as the mask to make the surface of the silicon substrate 14 in the flash memory region 10 lower than the surface of the silicon substrate 14 in the peripheral circuit region 12 (see FIGS. 7A and 7B). At this time, the step is formed in the surface of the silicon substrate 14 so that the height of the upper surface of the silicon substrate 14 in the peripheral circuit region 12 is substantially the same as the height of the upper surface of the doped amorphous silicon film 34 which will be described later. Specifically, the step between the surface of the silicon substrate 14 in the flash memory cell region 10 and the surface of the silicon substrate 14 in the peripheral circuit region 12 is, e.g., 70 nm.

The silicon oxide film 92 alone is used as the mask after the photoresist film 94 has been removed, so that the organic substance contained in the photoresist film 94 may not contaminate the surface of the silicon substrate 14.

After the step has been thus formed between the surface of the silicon substrate 14 in the flash memory cell region 10 and the surface of the silicon substrate 14 in the peripheral circuit region 12, the silicon oxide film 92 is removed by, e.g., wet etching (see FIGS. 8A and 8B).

Then, as a sacrifice oxide film, a silicon oxide film of, e.g., a 5-200 nm-thickness is grown on the silicon substrate 14 by, e.g., thermal oxidation. The surface of the silicon substrate 14 is thus recovered from the damage. Subsequently, the silicon oxide film is removed by, e.g., wet etching.

Next, on the silicon substrate 14, a silicon oxide film 30 of, e.g., a 10 nm-thickness is grown by, e.g., thermal oxidation. The silicon oxide film 30 is to be used as the tunnel oxide film of the flash memory cells 46 as will be described later.

Then, on the silicon oxide film 30, the doped amorphous silicon film 34 of, e.g., a 70 nm-thickness is formed by, CVD (Chemical Vapor Deposition) (see FIGS. 9A and 9B). The doped amorphous silicon film 34 is to be used as the main portions of floating gates 32 of the flash memory cells 46.

It is preferable to set the thickness of the doped amorphous silicon film 34 so that the height of the upper surface of the doped amorphous silicon film 34 in the flash memory cell region 10 is substantially the same as the height of the upper surface of the silicon substrate 14 in the peripheral circuit region 12. This is because the height of the upper surface of the silicon substrate 14 in the peripheral circuit region 12 and the height of the upper surface of the doped amorphous silicon film 34 in the flash memory cells 10 are substantially the same, whereby when the photoresist film 104 (see FIGS. 13A and 13B) for patterning the silicon substrate 14 in the peripheral circuit region 12 and the doped amorphous silicon film 34 in the flash memory cell region 10 are exposed, the exposure can be of very high accuracy. Thus, the silicon substrate 14 in the peripheral circuit region 12 and the doped amorphous silicon film 34 forming the floating gates 32 can be patterned with high accuracy, and accordingly a semiconductor device including fine memory cells can be provided.

Figures 10A, 10B:
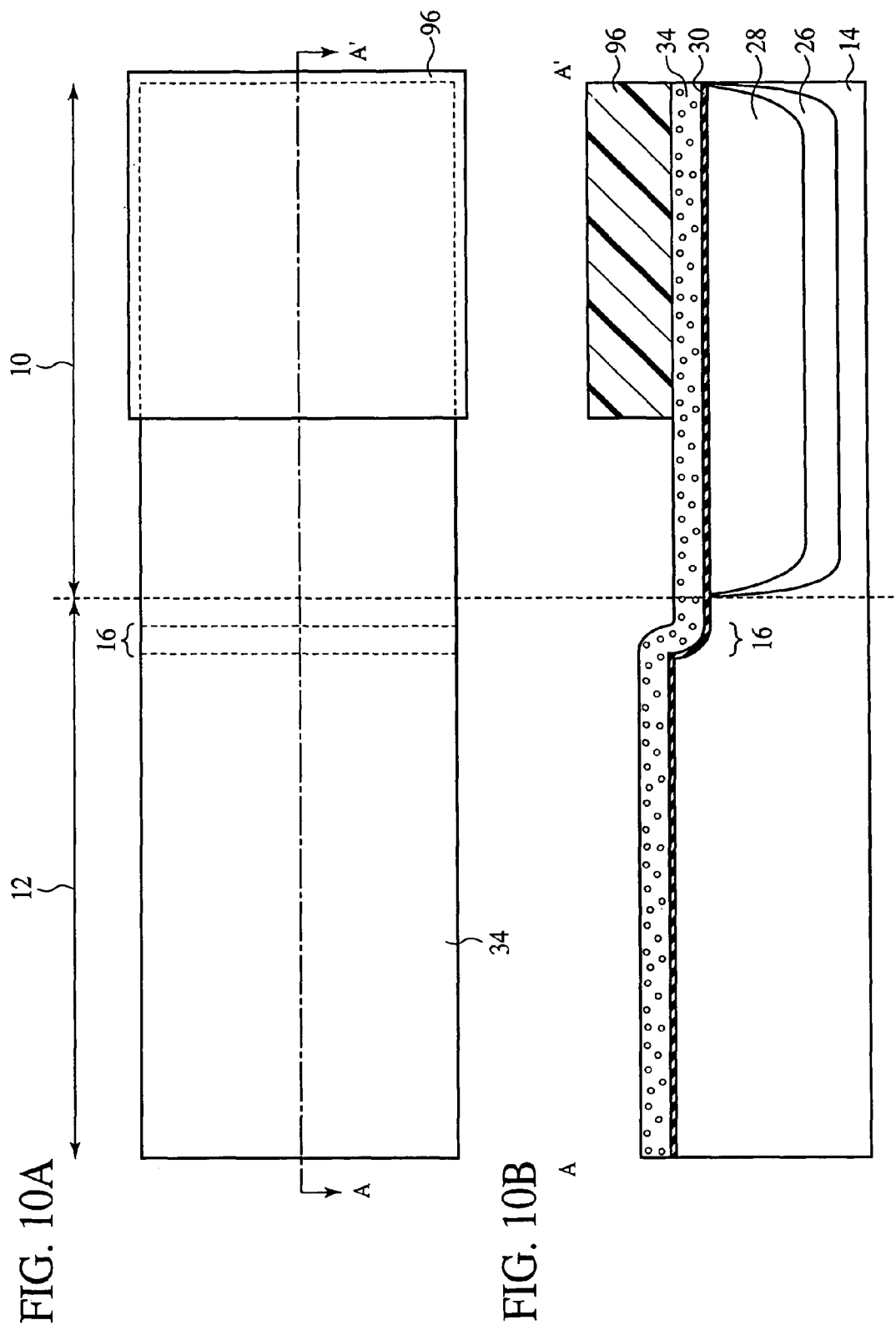

Then, in the flash memory cell region 10, a photoresist film 96 covering the region for the flash memory cells 46 to be formed in and exposing the rest region is formed on the doped amorphous silicon film 34 by photolithography (see FIGS. 10A and 10B).

Figures 11A, 11B:
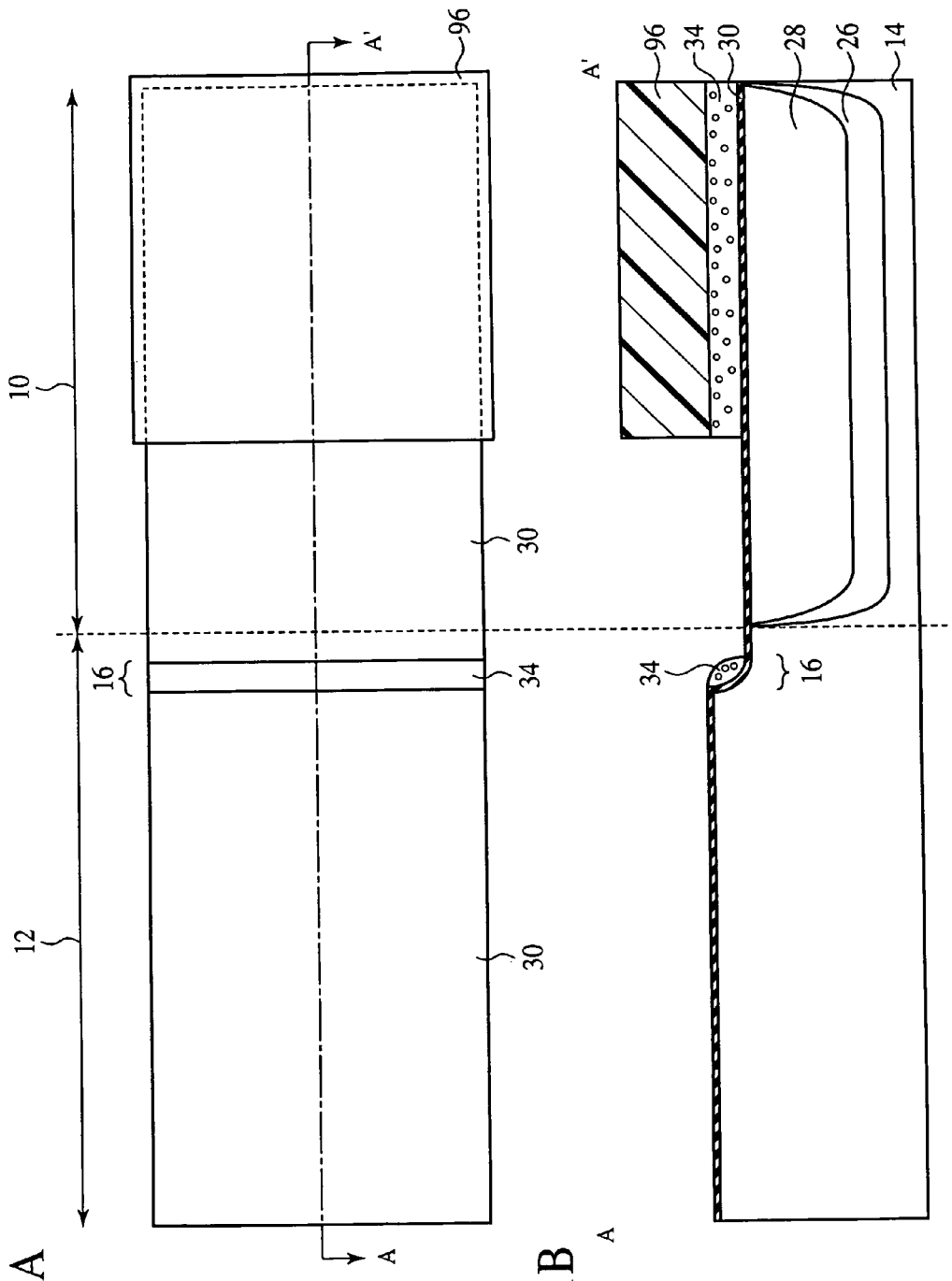

Next, with the photoresist film 96 as the mask, the doped amorphous silicon film 34 is etched by, e.g., dry etching to remove the doped amorphous silicon film 34 in the region except the region for the flash memory cells 48 to be formed in (see FIGS. 11A and 11B). On the step 16 in the surface of the silicon substrate 14, the doped amorphous silicon film 34 remains.

Then, with the photoresist film 96 as the mask, the silicon oxide film 30 is etched.

Next, the photoresist film 96 is removed by, e.g., ashing.

Then, thermal oxidation corresponding to, e.g., 10 nm is conducted to grow the silicon oxide film 98 as a sacrifice oxide film on the silicon substrate 14 and the doped amorphous silicon film 34.

Figure 12A:
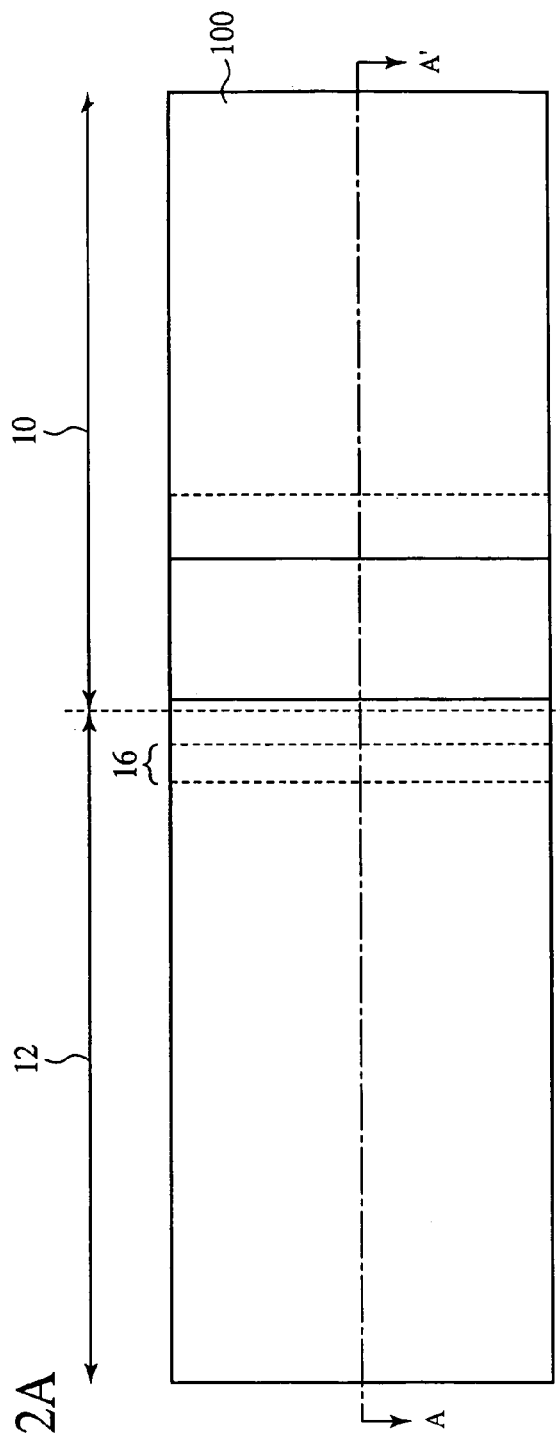
Figure 12B:
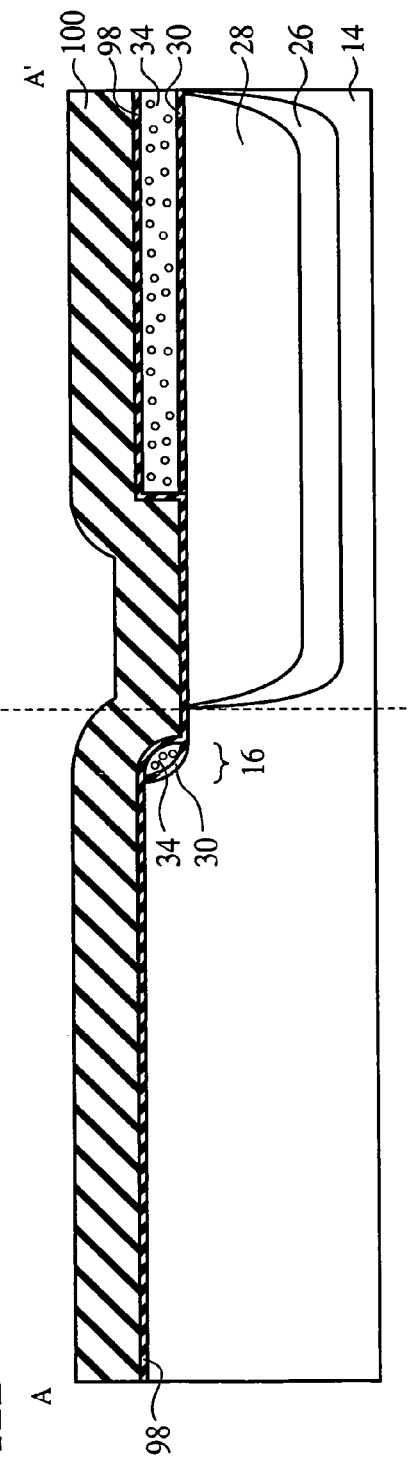

Then, on the silicon oxide film 98, a silicon nitride film 100 of, e.g., a 100 nm-thickness is formed by, e.g., CVD (see FIGS. 12A and 12B).

Then, a photoresist film 104 having the openings 102a, 102b, 102c exposing the regions for the trenches 18, 22, 24 for the device isolation to be formed in is formed on the silicon nitride film 100 (see FIGS. 13A and 13B). As described above, the height of the upper surface of the silicon substrate 14 in the peripheral circuit region 12 and the height of the upper surface of the doped amorphous silicon film 34 in the flash memory cells 10 are set substantially equal to each other, whereby when the photoresist film 104 is exposed by photolithography, the exposure can be conducted with very high accuracy. Accordingly, the silicon substrate 14 in the peripheral circuit region 12 and the doped amorphous silicon film 34 forming the floating gates 32 can be patterned with high accuracy, and thus a semiconductor device including fine memory cells can be provided.

Then, with the photoresist film 104 as the mask, the silicon nitride film 100 is etched by, e.g., dry etching to form the openings 106a, 106b, 106c exposing the regions for the trenches 18, 22, 24 to be formed in for the device isolation (see FIGS. 14A and 14B).

Then, the photoresist film 104 is removed by, e.g., ashing (see FIGS. 14A and 14B).

Then, with silicon nitride film 100 as the mask and by, e.g., dry etching, the silicon oxide film 98, the doped amorphous silicon film 34, the silicon oxide film 30 and the silicon substrate 14 exposed in the opening 106a are etched while the silicon oxide film 98 and the silicon substrate 14 exposed in the openings 106b, 106c are etched (see FIGS. 15A-15B, 16A-16B and 17A-17B). Thus, the trenches 18, 22 for the device isolation are formed in the flash memory cell region 10 while the trench 24 for the device isolation is formed in the peripheral circuit region 12 (see FIGS. 17A and 17B). At this time, etching conditions are set so that the selectivity ratio of the silicon layer (the doped amorphous silicon film 34 and the silicon substrate 14) to the silicon oxide film is, e.g., 10. The selectivity ratio of the silicon layer to the silicon oxide film is not essentially 10 and can be changed suitably corresponding to the depths of the trenches, 18, 22, 14 to be formed.

Here, after the silicon oxide film 98 has been etched off, the silicon layer (silicon substrate 14) alone is etched in the openings 106b, 106c exposing the regions for the trenches 22, 24 to be formed in. However, in the opening 106a exposing the region for the trench 18 to be formed in, the silicon oxide film 30 is present below the doped amorphous silicon film 34. In the opening 106a, the etching advances slower than in the openings 106b, 106c because of the silicon oxide film 30 whose etching characteristics are different from those of the silicon layer. Thus, the trench 18 is formed shallower than the trenches 22, 24.

Figures 15A, 15B:
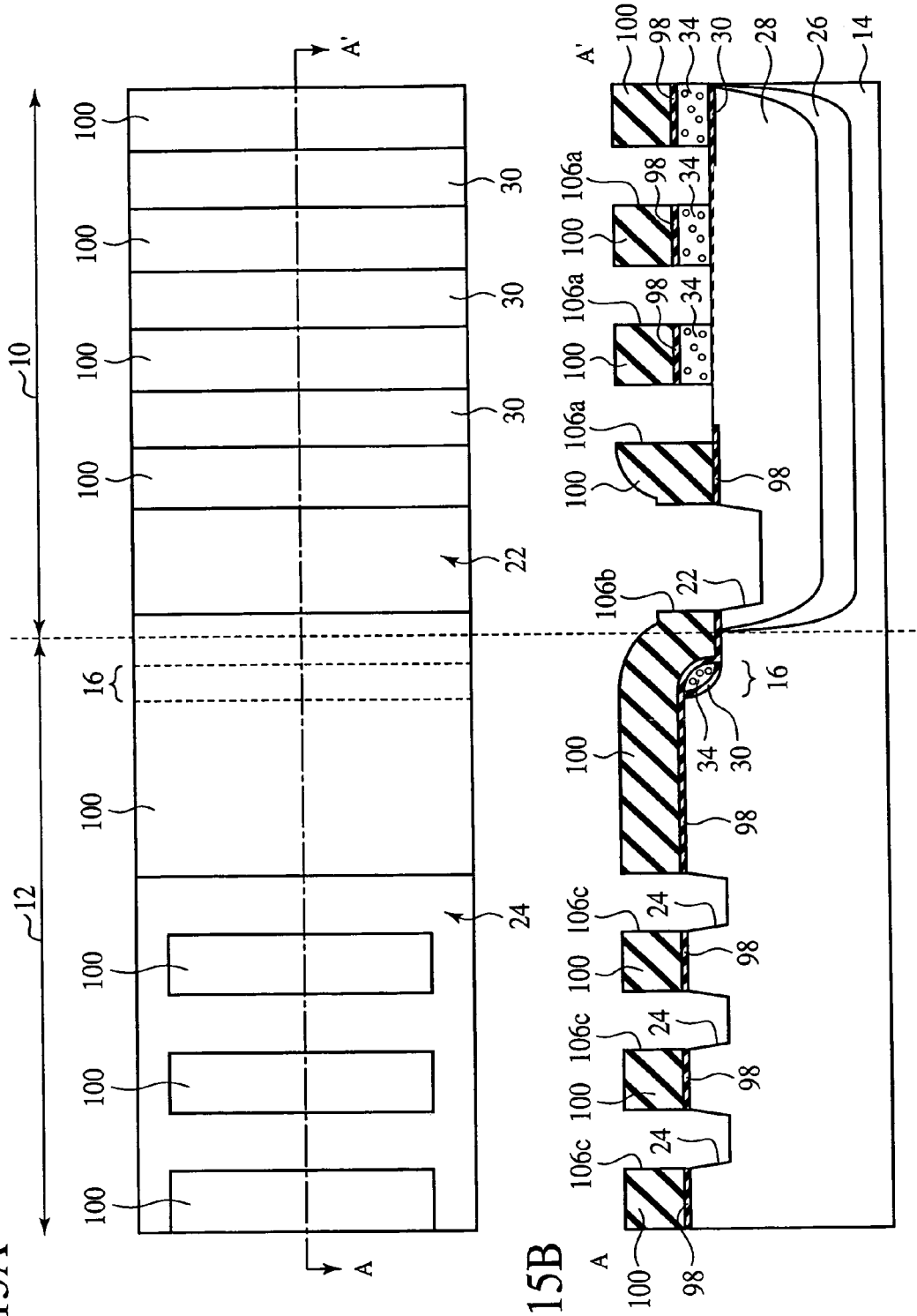

To be specific, first, in the opening 106a, the doped amorphous silicon film 34 is etched while in the openings 106b, 106c, the silicon substrate 14 is etched by a depth equal to an etched film thickness of the doped amorphous silicon film 34, and the trenches 22, 24 are formed in the silicon substrate 14 (see FIGS. 15A and 15B). For example, in the opening 106a, the doped amorphous silicon film 34 is etched by a 60 nm-thickness while in the openings 106b, 106c, the silicon substrate 14 is etched by a 60 nm-thickness, and the trenches 22, 24 of a 60 nm-depth are formed in the silicon substrate 14.

FIGS. 15A and 15B illustrate the state where the silicon oxide film 30 is exposed in the opening 106a by the etching.

Hereafter, the etching is further advanced, and the silicon oxide film 30 is etched at a relatively low rate in the opening 106a while the silicon substrate 14 is etched at a relatively high rate in the openings 106b, 106c (see FIGS. 16A and 16B). For example, when etching conditions which make the selectivity ratio of the silicon layer to the silicon oxide film become 10 are used, the silicon oxide film 30 is etched by a 10 nm-thickness in the opening 106a, while in the openings 106b, 106c, the silicon substrate 14 is etched by a 100 nm-depth, and the depth of the trenches 22, 24 is totally 160 nm.

FIGS. 16A and 16B illustrate the state where the silicon substrate 14 is exposed in the opening 106a by the etching.

Figures 17A, 17B:
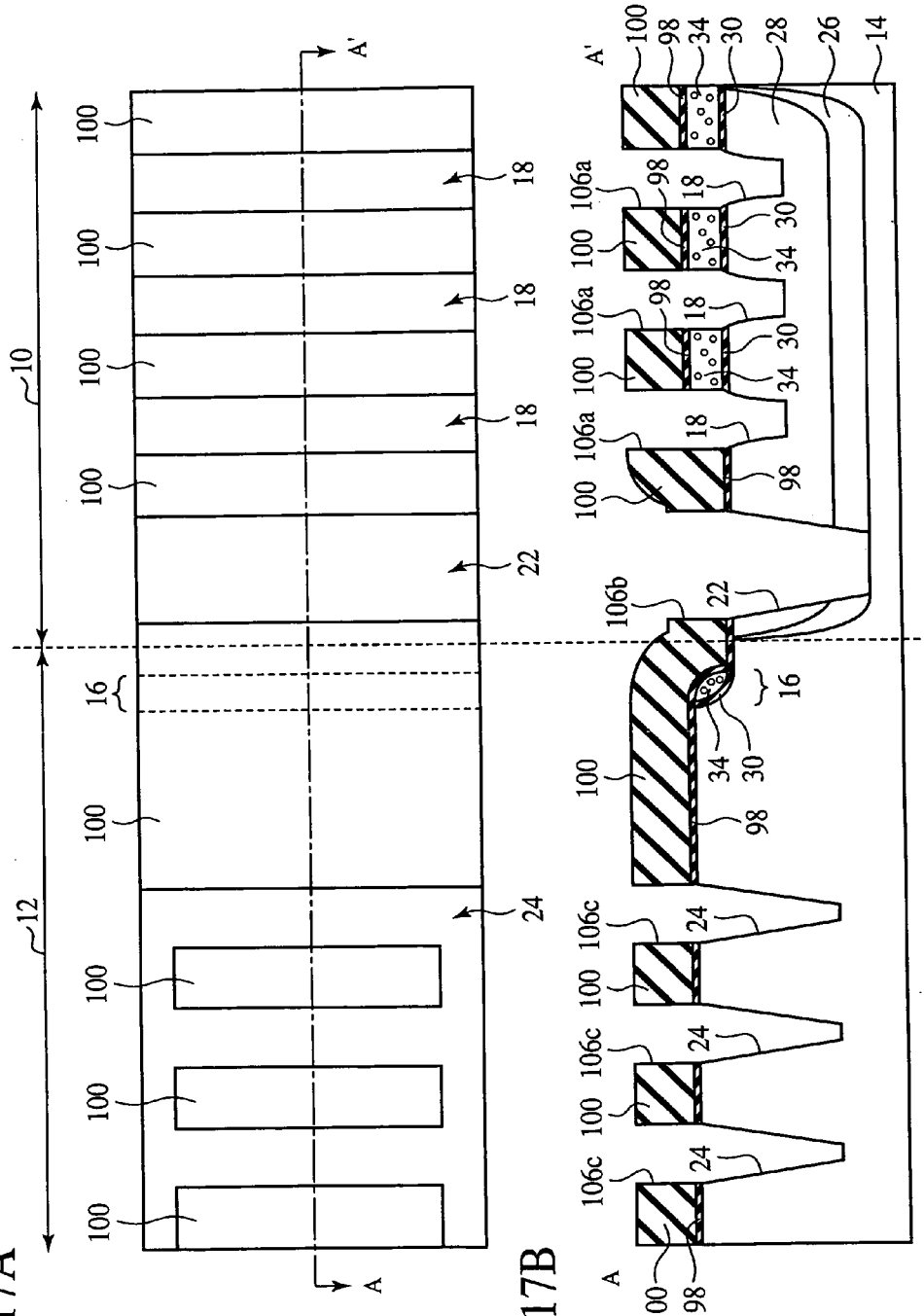

Hereafter, the etching is set on further, and the etching further advances at substantially the same rate in the opening 106a and in the openings 106b, 106c (see FIGS. 17A and 17B). For example, when the silicon substrate 14 is etched by a 140 nm-depth in the opening 106a, the silicon substrate 14 is further etched also by a 140 nm-depth in the openings 106b, 106c, and the depth of the trenches 22, 24 is totally 300 nm. Thus, the trench 18 of a 140 nm-depth is formed in the silicon substrate 14 in the opening 106a while the trenches 22, 24 of a 300 nm-depth which are deeper than the trench 18 are formed in the silicon substrate 14 in the openings 106b, 106c.

While the trenches 18, 22, 24 for the device isolation are being formed as described above, in the flash memory cell region 10, the doped amorphous silicon film 34 forming the floating gates 32 and the silicon oxide film 30 are patterned. That is, in the method for fabricating the semiconductor device according to the present embodiment, the trench 18 is formed by self-alignment when the doped amorphous silicon film 34 forming the floating gates 32 is patterned. That is, in the method for fabricating the semiconductor device according to the present embodiment, when the doped amorphous silicon film 34 forming the floating gates 32 is patterned, the trench 18 is formed by self-alignment. The trench 18 is formed when the doped amorphous silicon film 34 forming the floating gates 32 is patterned, whereby the trench 18 can be formed without the pattern alignment of high accuracy. Thus, the present embodiment easily allows the memory cells to be downsized.

Figure 18A:
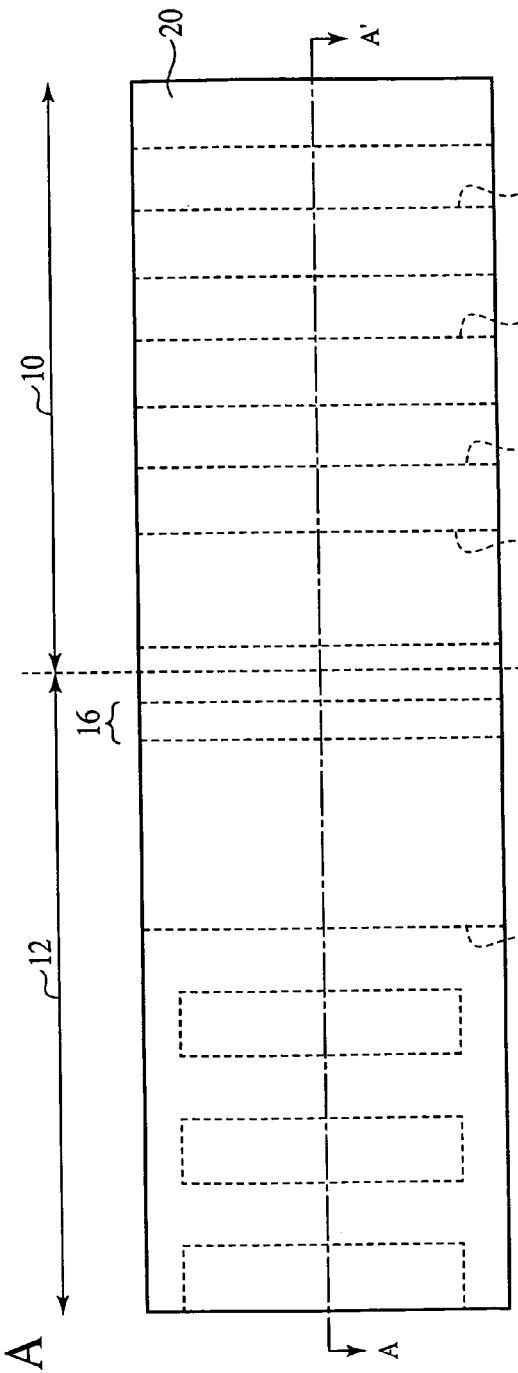
Figure 18B:
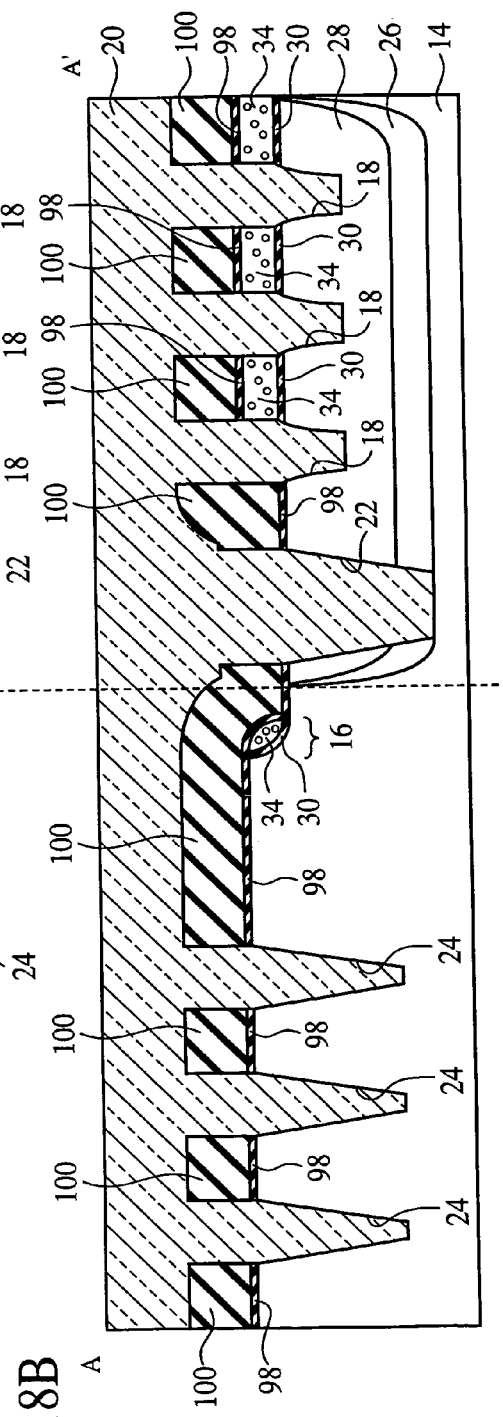

Next, thermal oxidation, etc. is conducted to form a silicon oxide film (not illustrated) for the liner on the inside surfaces of the trenches 18, 22, 24, and then the silicon oxide film 20 of, e.g., a 500-900 nm-thickness is deposited on the entire surface by, e.g., high density plasma CVD (see FIGS. 18A and 18B).

Then, the silicon oxide film 20 is polished by, e.g., CMP (Chemical Mechanical Polishing) until the surface of the silicon nitride film 100 is exposed to remove the silicon oxide film 20 on the silicon nitride film 100. Thus, the silicon oxide film 20 is buried in the trenches 18, 22, 24 formed in the silicon substrate 14.

Figure 19A:
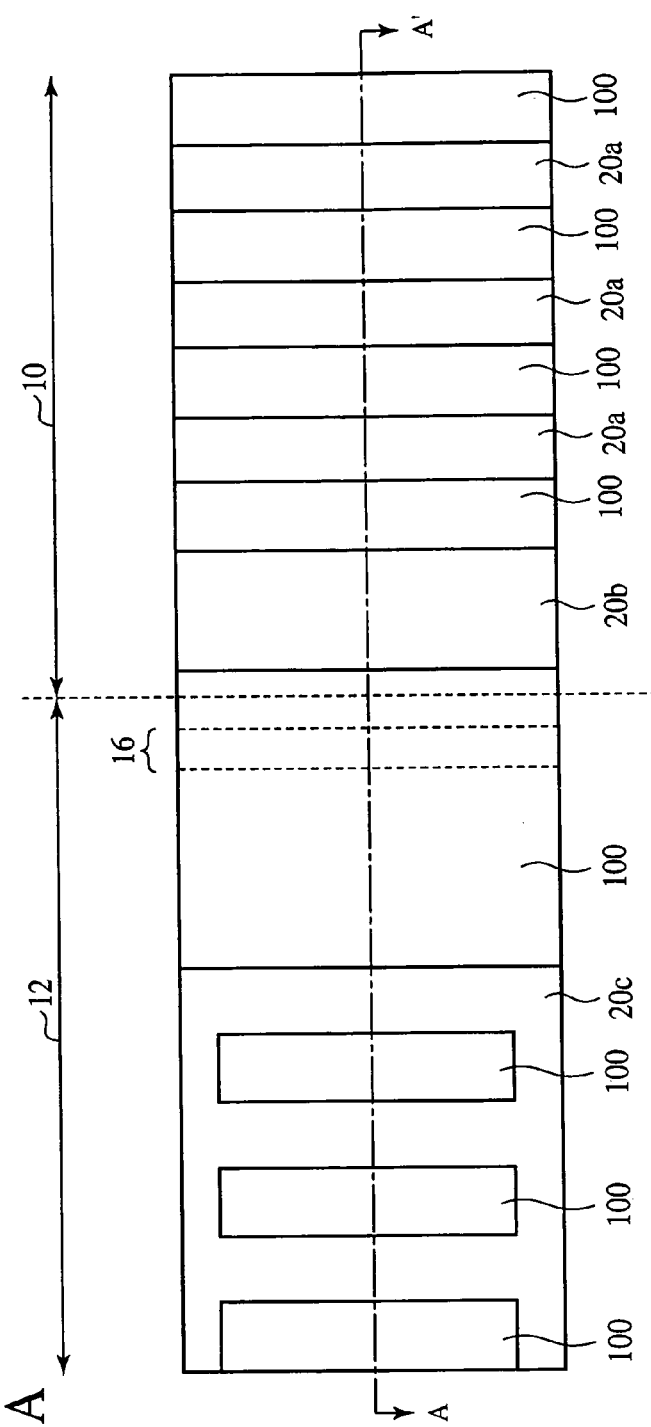
Figure 19B:
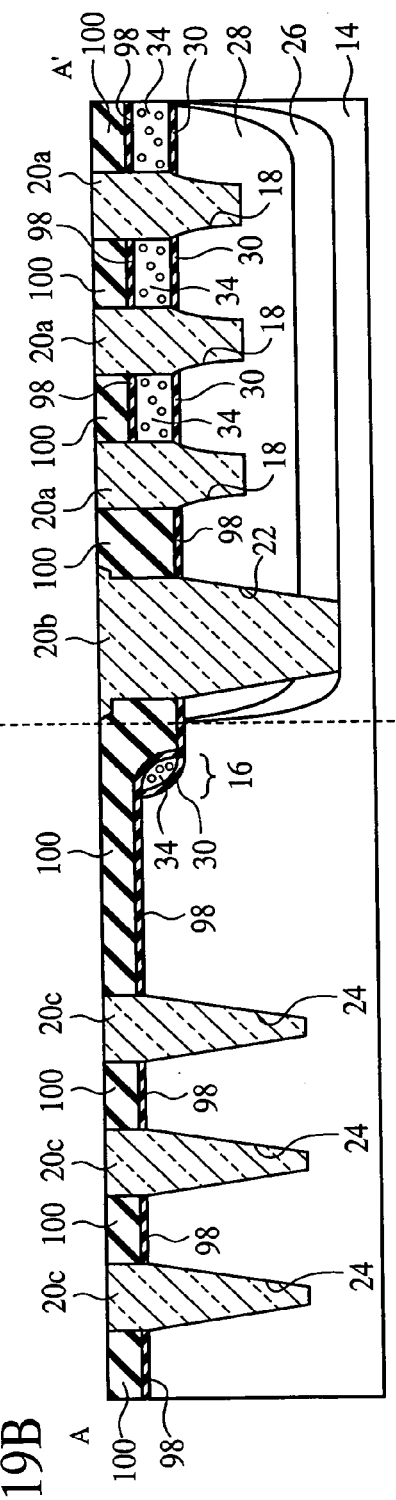

Thus, the device isolation regions 20a, 20b, 20c of the silicon oxide film buried in the trenches 18, 22, 24 of different depths are formed by STI (see FIGS. 19A and 19B).

In the case that no step is formed in the surface of the silicon substrate 14, which is dissimilar to the present embodiment, the following inconvenience often takes place. The case that no step is formed in the surface of the silicon substrate 14 will be explained with reference to FIGS. 42A to 48.

First, on the silicon substrate 14 with the n-type deep well 26 and the p-type well 28 formed in the same way as described above, the silicon oxide film 30 of, e.g., a 9.5 nm-thickness is grown by, e.g., thermal oxidation without forming a step in the surface of the silicon substrate 14.

Figures 42A, 42B:
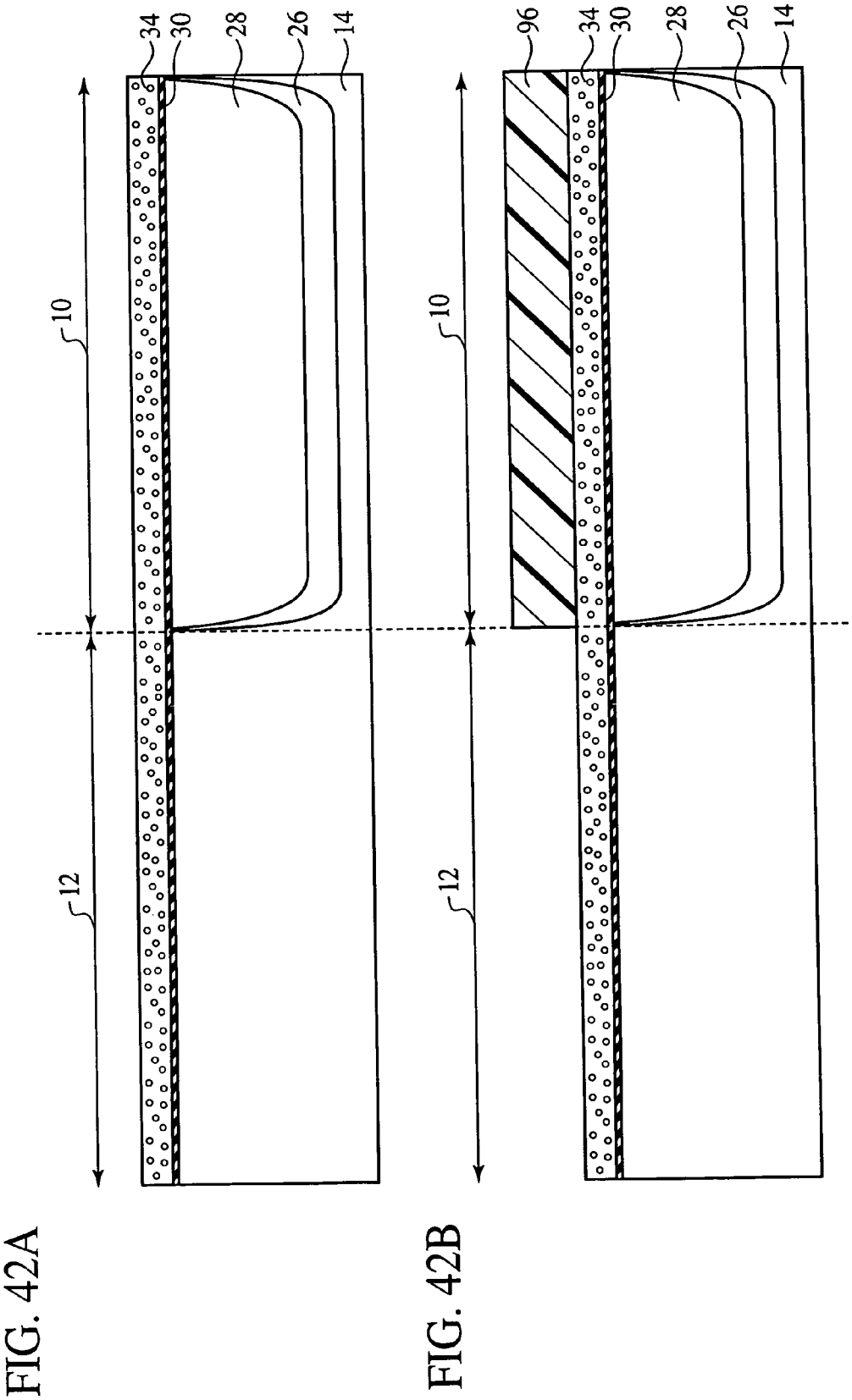

Next, on the silicon oxide film 30, the doped amorphous silicon film 34 of, e.g., a 70 nm-thickness is deposited by, e.g., CVD (see FIG. 42A).

Then, in the flash memory cell region 10, a photoresist film 96 covering the region for the flash memory cells 46 to be formed in and exposing the rest region is formed on the doped amorphous silicon film 34 by photolithography (see FIG. 42B).

Figure 43A:
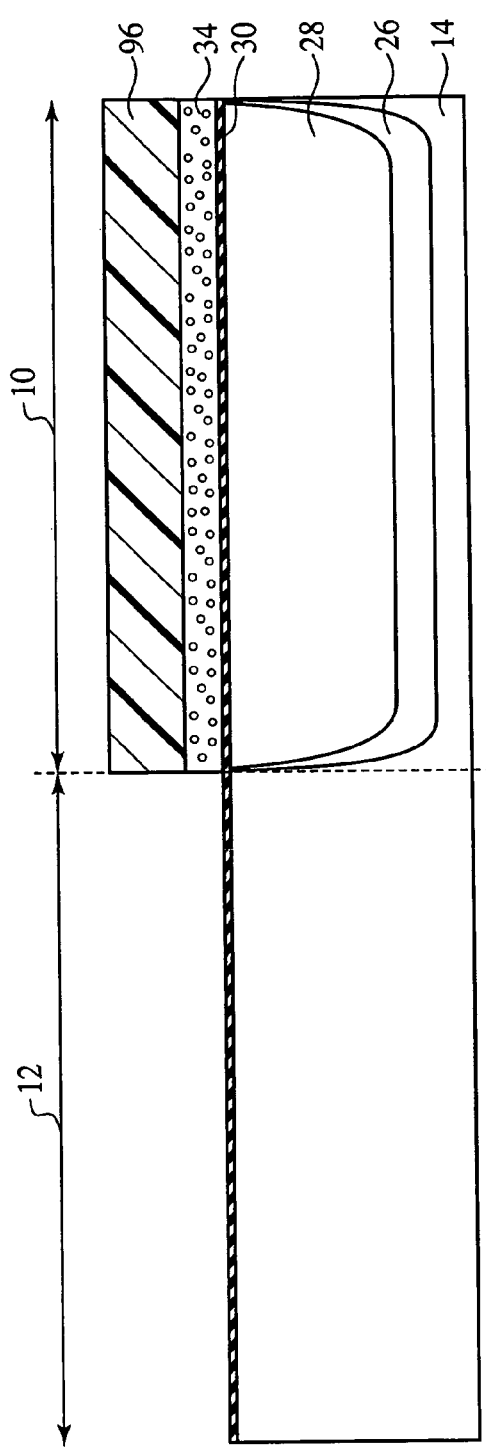

Next, with the photoresist film 96 as the mask and by, e.g., dry etching, the doped amorphous silicon film 34 is etched to remove the doped amorphous silicon film 34 in the region except the region for the flash memory cells 46 to be formed in (FIG. 43A).

Next, with the photoresist film 96 as the mask, the silicon oxide film 30 is etched.

Next, the photoresist film 96 is removed by, e.g., ashing.

Then, thermal oxidation corresponding to, e.g., 10 nm is conducted to grown the silicon oxide film 98 as a sacrifice oxide film on the silicon substrate 14 and the doped amorphous silicon film 34.

Figure 43B:
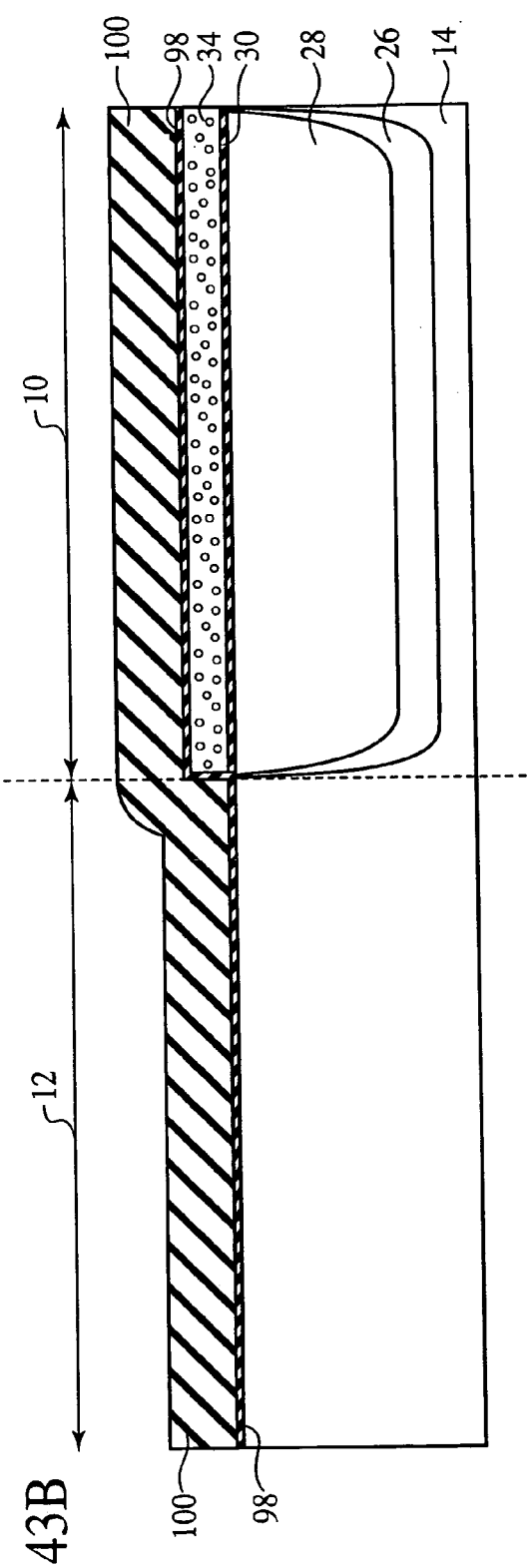

Next, on the silicon oxide film 98, the silicon nitride film 100 of, e.g., a 100 nm-thickness is deposited by, e.g., CVD (see FIG. 43B).

Figures 44A, 44B:
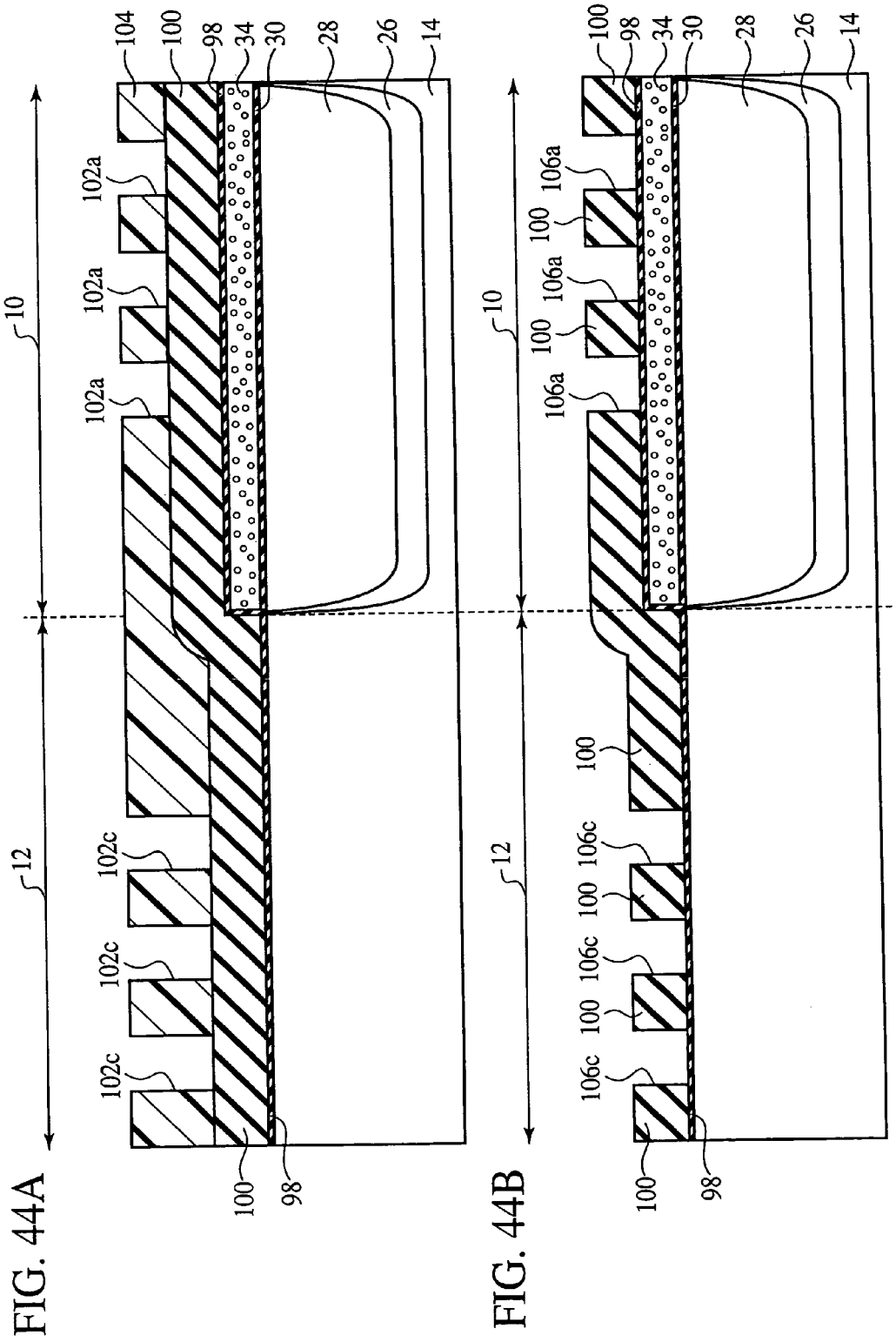

Next, a photoresist film 104 having the openings 102a, 102c exposing the regions for the trenches 18, 24 for the device isolation to be formed in is formed on the silicon nitride film 100 by photolithography (see FIG. 44A).

Then, with the photoresist film 104 as the mask and by, e.g., dry etching, the silicon nitride film 100 is etched to form the openings 106a, 106c exposing the regions for the trenches 18, 24 for the device isolation to be formed in (see FIG. 44B).

Next, the photoresist film 104 is removed by, e.g., ashing (see FIG. 44B).

Figure 46:
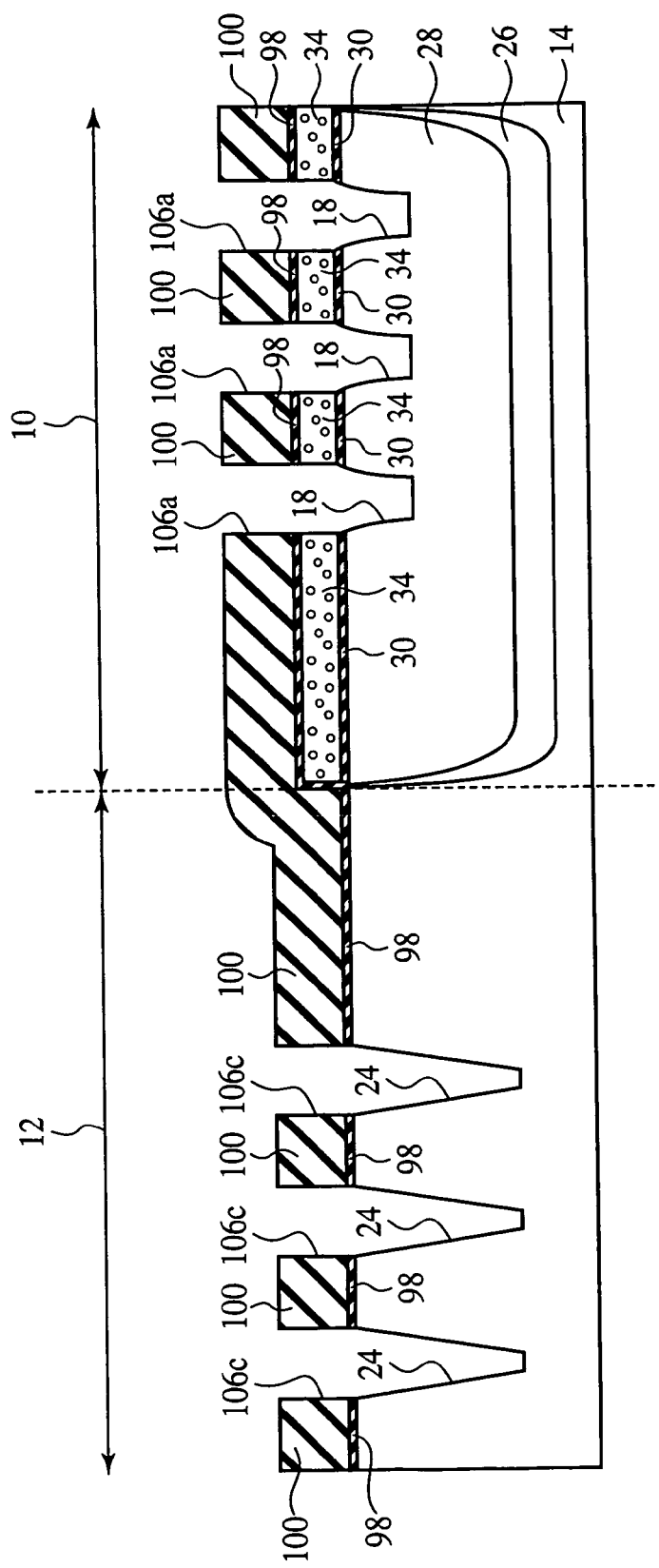

Then, with the silicon nitride film 100 as the mask and by, e.g., dry etching, the silicon oxide film 98, the doped amorphous silicon film 34, the silicon oxide film 30 and the silicon substrate 14 exposed in the opening 106a are etched while the silicon oxide film 98 and the silicon substrate 14 exposed in the opening 106c are etched (see FIGS. 45A, 45B and 46). Thus, the trench 18 for the device isolation is formed in the flash memory cell region 10 while the trench 24 for the device isolation is formed in the peripheral circuit region 12 (see FIG. 46).

After the silicon oxide film 98 has been etched off, in the opening 106c exposing the region for the trench 24 to be formed in, the silicon layer (silicon substrate 14) alone is etched while in the opening 106a exposing the region for the trench 18 to be formed in, the silicon oxide film 30 is present below the doped amorphous silicon film 34. Because of the silicon oxide film 30, whose etching characteristics are different from those of the silicon layer, the etching advances slower in the opening 106a than in the opening 106c. Thus, the trench 18a is formed shallower than the trench 24.

To be specific, first, in the opening 106a, the doped amorphous silicon film 34 is etched while in the opening 106c, the silicon substrate 14 is etched by a depth equal to an etched film thickness of the doped amorphous silicon film 34, and the trench 24 is formed in the silicon substrate 14 (see FIG. 45A). To given an example, in the opening 106a, the doped amorphous silicon film 34 is etched by a 60 nm-film thickness while in the opening 106c, the silicon substrate 14 is etched by a 60 nm-depth, and the trench 24 of a 60 nm-depth is formed in the silicon substrate 14.

FIG. 45A illustrates the state where the silicon oxide film 30 is exposed in the opening 106a by the etching.

Hereafter, the etching is further advanced, and the silicon oxide film 30 is etched at a relatively low rate in the opening 106a while the silicon substrate 14 is etched at a relatively high rate in the opening 106c (see FIG. 45B). For example, when etching conditions which make the selectivity ratio of the silicon layer to the silicon oxide film become 10 are used, the silicon oxide film 30 is etched by a 9.5 nm-thickness in the opening 106a, while in the opening 106c, the silicon substrate 14 is etched further by a 95 nm-thickness, and the depth of the trench 24 is totally 155 nm.

FIG. 45B illustrates the state where the silicon substrate 14 is exposed in the opening 106a by the etching.

Hereafter, the etching is set on further, and the etching advances further at substantially the same etching rate in the opening 106a and in the opening 106c (see FIG. 46). For example, when the silicon substrate 14 is etched by a 125 nm-depth in the opening 106a, the silicon substrate 14 is further etched also by a 125 nm-depth in the opening 106c, and the depth of the trench 24 is totally 280 nm. Thus, the trench 18 of a 125 nm-depth is formed in the silicon substrate 14 in the opening 106a while the trench 24 of a 280 nm-thickness is formed in the silicon substrate 14 in the opening 106c.

While the trenches 18, 24 for the device isolation are being formed as described above, in the flash memory cell region 10, the doped amorphous silicon film 34 forming the floating gates 32 and the silicon oxide film 30 are patterned. That is, the trench 18 is formed by self-alignment when the doped amorphous silicon film 34 forming the floating gates 32 is patterned.

Figure 47:
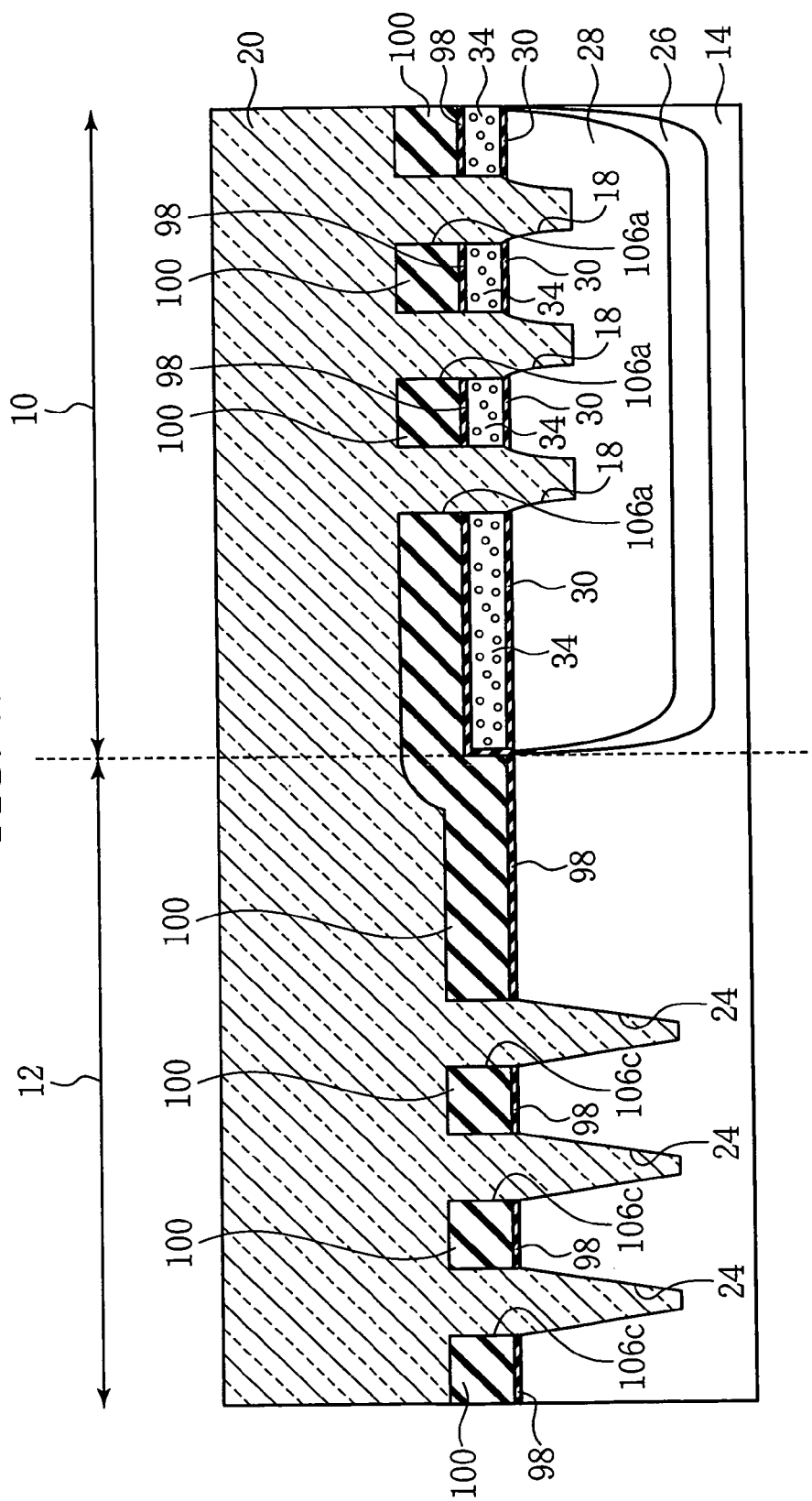

Next, thermal oxidation, etc. is conducted to form a silicon oxide film (not illustrated) for the liner on the inside surfaces of the trenches 18, 24, and then the silicon oxide film 20 of, e.g., a 500-900 nm-thickness is deposited on the entire surface by, e.g., high density plasma CVD (see FIG. 47).

Next, the silicon oxide film 20 is polished by, e.g., CMP until the surface of the silicon nitride film 100 is exposed to remove the silicon oxide film 20 on the silicon nitride film 100. Thus, the silicon oxide film 20 is buried in the trenches 18, 24 formed in the silicon substrate 14.

Figure 48:
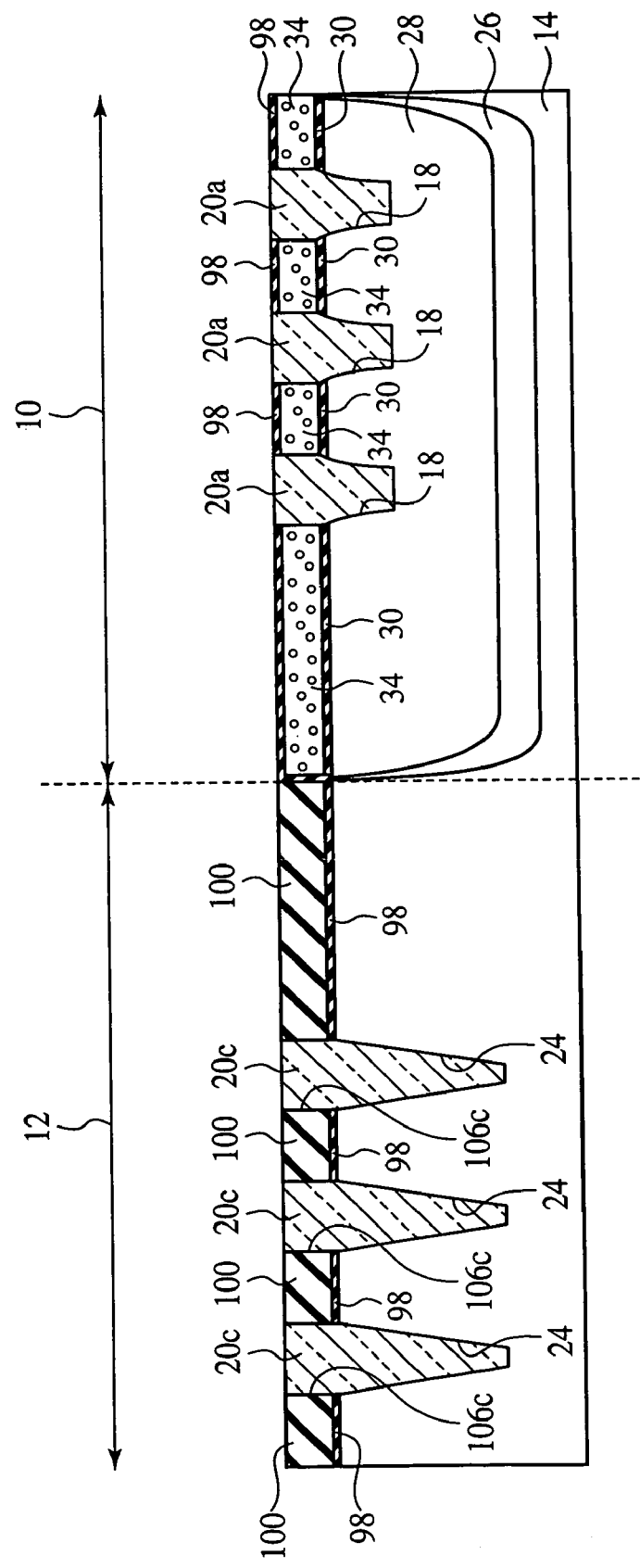

Thus, the device isolation regions 20a, 20c of the silicon oxide film buried in the trenches 18, 24 of different depths are formed by STI (see FIG. 48).

However, without the step formed in the surface of the silicon substrate 14, when the silicon oxide film 20 is polished until the silicon nitride film 100 in the peripheral circuit region 12 is exposed, all the silicon nitride film 100 is often removed in the flash memory cell region 10. In such case, the silicon oxide film 98 on the floating gates (doped amorphous silicon film 34), and even the doped amorphous silicon film 34 are damaged by the polish by CMP. In the flash memory cell region 10, when the silicon nitride film 100 is removed, and the silicon oxide film 98 and even the doped amorphous silicon film 34 are exposed, the following steps cannot be conducted.

In contrast to this case, where no step is formed in the surface of the silicon substrate 14 and where such inconvenience takes place, in the present embodiment, the step is formed in the surface of the silicon substrate 14 so that the surface of the silicon substrate 14 in the flash memory cell region 10 is lower than the surface of the silicon substrate 14 in the peripheral circuit region 12. This can prevent the silicon nitride film 100 on the doped amorphous silicon film from being removed by the polish by the CMP for forming the device isolation regions 20a, 20b, 20c. To ensure the prevention of the removal of the silicon nitride film 100 on the doped amorphous silicon film 34, the step is formed in the surface of the silicon substrate 14 so that the height of the upper surface of the silicon substrate 14 in the peripheral circuit region 12 is substantially equal to or more than the height of the upper surface of the doped amorphous silicon film 34 formed in the flash memory cell region 10.

Accordingly, the method for fabricating the semiconductor device according to the present embodiment is free from inconveniences that the silicon oxide film 98 on the doped amorphous silicon film 34 and the doped amorphous silicon film 34 are damaged by the polish by the CMP, and the steps following the formation of the device isolation regions 20a, 20b, 20c cannot be conducted.

After the device isolation regions 20a, 20b, 20c have been formed without the above-described inconveniences by forming the step in the surface of the silicon substrate 14, a photoresist film 108 covering the peripheral circuit region 12 and the boundary region of the flash memory cell region 10 on the side of the peripheral circuit region 12 and exposing the region for the flash memory cells 46 to be formed in is formed by photolithography.

Figures 20A, 20B:
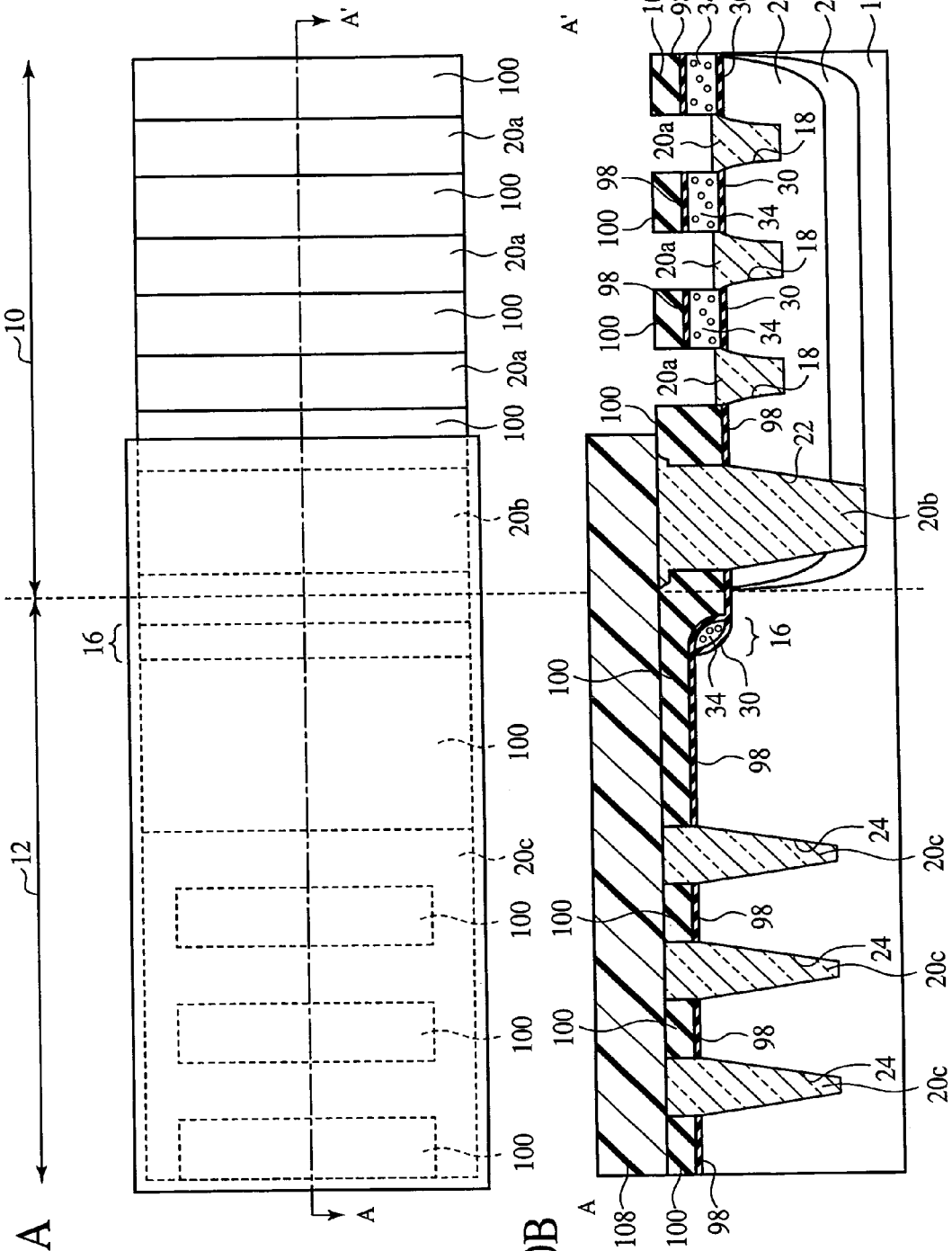

Then, with the photoresist film 108 as the mask and by, e.g., dry etching, the upper part of the device isolation region 20a in the region for the flash memory cells to be formed in is etched off by, e.g., a 140 nm-thickness (see FIGS. 20A and 20B). At this time, the upper part of the device isolation region 20a is etched so that the upper surface of the device isolation region 20a is positioned a little higher than the upper surface of the tunnel oxide film 30 or is positioned at substantially the same height.

Figure 21A:
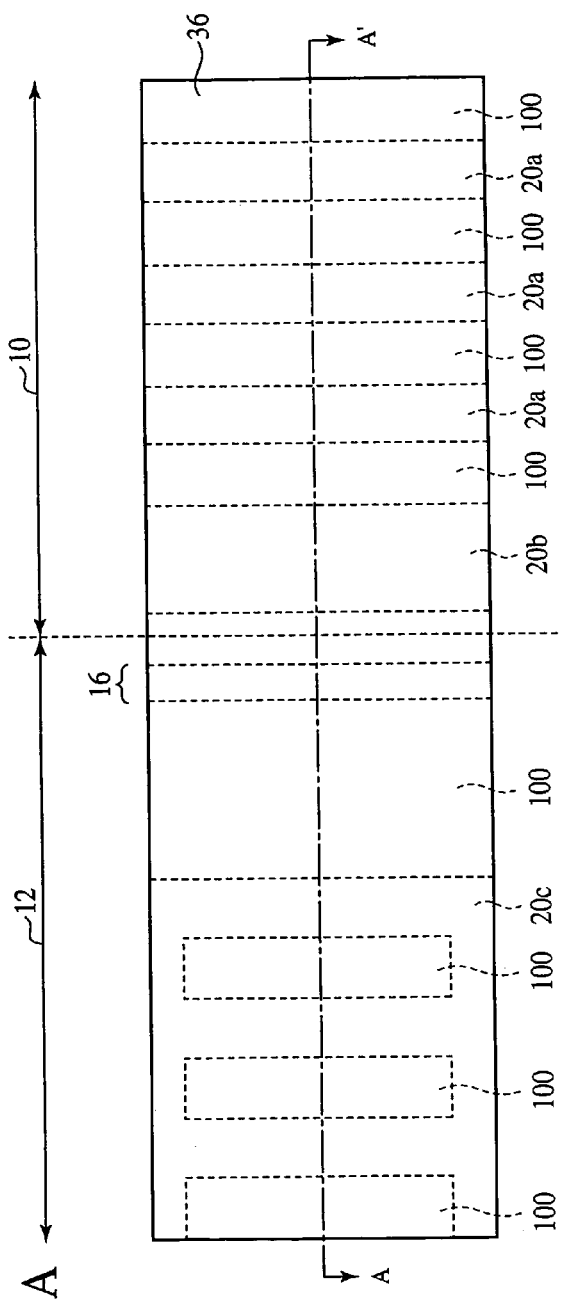
Figure 21B:
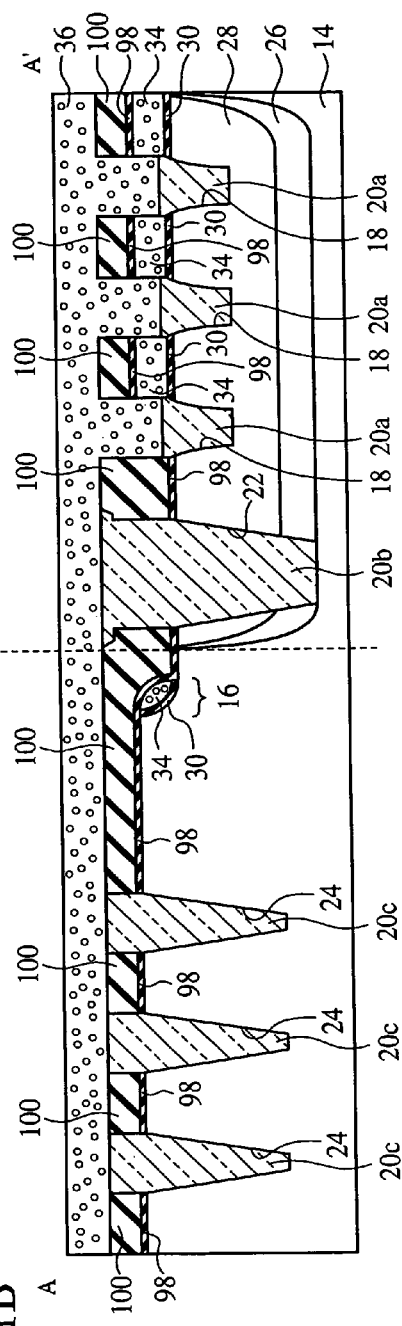

Next, a doped amorphous silicon film 36 is deposited on the entire surface by, e.g., CVD (see FIGS. 21A and 21B). Thus, the doped amorphous silicon film 36 is buried in the openings between the main portions 34 of the adjacent floating gates 32, which are on the device isolation region 20a.

Next, the doped amorphous silicon film 36 is etched back to be left only on the device isolation region 20a and to be removed in the rest region. At this time, the doped amorphous silicon film 36 is etched back so that the upper surface of the doped amorphous silicon film 36 on the device isolation region 20a is positioned at the same height as the upper surface of the silicon oxide film 98 on the main portions 34 of the floating gates 32.

Then, a silicon oxide film 110 of, e.g., a 10 nm-thickness is grown on the surface of the doped amorphous silicon film 36 by, e.g., thermal oxidation (see FIGS. 22A and 22B).

Next, a silicon nitride film 112 of, e.g., a 5 nm-thickness is deposited as the spacer film on the entire surface by, e.g., CVD (see FIGS. 23A and 23B).

Then, the silicon nitride film 112 is etched back to be left only on the side walls of the silicon nitride film 100 on the main portions 34 of the floating gates 32 and to be removed in the rest region.

Figure 24A:
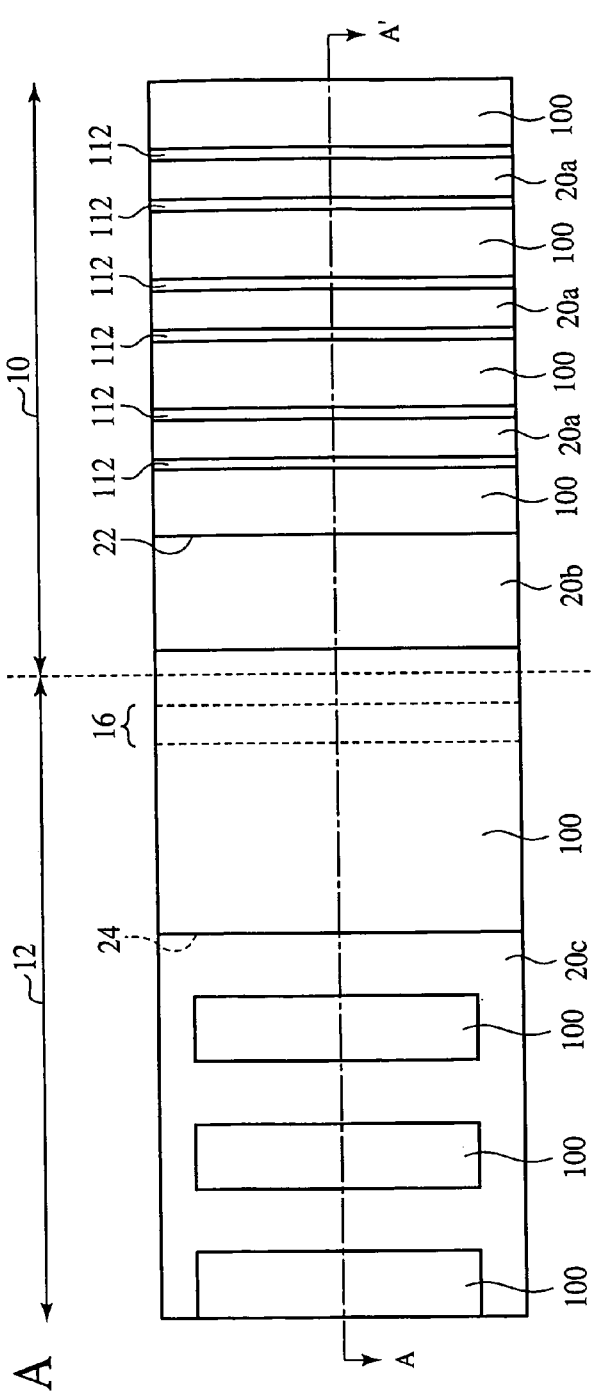
Figure 24B:
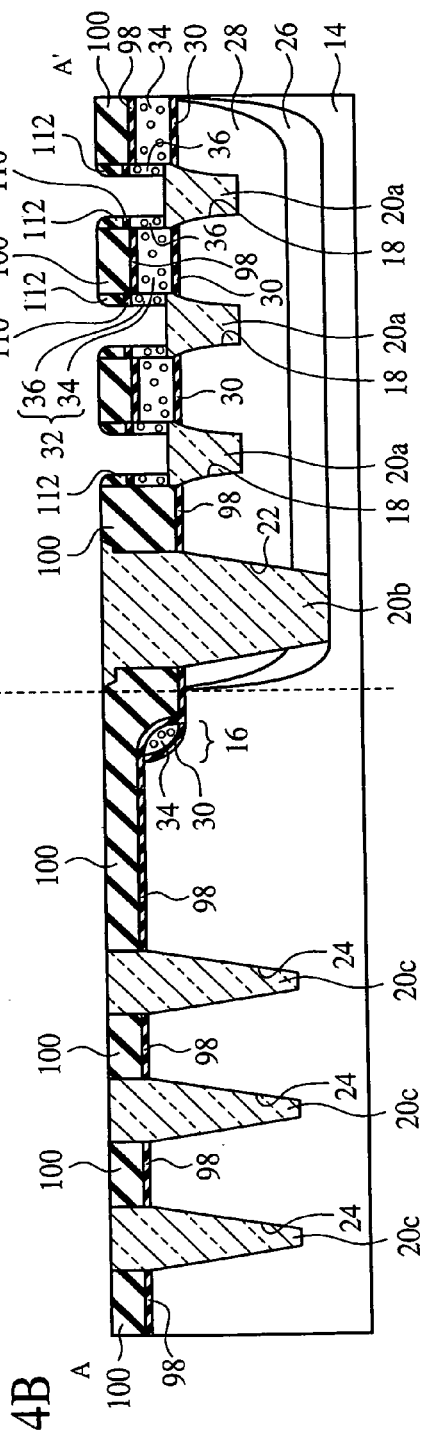
Figure 26A:
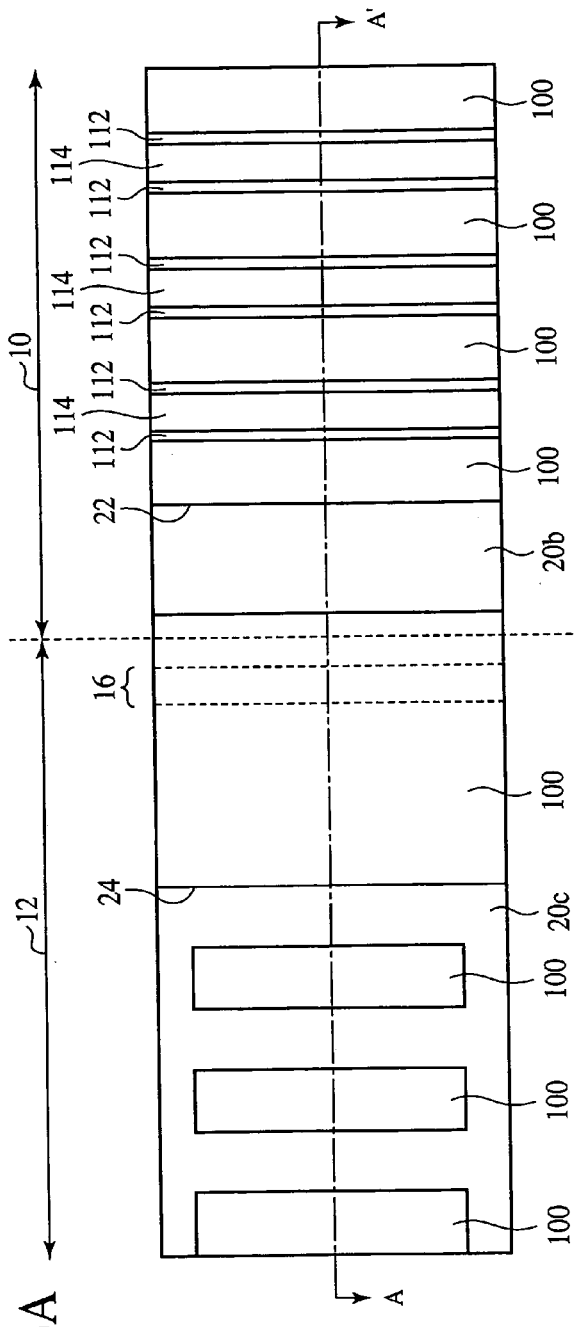
Figure 26B:
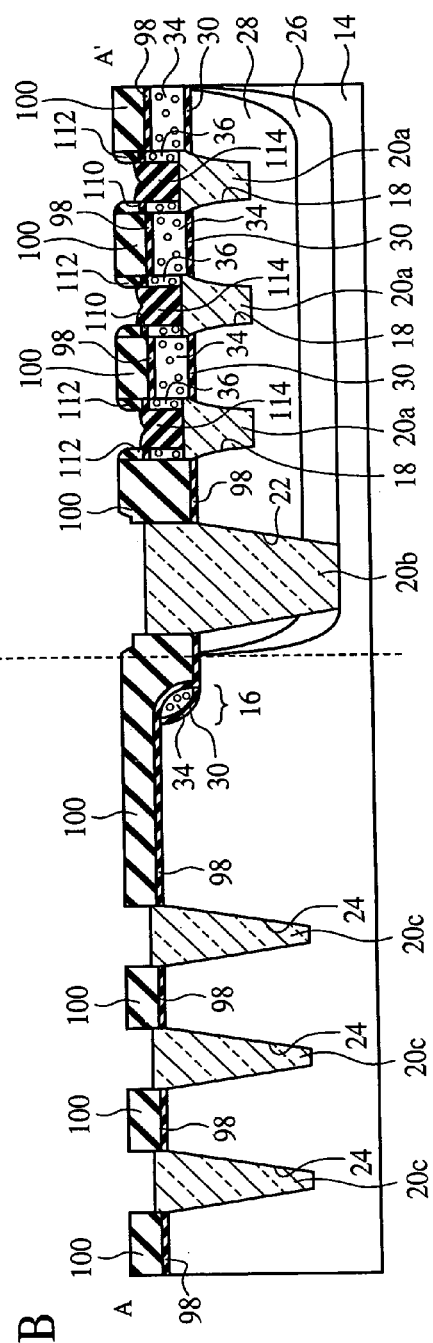

Next, with the silicon nitride film 112 as the mask and by, e.g., dry etching, the doped amorphous silicon film 36 is etched to be left on the side walls of the main portions 34 of the floating gates 32 (see FIGS. 24A and 24B).

Thus, the sidewall portions 36 of the floating gates 32 of the doped amorphous silicon film are formed by self-alignment on the side walls of the main portions 34 of the floating gates 32. In comparison with the floating gate 36 formed of the main portion 34 alone without the sidewall portion 36, the floating gate 32 formed of the main portion 34 and the sidewall portion 36 can have a smaller gap with respect to the adjacent one due to the sidewall portion 36. This can increase the capacitance between the floating gate 32 and the control gate 40. Accordingly, the present embodiment can ensure a sufficient capacitance between the floating gate 32 and the floating gate 40 even with the memory cells further downsized. The present embodiment can provide memory cells which can have required a coupling ratio and good electric characteristics even when the memory cells are downsized.

Then, a silicon oxide film 114 of, e.g., a 100 nm-thickness is deposited on the entire surface by, e.g., CVD using TEOS as the raw material gas (see FIGS. 25A and 25B).

Next, the silicon oxide film 114 is etched back by, e.g., wet etching. Thus, the silicon oxide film 114 is buried between the floating gates 32 and is removed in the rest region. At this time, even the device isolation regions 20b, 20c of the silicon oxide film are etched back (see FIGS. 26A and 26B). The device isolation region 20c is etched back until the step between the upper surface of the device isolation region 20c and the upper surfaces of the device regions defined by the device isolation region 20c becomes small enough to form the devices in the peripheral circuit region 12. Specifically, the silicon oxide film 114 is etched back until the upper surface of the silicon oxide film 114 buried between the floating gates 32 is lower by, e.g., 70 nm than the upper surface of the silicon nitride film 100. At this time, the device isolation regions 20b, 20c are also etched back, and the upper surfaces of the device isolation regions 20b, 20c become lower by, e.g., 70 nm than the upper surface of the silicon nitride film 100.

Figures 27A, 27B:
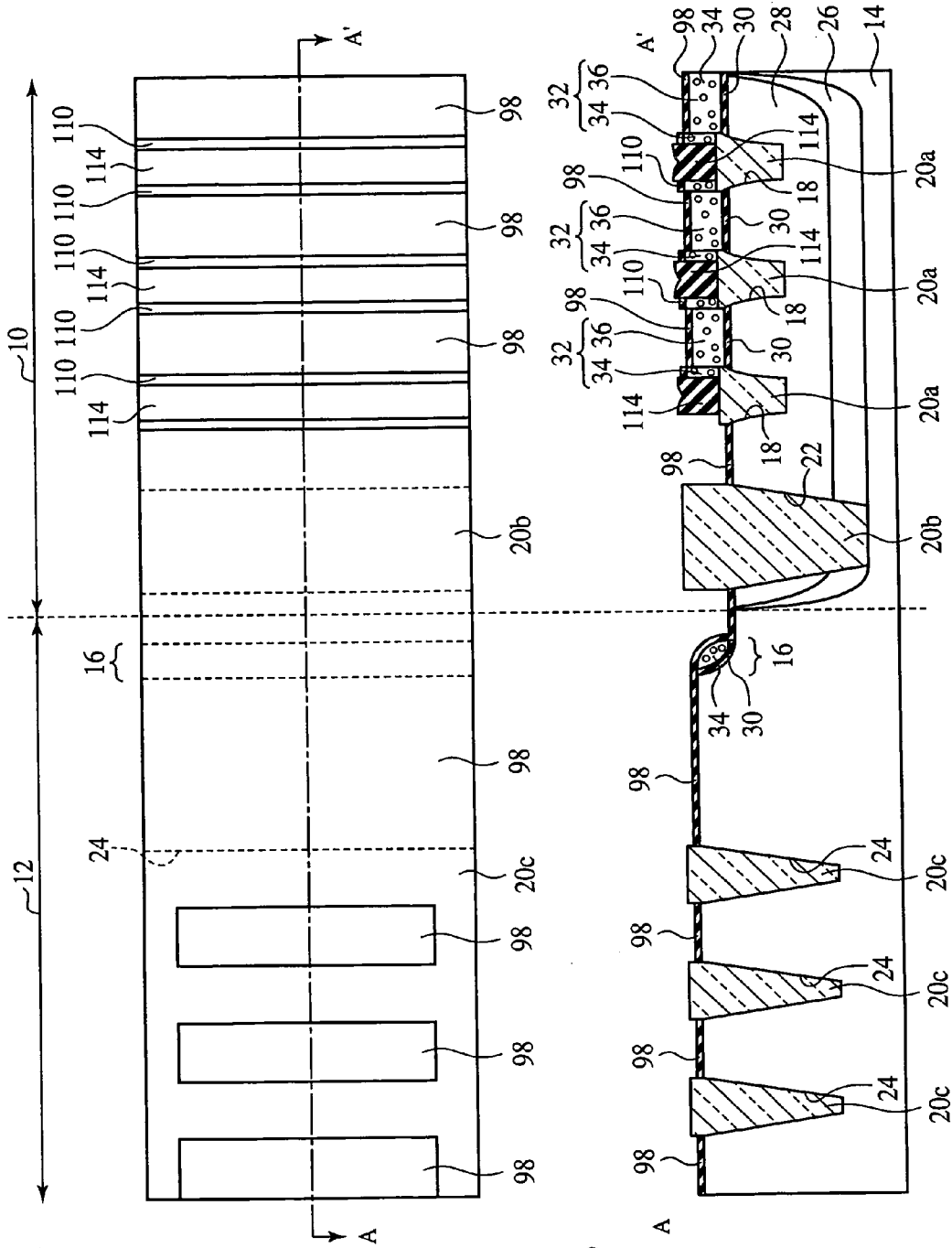

Then, the silicon nitride film 100, 112 are removed by, e.g., wet etching using phosphoric acid (see FIGS. 27A and 27B). At this time, the doped amorphous silicon film 34, 36 forming the floating gates 32 are enclosed by the silicon oxide films 98, 110, 114 and accordingly protected from the etching. That of the doped amorphous silicon film, which is not used as the floating gates 32 is removed by this wet etching.

Then, a photoresist film 116 covering the peripheral circuit region 12 and exposing the flash memory cell region 10 is formed by photolithography.

Figure 28A:
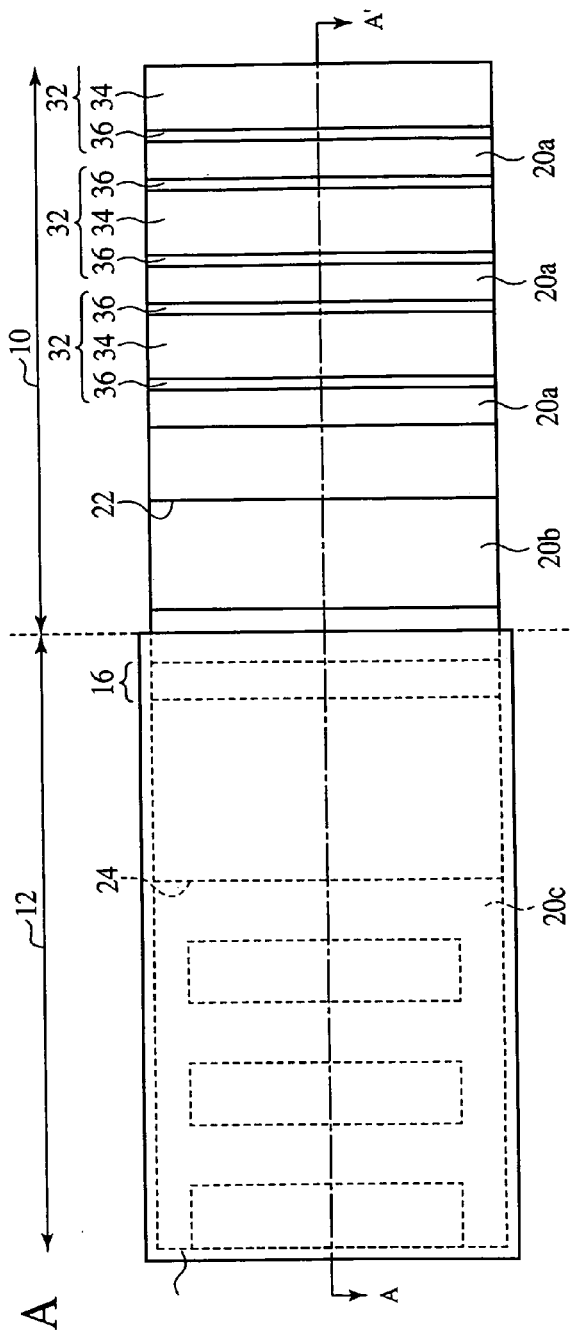
Figure 28B:
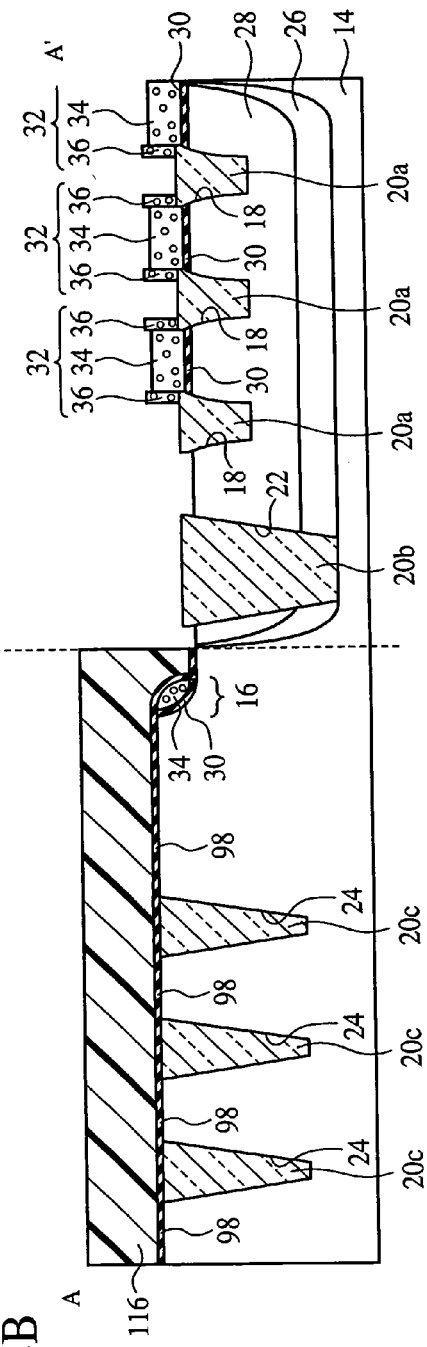

Then, with the photoresist film 116 as the mask and by, e.g., wet etching, the silicon oxide film 114 on the device isolation region 20a and the silicon oxide films 98, 110 on the floating gates 32 (doped amorphous silicon films 34, 36) are removed (see FIGS. 28A and 28B). At this time, the upper part of the device isolation region 20b in the boundary region of the flash memory cell region 10 on the side of the peripheral circuit region 12 is also etched. Thus, the upper surface of the device isolation region 20b is lowered to the position of the upper surface of the device isolation region 20a.

Next, the photoresist film 116 is removed by, e.g., ashing.

Then, a silicon oxide film of, e.g., a 6 nm-thickness and a silicon nitride film of, e.g., a 10 nm-thickness are deposited on the entire surface by, e.g., CVD, and then the surface of the silicon nitride film is thermally oxidized to grow a silicon oxide film of an about 5 nm-thickness. Thus, the ONO film 38 of silicon oxide/silicon nitride/silicon oxide structure is formed on the entire surface (see FIGS. 29A and 29B).

Next, a photoresist film 118 exposing the NMOS transistor region 12n among the NMOS transistor regions 12n in the peripheral circuit region 12, where a prescribed NMOS transistor 62 is to be formed, and covering the rest region is formed by photolithography.

Figure 30A:
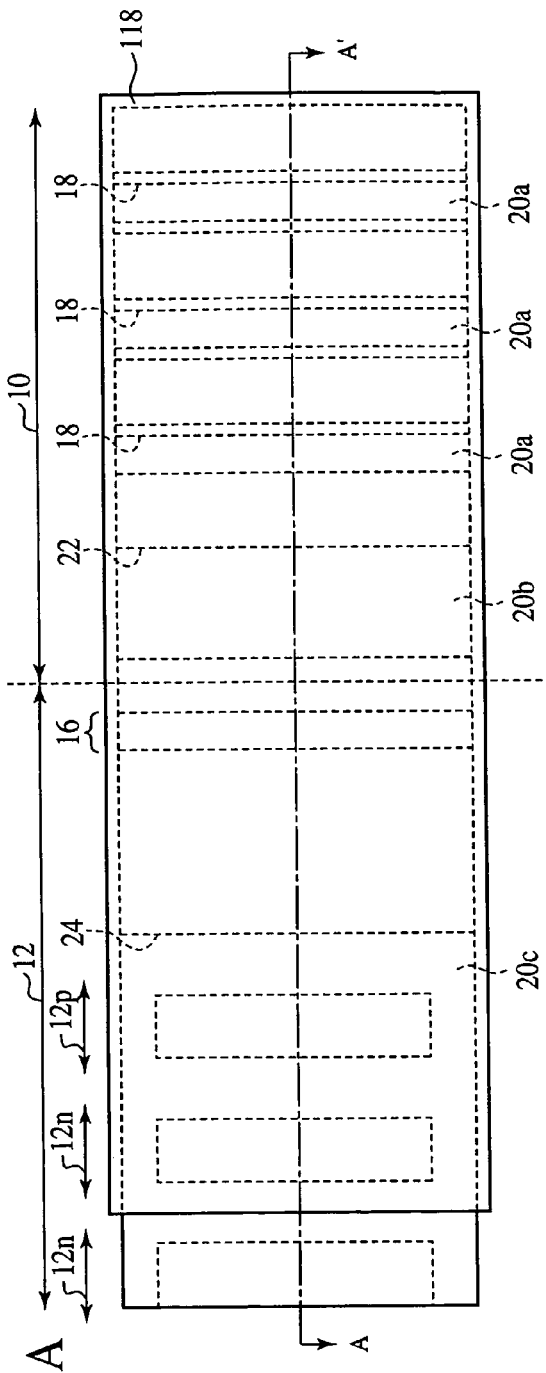
Figure 30B:
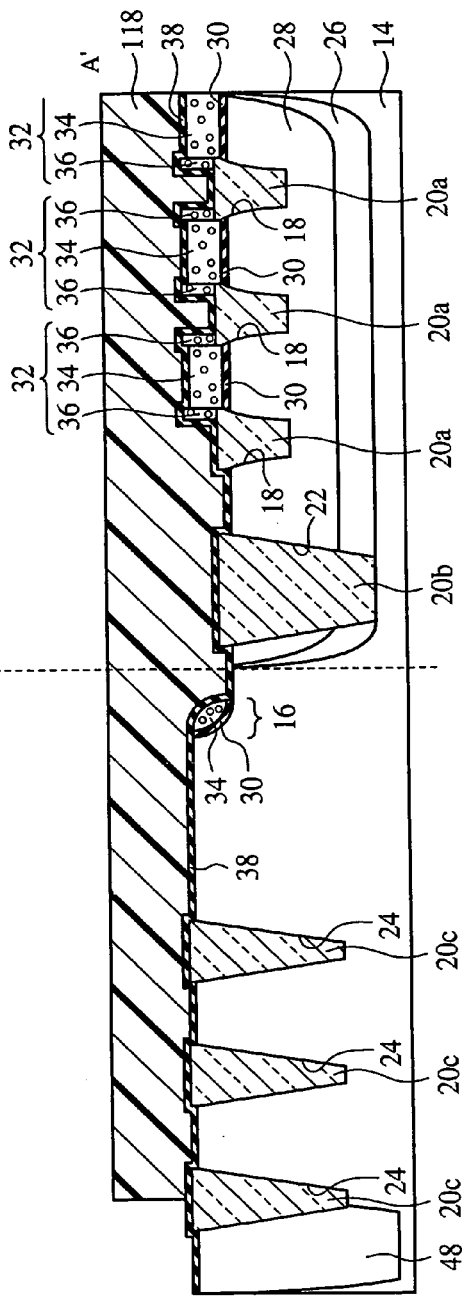

Then, ion implantation is performed with the photoresist film 118 as the mask to form an n-type deep well 48 in the silicon substrate 14 in the NMOS transistor region 12n among the NMOS transistor regions 12n in the peripheral circuit region 12, where the prescribed NMOS transistor 62 is to be formed (see FIGS. 30A and 30B).

Then, the photoresist film 118 is removed by, e.g., ashing.

Then, a photoresist film exposing both the NMOS transistor region 12n where the n-type deep well 48 is formed and the NMOS transistor region 12n where the n-type deep well 48 is not formed and covering the rest region is formed by photolithography.

Figure 31A:
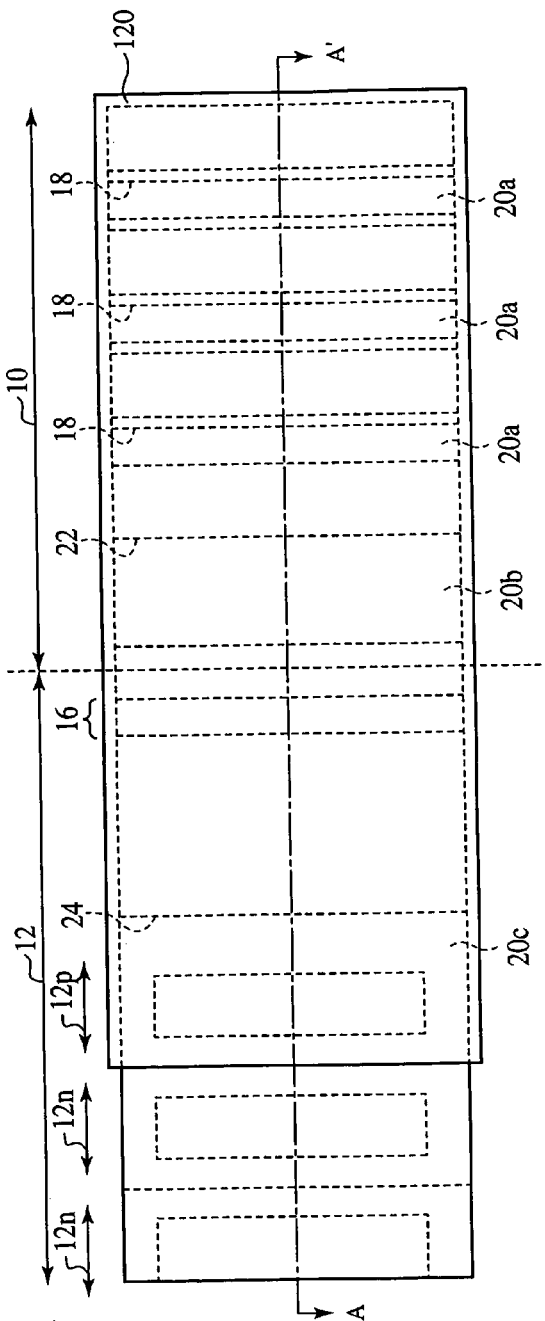
Figure 31B:
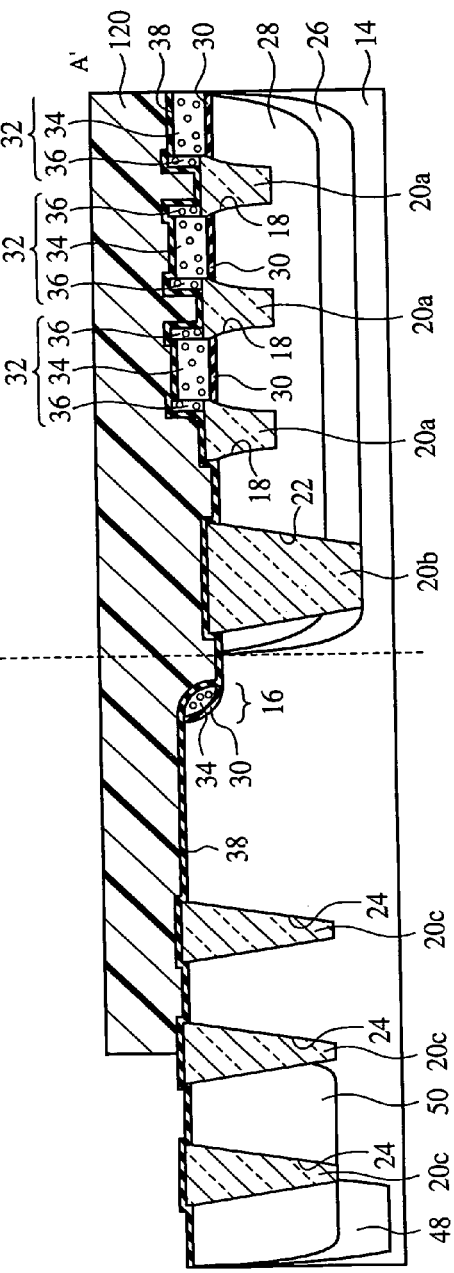

Then, ion implantation is performed with the photoresist film 120 as the mask to form a p-type well 50 in the silicon substrate 14 in the NMOS transistor regions 12n of the peripheral circuit region 12 (see FIGS. 31A and 31B).

Next, the photoresist film 120 is removed by, e.g., ashing.

Then, a photoresist film 122 exposing the PMOS transistor region 12p and covering the rest region is formed by photolithography.

Figure 32A:
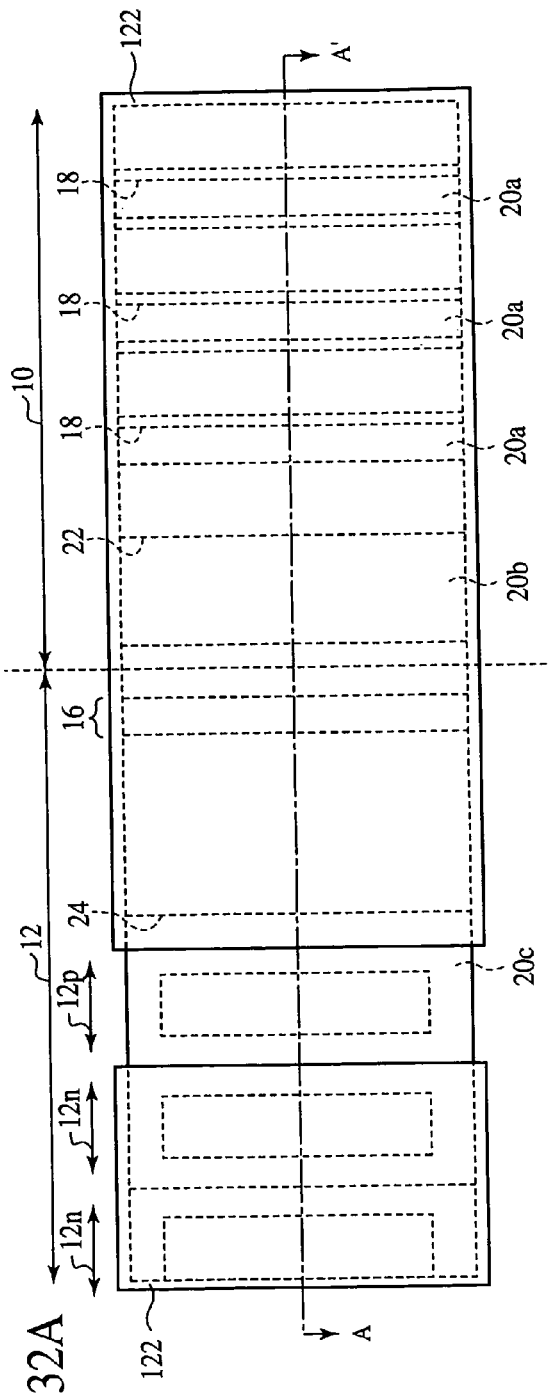
Figure 32B:
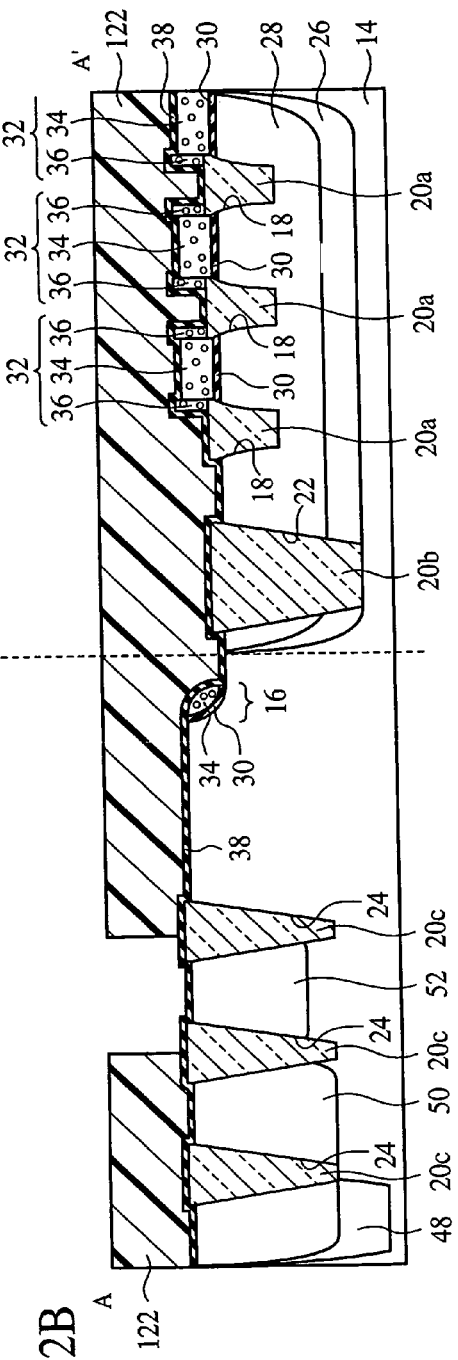

Next, ion implantation is performed with the photoresist film 122 as the mask to form an n-type well 52 in the silicon substrate 14 in the PMOS transistor region 12p in the peripheral circuit region 12 (see FIGS. 32A and 32B).

Then, the photoresist film 122 is removed by, e.g., ashing.

Then, a photoresist film 124 exposing the NMOS transistor region 12n and the PMOS transistor region 12p in the peripheral circuit region 12 and covering the rest region is formed by photolithography.

Figure 33A:
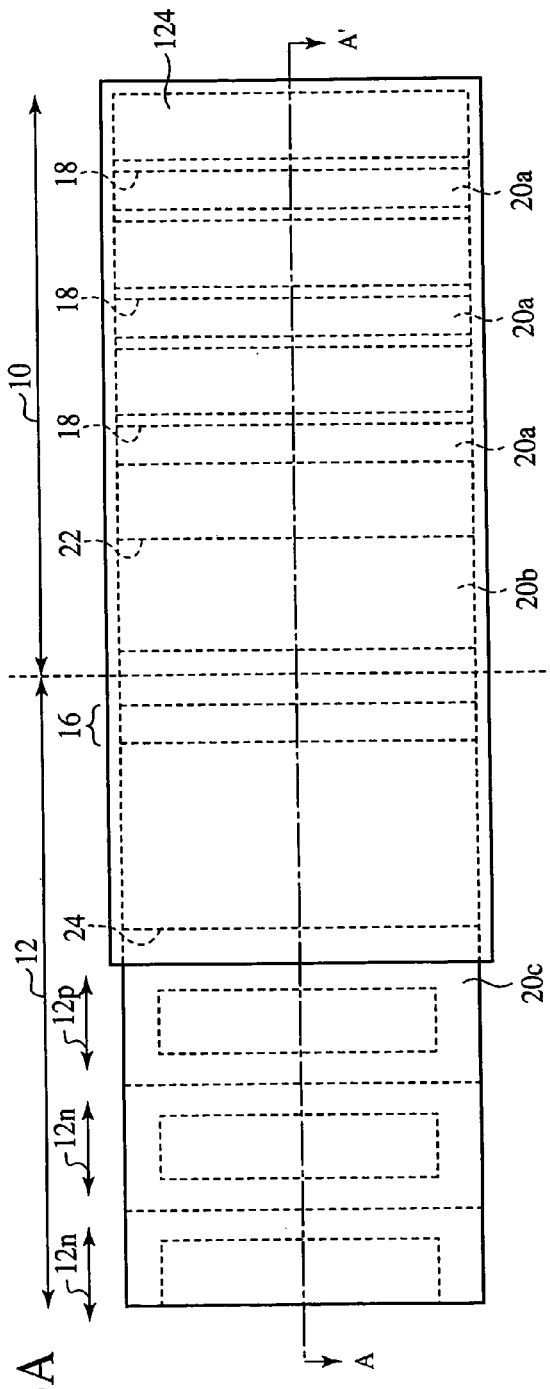
Figure 33B:
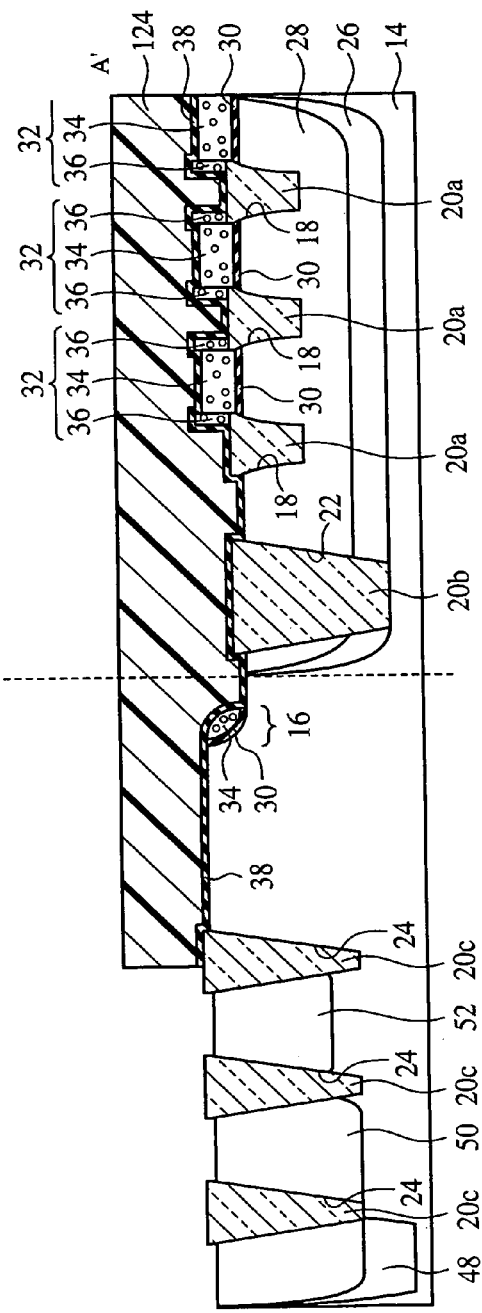

Next, the ONO film 38 is etched by, e.g., dry etching with the photoresist film 124 as the mask to remove the ONO film 38 in the NMOS transistor region 12n and the PMOS transistor region 12p in the peripheral circuit region 12 (see FIGS. 33A and 33B).

Next, the photoresist film 124 is removed by, e.g., ashing.

Then, a gate insulation film 54 of a silicon oxide film of, e.g., a 1-2 nm-thickness is formed by, e.g., thermal oxidation on the silicon substrate 14 in the NMOS transistor region 12n and the PMOS transistor region 12p in the peripheral circuit region 12.

Figure 34A:
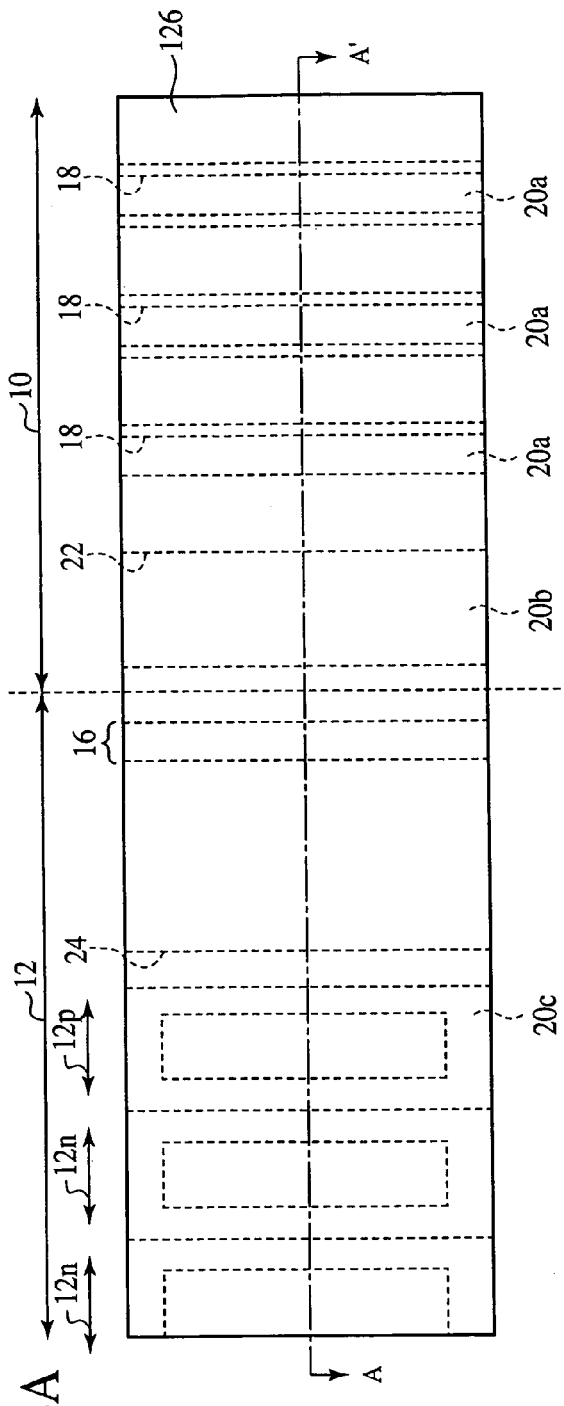
Figure 34B:
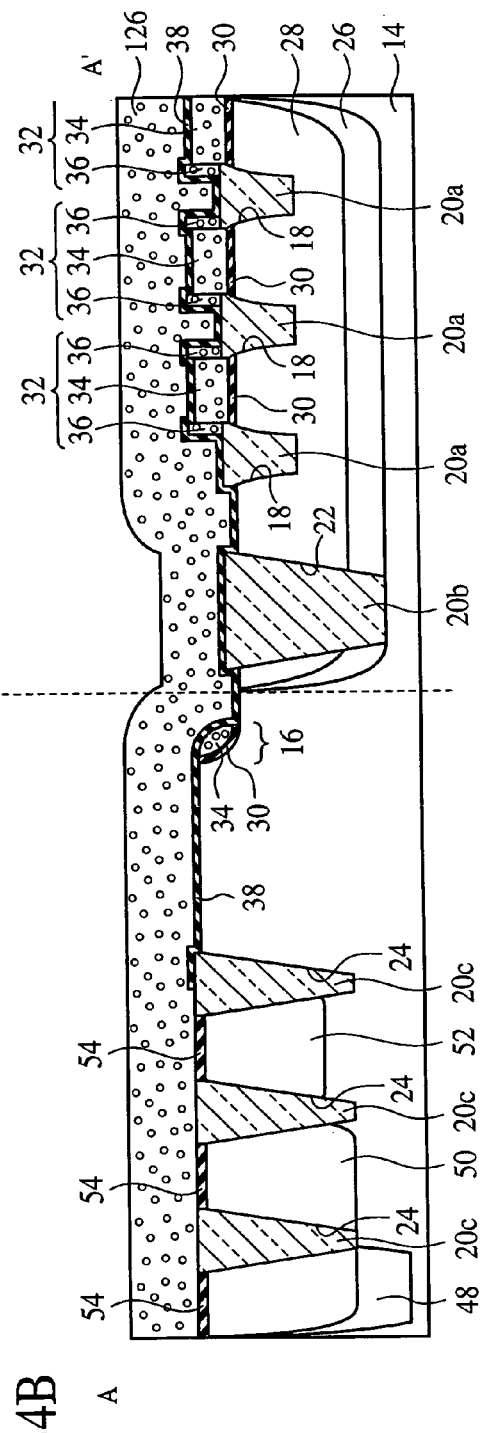
Figure 35A:
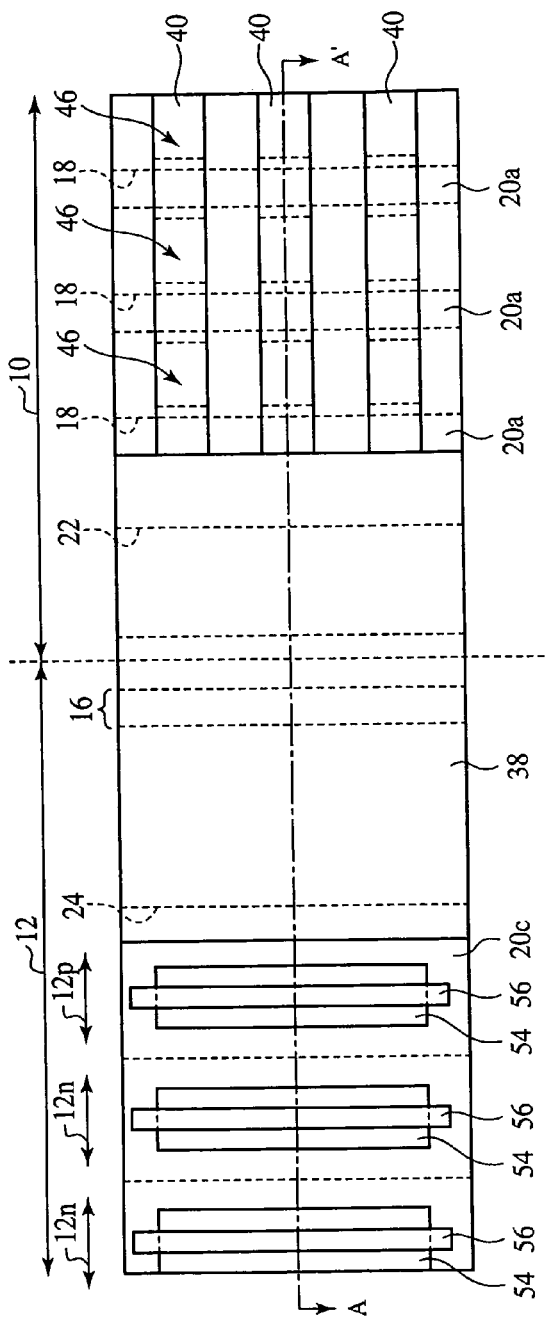
Figure 35B:
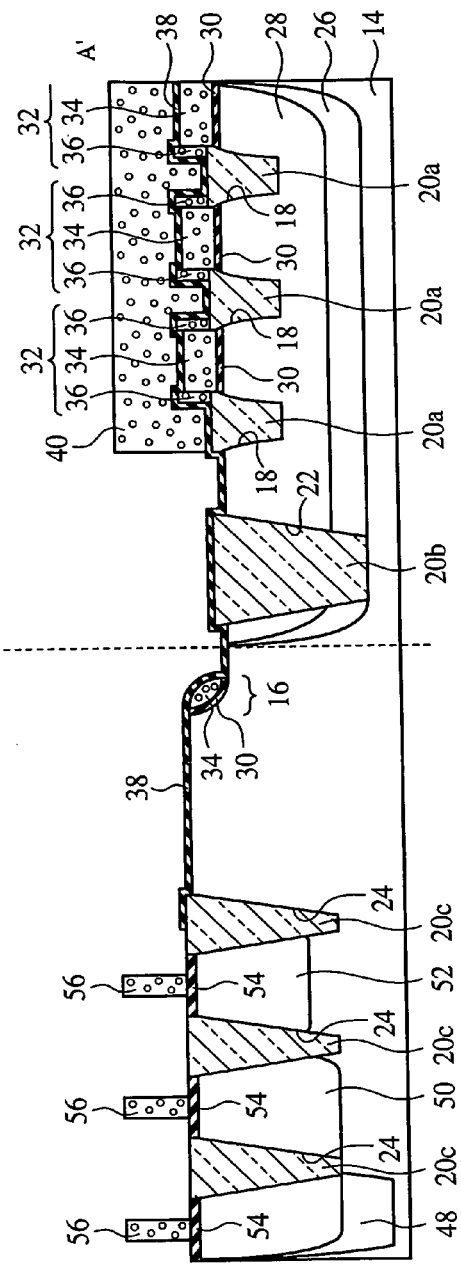

Next, a polysilicon film 126 of, e.g., a 120 nm-thickness is deposited on the entire surface by, e.g., CVD (see FIGS. 34A and 34B).

Then, by photolithography and dry etching, the polysilicon film 126 in the flash memory cell region 10 and in the peripheral circuit region 12 is patterned. Thus, gate electrodes (control gates) 40 of the polysilicon film 126 are formed in the flash memory cell region 10, and gate electrodes 56 of the polysilicon film 126 are formed in the peripheral circuit region 12. Furthermore, in the flash memory cell region 10, the ONO film 38 and the floating gates 32 are patterned by photolithography and dry etching (see FIGS. 35A and 35B).

The step formed in the surface of the silicon substrate 14 mitigates the step of the substrate surface due to the tunnel oxide film 30 and the floating gates 32, and the substrate surface on which the polysilicon film 126 is formed on is surely planarized. Accordingly, the polysilicon film 126 can be formed flat. The exposure for exposing the photoresist film (not illustrated) for patterning the polysilicon film 126 can be conducted with very high accuracy. Accordingly, the fine control gates 40 and the fine gate electrodes 56 can be formed with high accuracy.

Then, a photoresist film (not illustrated) exposing the flash memory cell region 10 and covering the rest region is formed by photolithography. Next, ion implantation is performed with the photoresist film as the mask to form the LDD regions 42a of the source/drain regions of the flash memory cells 46. After the LDD regions 42a have been formed, the photoresist film used as the mask is removed by, e.g., ashing.

Next, a photoresist film (not illustrated) exposing the NMOS transistor region 12n and covering the rest region is formed by photolithography. Next, ion implantation is performed with the photoresist film as the mask to form the LDD regions 58a of the source/drain regions 58 of the NMOS transistor 62. After the LDD regions 58a have been formed, the photoresist film used as the mask is removed by, e.g., ashing.

Next, a photoresist film (not illustrated) exposing the PMOS transistor region 12p and covering the reset region is formed by photolithography. Next, ion implantation is performed with the photoresist film as the mask to form the LDD regions 64a of the source/drain regions 64 of the PMOS transistor 66. After the LDD regions 64a have been formed, the photoresist film used as the mask is removed by, e.g., ashing.

Figure 36A:
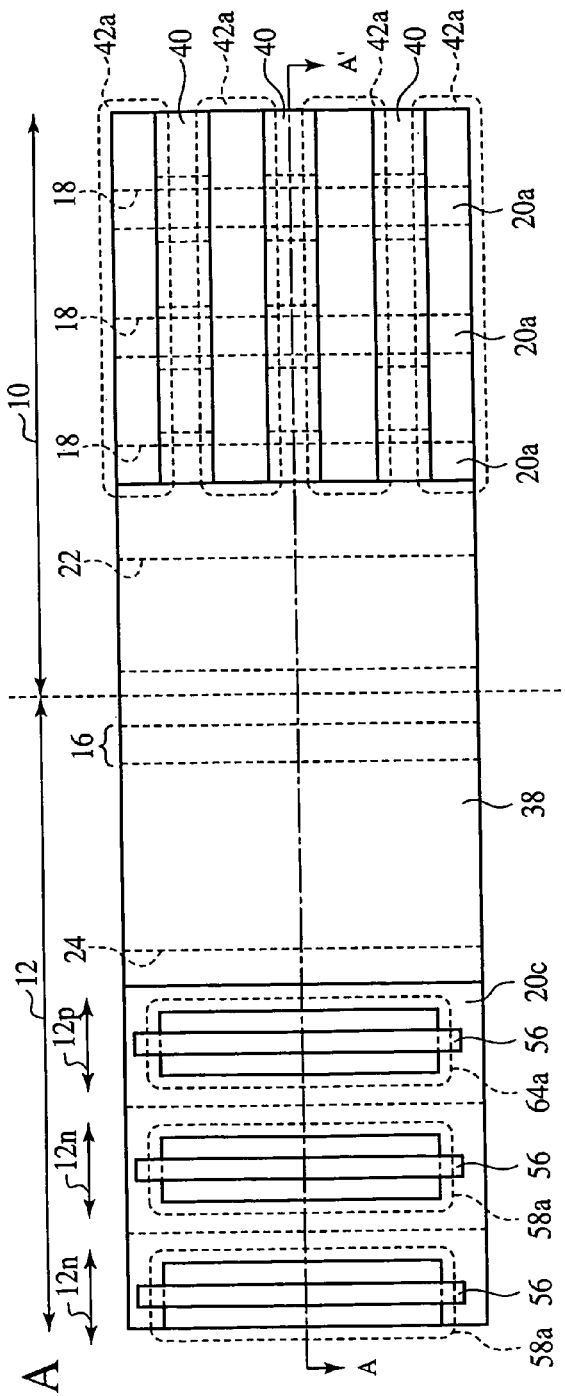
Figure 36B:
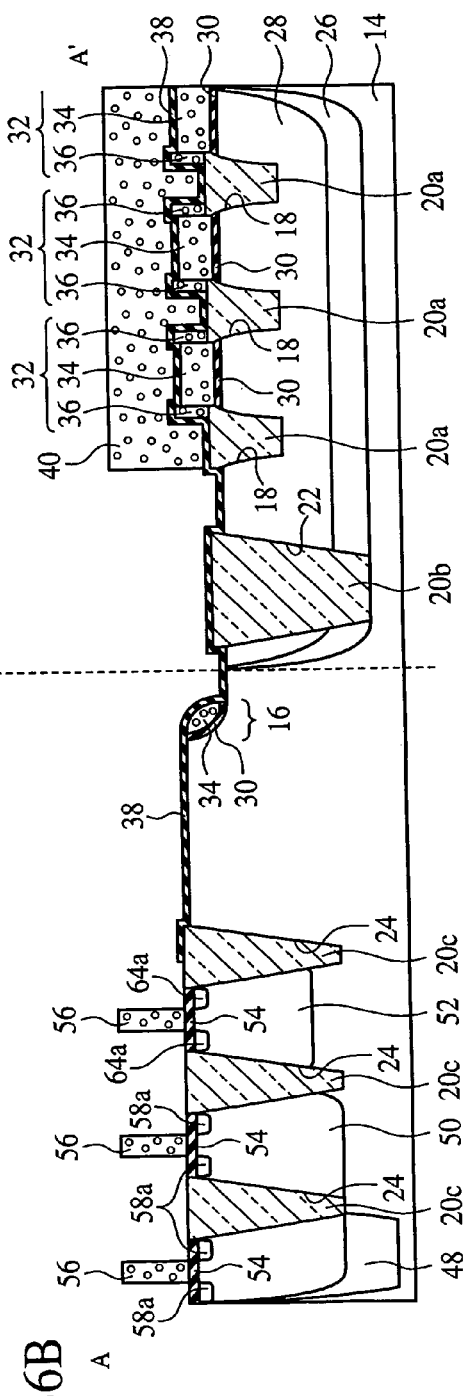

Thus, the LDD regions 42a of the source/drain regions 42 of the flash memory cells 46, the LDD regions 58a of the source/drain region 58 of the NMOS transistor 62 and the LDD regions 64a of the source/drain regions 64 of the PMOS transistor 66 are formed (see FIGS. 36A and 36B).

Next, a silicon oxide film or a silicon nitride film of, e.g., a 1-100 nm-thickness is formed on the entire surface by, e.g., CVD. Next, the silicon oxide film or the silicon nitride film is etched back to form a sidewall insulation film 44 of the silicon oxide film or the silicon nitride film on the side walls of the gate electrodes (control gates) 40 and the floating gates 32 and to form a sidewall insulation film of the silicon oxide film or the silicon nitride film on the side walls of the gate electrodes 56 (see FIGS. 37A and 37B).

Then, a photoresist film (not illustrated) exposing the flash memory cell region 10 and covering the rest region is formed by photolithography. Then, ion implantation is performed with the photoresist film as the mask to form the source/drain regions 42 of the flash memory cells 46. After the source/drain regions 42 have been formed, the photoresist film used as the mask is removed by, e.g., ashing.

Then, a photoresist film (not illustrated) exposing the NMOS transistor region 12n and covering the rest region is formed by photolithography. Next, ion implantation is performed with the photoresist film as the mask to form the source/drain regions 58 of the NMOS transistor 62. After the source/drain regions 58 have been formed, the photoresist film used as the mask is removed by, e.g., ashing.

Next, a photoresist film (not illustrated) exposing the PMOS transistor region 12p and covering the rest region is formed by photolithography. Next, ion implantation is performed with the photoresist film as the mask to form the source/drain regions 64 of the PMOS transistor 66. After the source/drain regions 64 have been formed, the photoresist films used as the mask is removed by, e.g., ashing.

Figure 38A:
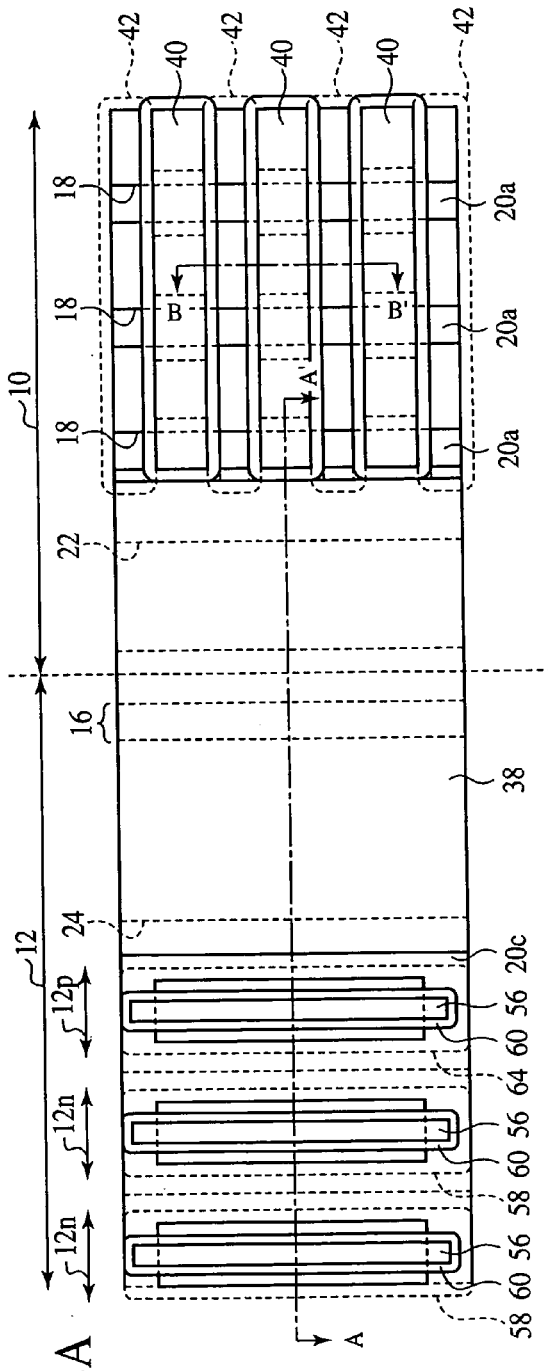
Figure 38B:
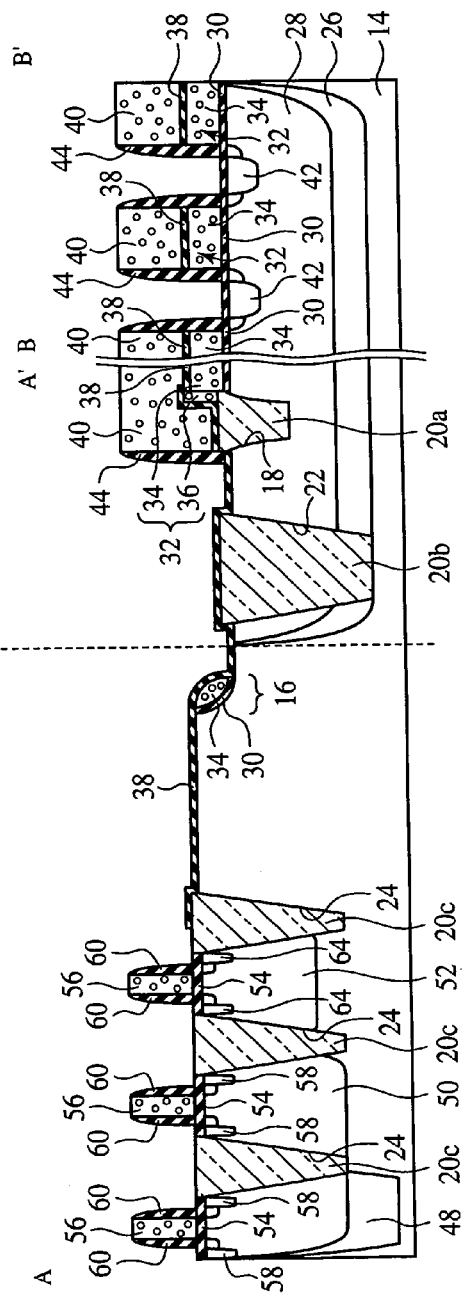
Figure 40A:
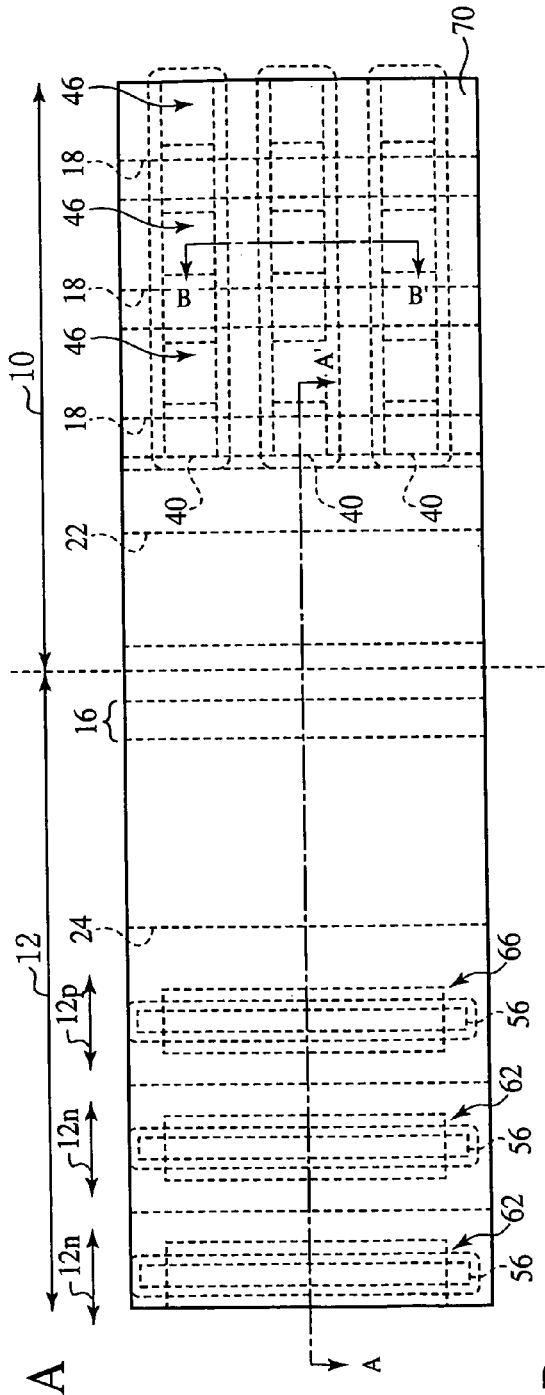
Figure 40B:
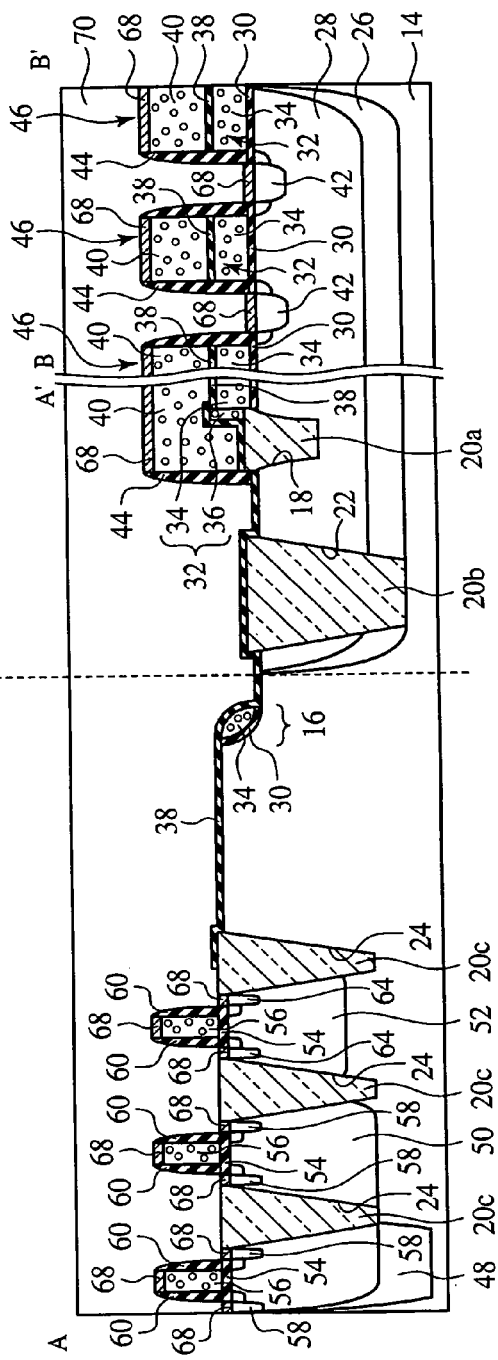

Thus, the source/drain regions 42 of the flash memory cells 46, the source/drain regions 58 of the NMOS transistor 62 and the source/drain regions 64 of the PMOS transistor 66 are formed (see FIGS. 38A and 38B).

Then, the upper parts of the control gates 40, gate electrodes 56 and the source/drain regions 42, 58, 64 are selectively silicided by the known salicide process to form silicide films 68 on the control gates 40, the gate electrodes 56 and the source/drain regions 42, 58, 64 (see FIGS. 39A and 39B).

Thus, the flash memory cells 46, the NMOS transistor 62 and the PMOS transistor 66 are formed on the silicon substrate 14.

Next, on the silicon substrate 14 with the flash memory cells 46, etc. formed on, a silicon oxide film is formed by, e.g., CVD, and the surface of the silicon oxide film is planarized by, e.g., CMP. Thus, an inter-layer insulation film 70 of the silicon oxide film of, e.g., a 250-500 nm-thickness is formed (see FIGS. 40A and 40B).

Figures 41A, 41B:
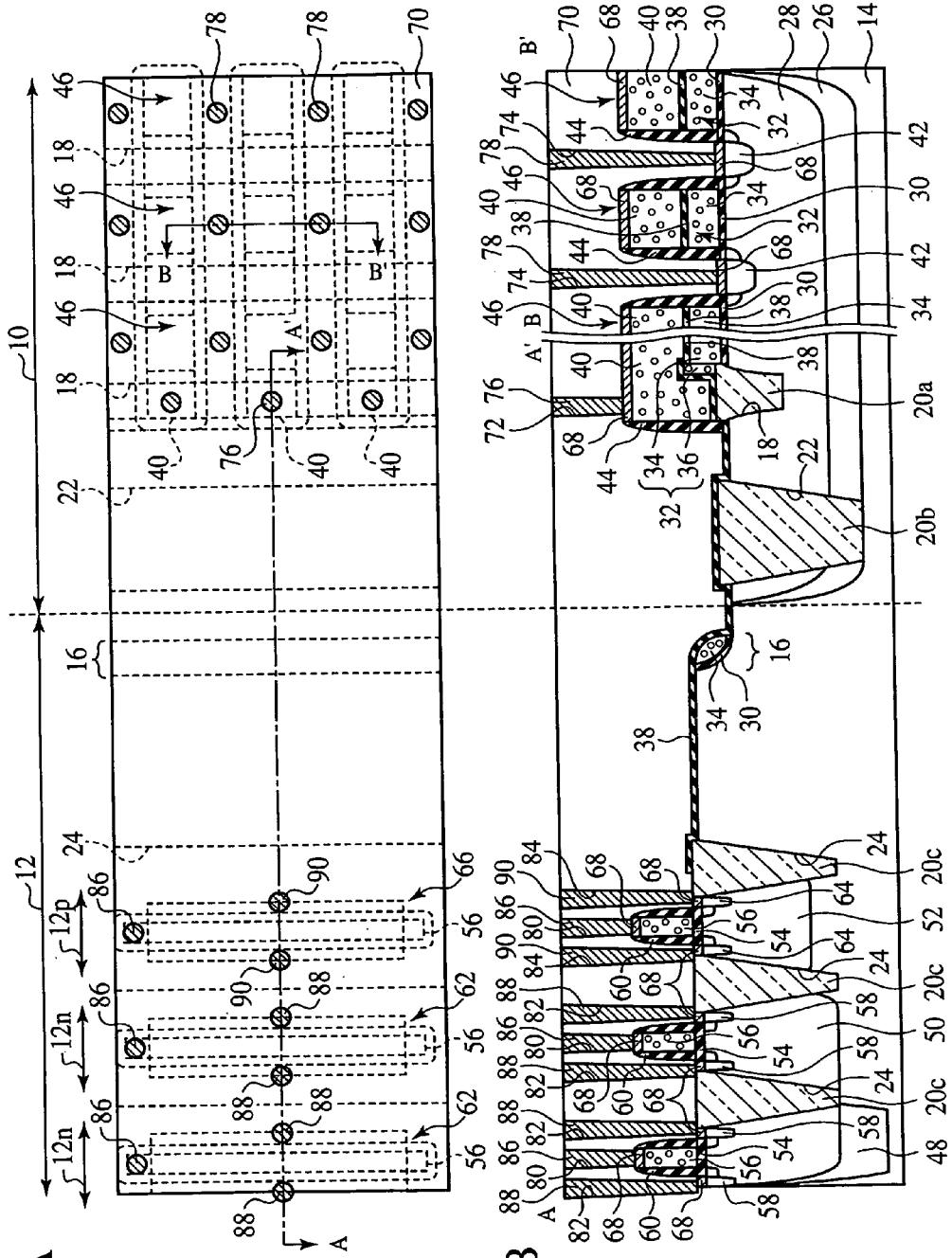

Then, the contact holes 72, 74, 80, 82, 84 are formed in the inter-layer insulation film 70, and the electrode plugs 76, 78, 86, 88, 90 are formed, buried in the contact holes 72, 74, 80, 82, 84 (see FIGS. 41A and 41B).

Thus, the semiconductor device according to the present embodiment illustrated in FIGS. 1A and 1B is fabricated.

As described above, according to the present embodiment, the step is formed in the surface of the silicon substrate 14 so that the surface of the silicon substrate 14 in the flash memory cell region 10 is lower than the surface of the silicon substrate 14 in the peripheral circuit region 12, whereby the height of the upper surface of the doped amorphous silicon film 34 forming the floating gates 32 and the height of the upper surface of the silicon substrate 14 in the peripheral circuit region 12 can be made substantially equal to each other. This makes it possible that the photoresist film 104 for patterning the silicon substrate 14 in the peripheral circuit region 12 and the doped amorphous silicon film 34 in the flash memory cell region 10 can be exposed with very high accuracy. Thus, according to the present embodiment, the silicon substrate 14 in the peripheral circuit region 12 and the doped amorphous silicon film 34 forming the floating gates 32 can be patterned with high accuracy, which makes it possible to provide a semiconductor device including fine memory cells.

Furthermore, according to the present embodiment, because of the tunnel oxide film 30 whose etching rate is low present below the doped amorphous silicon film 34, the etching rate in the flash memory cell region 10 can be low. Accordingly, the trench 24 in the peripheral circuit region 12 can be formed relatively deep while the trenches 18 in the flash memory cell region 10 can be formed relatively shallow.

According to the present embodiment, the step formed in the surface of the silicon substrate 14 ensures the flatness of the surface of the substrate with the polysilicon film 126 formed on for forming the control gates 40 and the gate electrodes 56, and the polysilicon film 126 can be formed flat. Accordingly, the photoresist film for patterning the polysilicon film 126 can be exposed with very high accuracy. Therefore, the fine control gates 40 and the fine gate electrodes 56 can be formed with high accuracy.

According to the present embodiment, the trench 18 is formed by self-alignment when the doped amorphous silicon film 34 forming the floating gates 32 is patterned, which permits the trench 18 to be formed without aligning the patterns with high accuracy. Thus, the present embodiment facilitates the downsizing of the memory cells.

Furthermore, according to the present embodiment, the floating gates 32 each comprises the main portion 34 which the trench 18 is formed by self-alignment with, and the sidewall portion 36 formed on the side wall of the main portion 34, which can make the capacitance between the floating gate 32 and the control gate 40 larger in comparison with that between floating gate 32 including the main portions 34 alone and the control gate 40. Thus, according to the present embodiment, even when the memory cells are more downsized, the capacitance between the floating gate 32 and the control gate 40 can be sufficiently ensured. According to the present embodiment, even when the memory cells are downsized, the memory cells can have a required coupling ratio and good electric characteristics.

(A Modification)

Next, the method for fabricating the semiconductor device according to a modification of the present embodiment will be explained with reference to FIGS. 49A to 51B. FIGS. 49A to 51B are sectional views of the semiconductor device according to the present modification in the steps of the method for fabricating the same device, which illustrate the method.

The method for fabricating the semiconductor device according to the present modification is characterized in that the surface of the silicon substrate 14 in the flash memory cell region 10 is selectively oxidized to form a silicon oxide film, and the silicon oxide film is removed, whereby the step is formed in the surface of the silicon substrate 14 so that the surface of the silicon substrate 14 in the in the flash memory cell region 10 is lower than the surface of the silicon substrate 14 in the peripheral circuit region 12.

The steps up to the step of forming the n-type deep well 26 and the p-type well 28 in the silicon substrate 14 in the flash memory cell region 10 are the same as illustrated in FIGS. 2A to 5B, and their explanation will not be repeated.

Figures 49A, 49B:
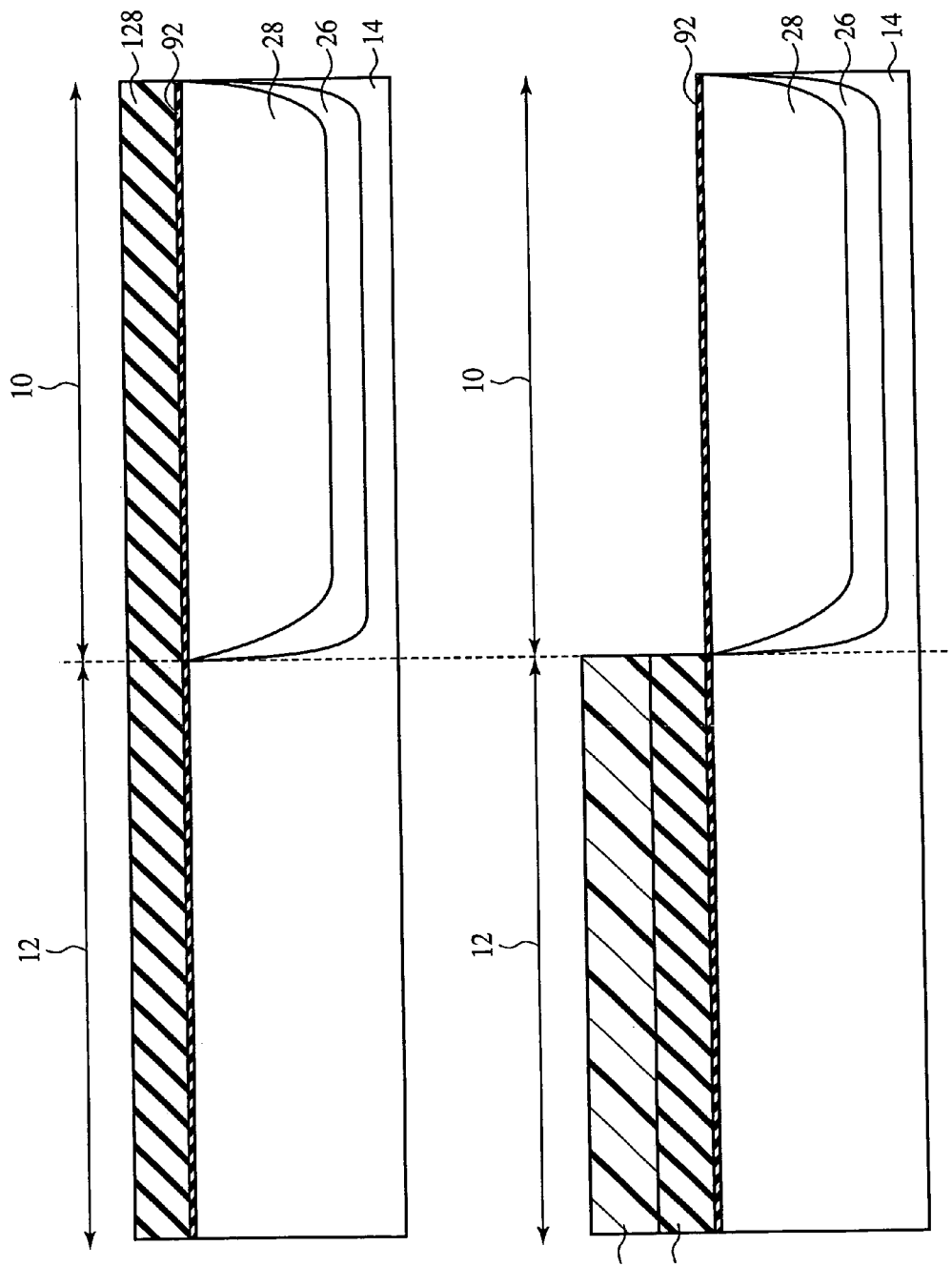

Then, after the photoresist film 94 for forming the n-type deep well 26 and the p-type well 28 is removed by, e.g., ashing, a silicon nitride film 128 of, e.g., a 110 nm-thickness is deposited on the silicon oxide film 92 by, e.g., CVD (see FIG. 49A).

Next, a photoresist film 130 exposing the flash memory cell region 10 and covering the peripheral circuit region 12 is formed by photolithography.

Then, by, e.g., wet etching and with the photoresist film 130 as the mask, the silicon nitride film 128 is etched to removed the silicon nitride film 128 in the flash memory cell region 10 (see FIG. 49B).

Next, the photoresist film 130 is removed by, e.g., ashing.

Then, by, e.g., thermal oxidation and with the silicon nitride film 130 as the mask, the surface of the silicon substrate 14 is oxidized to grown a silicon oxide film 132 of, e.g., a 160 nm-thickness on the surface of the silicon substrate 14 in the flash memory cell region 10 (see FIG. 50A).

Next, the silicon nitride film 128 is etched by, e.g., wet etching to remove the silicon nitride film 128 in the peripheral circuit region 12 (see FIG. 50B).

Figures 51A, 51B:
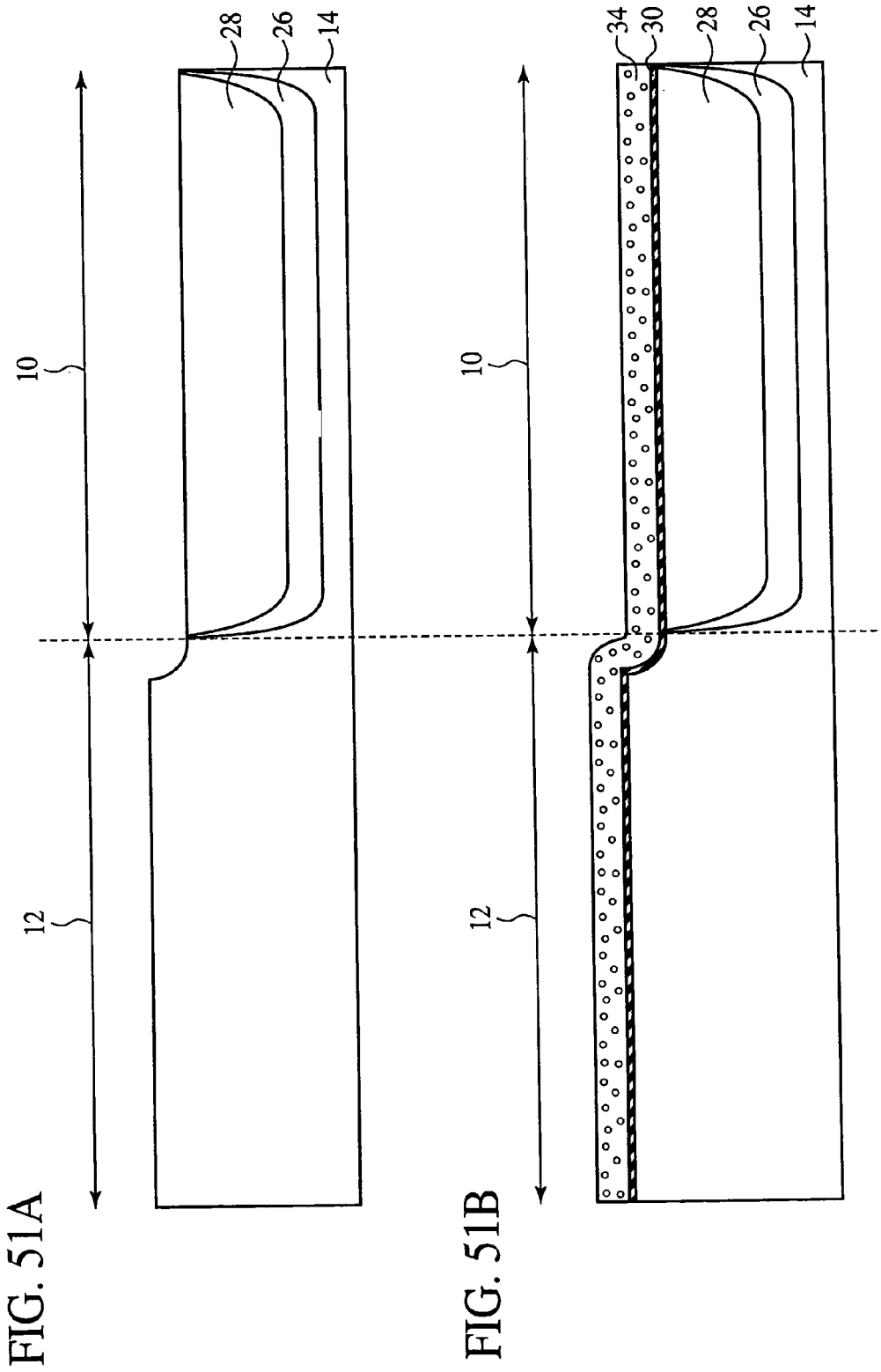

Then, the silicon oxide film 92 and the silicon oxide film 132 are etched by, e.g., wet etching to remove the silicon oxide film 92 in the peripheral circuit region 12 and the silicon oxide film 132 in the flash memory cell region 10 (see FIG. 51A). The silicon oxide film 132 in the flash memory cell region 10 is removed, whereby the step is formed in the surface of the silicon substrate 14 so that the surface of the silicon substrate 14 in the flash memory cell region 10 is lower than the surface of the silicon substrate 14 in the peripheral circuit region 12.

Then, a silicon oxide film 30 of, e.g., a 10 nm-thickness is formed on the entire surface by, e.g., thermal oxidation. The silicon oxide film 30 is to be used as the tunnel oxide film of the flash memory cells 46.

Next, a doped amorphous silicon film 34 of, e.g., a 70 nm-thickness is deposited on the silicon oxide film 30 by, e.g., CVD (see FIG. 51B). The doped amorphous silicon film 34 is to be used as the main portions of the floating gates 32 of the flash memory cells 46.

The steps following the formation of the doped amorphous silicon film 34 are the same as described above with reference to FIGS. 10A to 41B, and their explanation will not be repeated.

As described in the present modification, the surface of the silicon substrate 14 in the flash memory cell region 10 is selectively oxidized to form the silicon oxide film 132, and the silicon oxide film 132 is removed, whereby the step may be formed in the silicon substrate 14 so that the surface of the silicon substrate 14 in the flash memory cell region 10 is lower than the surface of the silicon substrate 14 in the peripheral circuit region 12.

A Second Embodiment

Figures 52A, 52B:
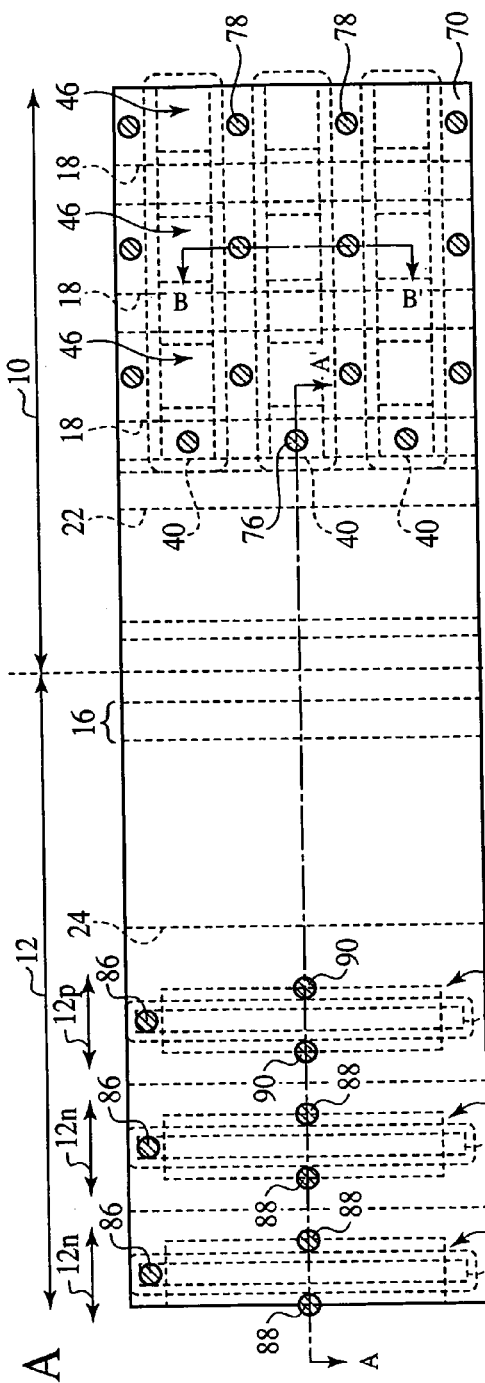
FIGS. 52A and 52B are diagrammatic views of the semiconductor device according to a second embodiment of the present invention, which illustrate a structure thereof.

The semiconductor device and the method for fabricating the same according to a second embodiment of the present invention will be explained with reference to FIGS. 52A to 59B. FIGS. 52A and 52B are diagrammatic views of the semiconductor device according to the present embodiment, which illustrate a structure thereof. FIGS. 53A to 59B are sectional views of the semiconductor device according to the present embodiment in the steps of the method for fabricating the same, which illustrate the method. The same members of the present embodiment as those of the semiconductor device and the method for fabricating the same according to the first embodiment are represented by the same reference numbers not to repeat or to simplify their explanation.

First, the structure of the semiconductor device according to the present embodiment will be explained with reference to FIGS. 52A and 52B. FIG. 52A is a plan view of the semiconductor device according to the present embodiment, which illustrates the structure thereof. FIG. 52B is the sectional views along the line A-A' and the line B-B' in FIG. 52A.

The basic structure of the semiconductor device according to the present embodiment is substantially the same as that of the semiconductor device according to the first embodiment. The semiconductor device according to the present embodiment is characterized mainly in that a silicon layer 134 is epitaxially grown on the surface of a silicon substrate 14 in a peripheral circuit region 12, and the surface of the silicon substrate 14 in a flash memory cell region 10 is lower by the thickness of the silicon layer 134 than the surface of the silicon layer 134 in the peripheral circuit region 12. In other words, the surface of the silicon substrate 14 in the flash memory cell region 10 is lower by the thickness of the silicon layer 134 than the surface of the silicon substrate 14 in the peripheral circuit region 12.

As illustrated in FIG. 52B, the epitaxially grown silicon layer 134 is formed on the surface of the silicon substrate in the peripheral circuit region 12. The silicon layer 134 forms a step in the surface of the silicon substrate 14 between the flash memory cell region 10 and the peripheral circuit region 12. That is, the surface of the silicon substrate 14 in the flash memory cell region 10 is lower by the thickness of the silicon layer 134 than the surface of the silicon layer 134 in the peripheral circuit region 12. In other words, the surface of the silicon substrate 14 in the flash memory cell region 10 is lower by the thickness of the silicon layer 134 than the surface of the silicon substrate 14 in the peripheral circuit region 12. The height of the surface of the silicon layer 134 in the peripheral circuit region 12 is substantially the same as the height of the upper surface of the doped amorphous silicon film 34 formed in the flash memory cell region 10.

In the flash memory cell region 10, as in the semiconductor device according to the first embodiment, flash memory cells 46 are formed on the silicon substrate 14 with a device isolation region 20a formed in a trench 18.

In the peripheral circuit region 12, as in the semiconductor device according to the first embodiment, a NMOS transistor 62 and a PMOS transistor 66 are formed on the silicon substrate 14 with the silicon layer 134 formed on.

As in the semiconductor device according to the present embodiment, the step may be formed in the surface of the silicon substrate 14 by the silicon layer 134 epitaxially grown on the surface of the silicon substrate 14 in the peripheral circuit region 12 so that the surface of the silicon substrate 14 in the flash memory cell region 10 is lower than the surface of the silicon substrate 14 in the peripheral circuit region 12.

Next, the method for fabricating the semiconductor device according to the present embodiment will be explained with reference to FIGS. 53A to 59B.

Figure 53A:
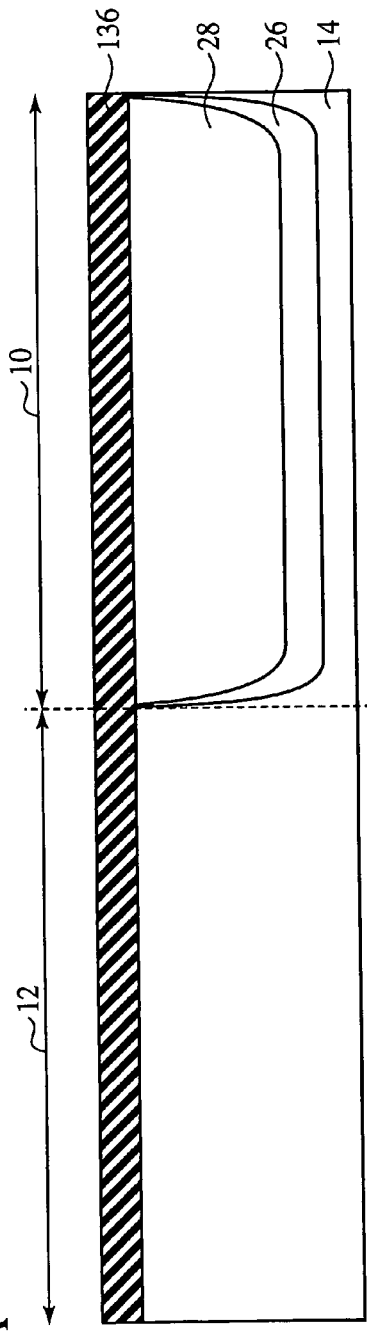
FIGS. 53A-53B, 54A-54B, 55A-55B, 56A-56B, 57A-57B, 58A-58B and 59A-59B are sectional views of the semiconductor device according to the second embodiment of the present invention in the steps of the method for fabricating the same, which illustrate the method.

First, a silicon oxide film 136 of, e.g., an 80 nm-thickness is deposited by, e.g., CVD on the silicon substrate 14 with an n-type deep well 26 and a p-type well 28 formed in (see FIG. 53A).

Figure 53B:
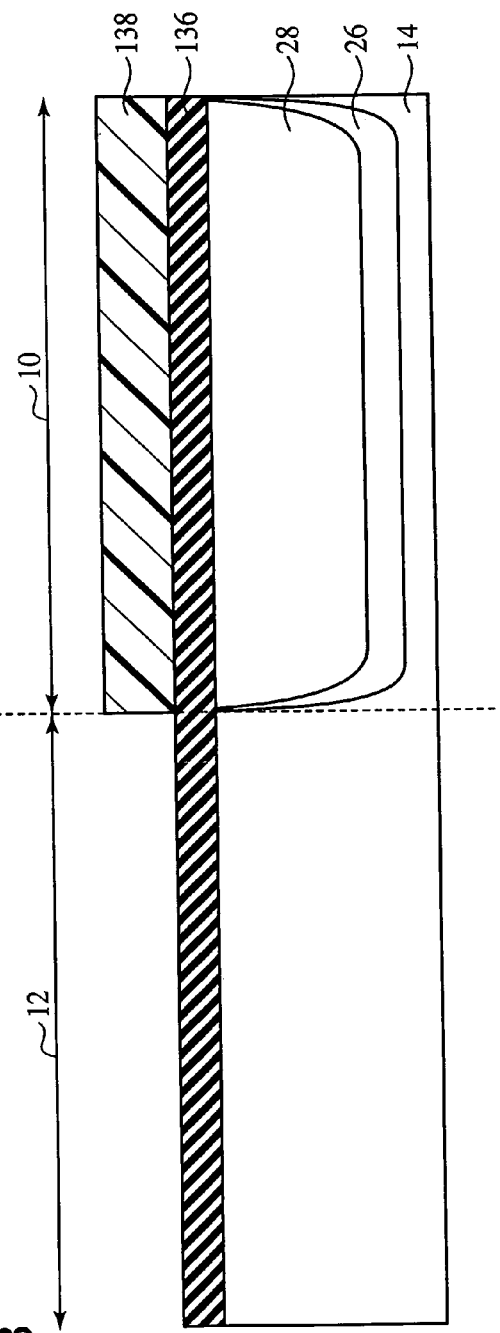

Then, a photoresist film 138 exposing the peripheral circuit region 12 and covering the flash memory cell region 10 is formed by photolithography (see FIG. 53B).

Then, by, e.g., wet etching and with the photoresist film 138 as the mask, the silicon oxide film 136 is etched to remove the silicon oxide film 136 in the peripheral circuit region 12.

Figures 54A, 54B:
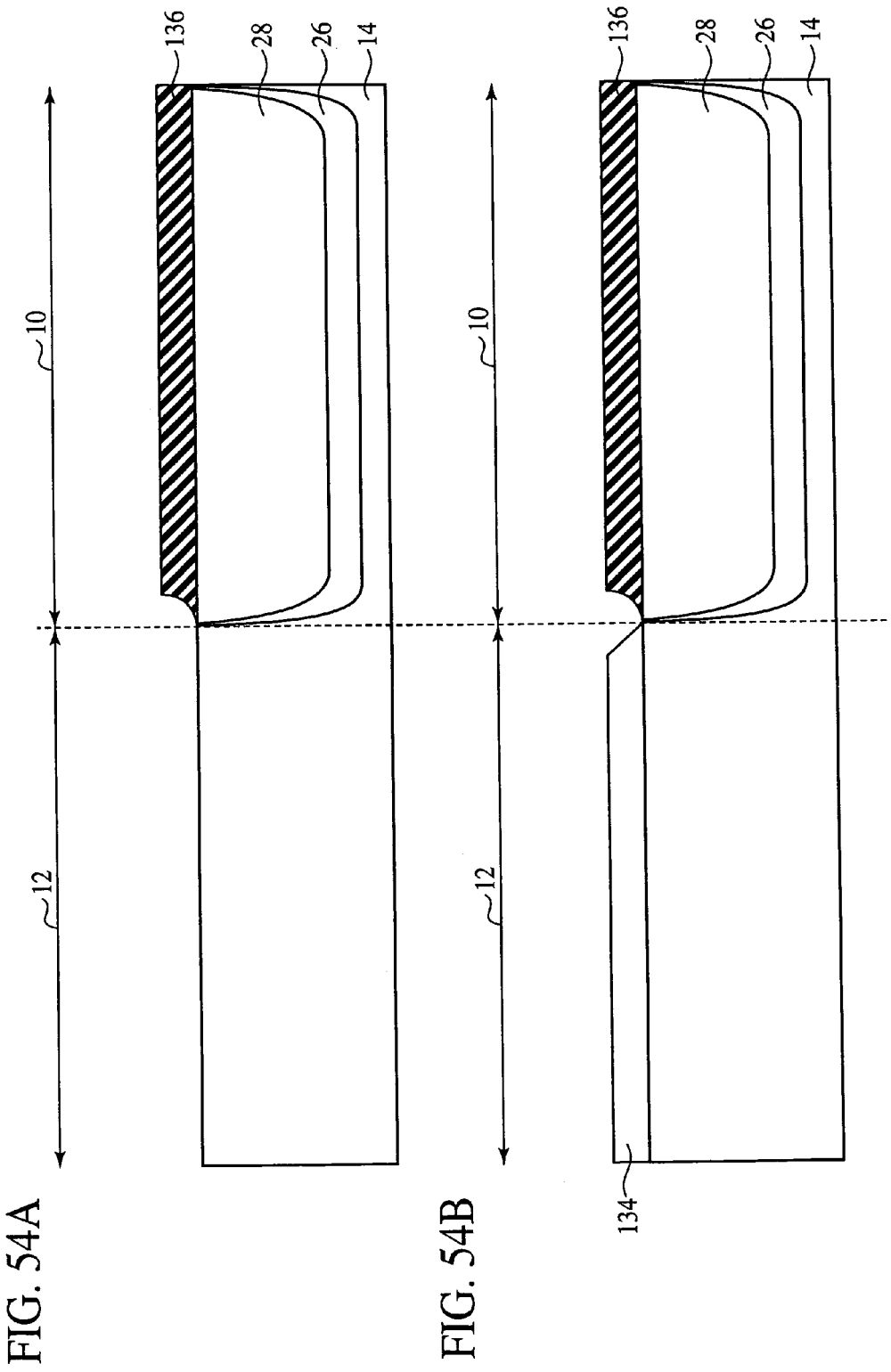

Next, the photoresist film 138 is removed by, e.g., ashing (see FIG. 54A).

Then, prescribed surface processing is made on the silicon substrate 14 to clean the surface of the silicon substrate 14.

Next, by, e.g., CVD and with the silicon oxide film 136 as the mask, a silicon layer 134 of, e.g., a 70 nm-thickness is epitaxially grown selectively on the surface of the silicon substrate 14 in the peripheral circuit region 12 (see FIG. 54B).

Figures 55A, 55B:
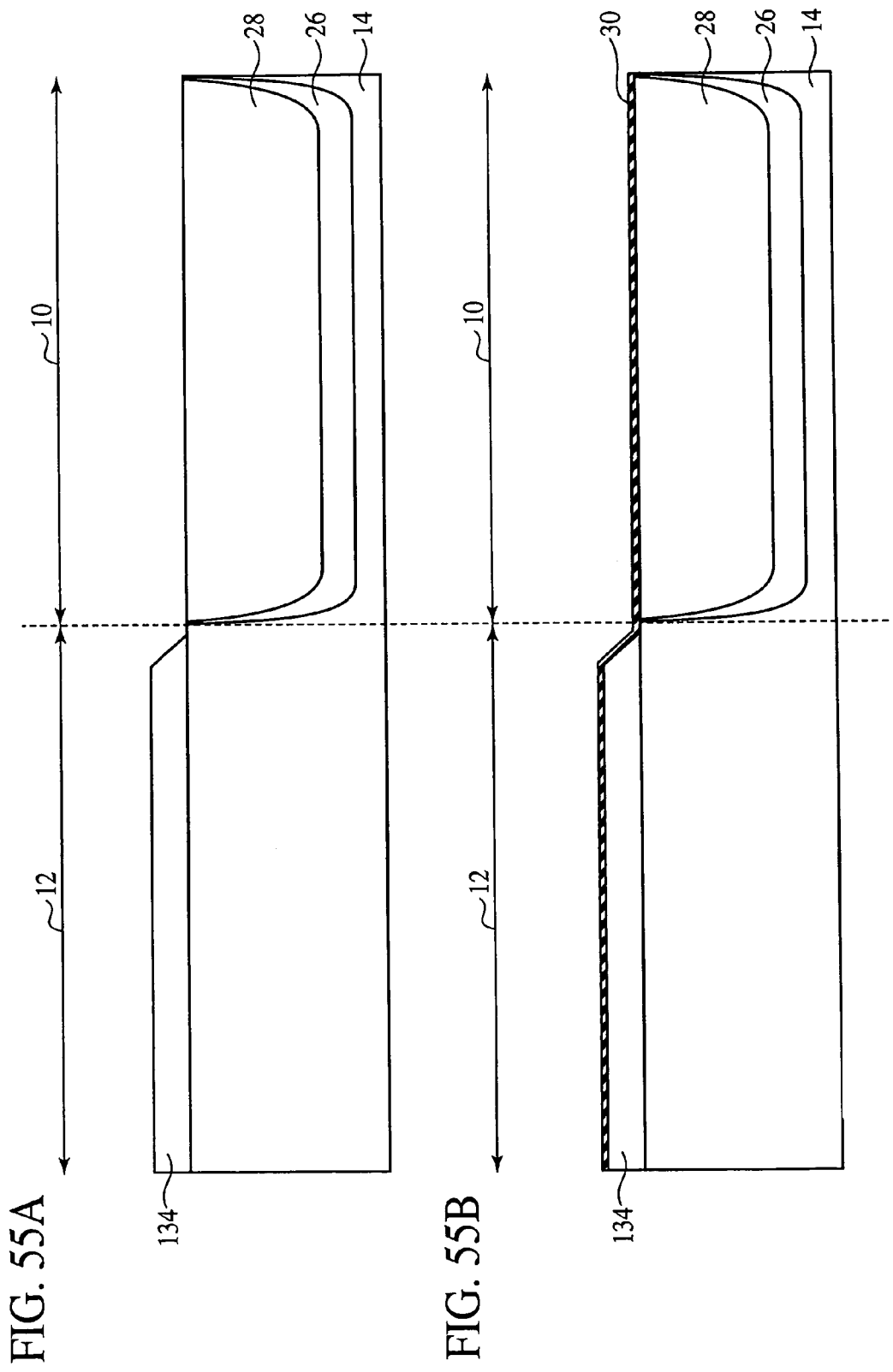

Next, the silicon oxide film 136 is etched by, e.g., wet etching to remove the silicon oxide film 136 in the flash memory cell region 10 (see FIG. 55A).

Then, a silicon oxide film 30 of, e.g., a 10 nm-thickness is grown by, e.g., thermal oxidation on the silicon substrate 14 with the silicon layer 134 epitaxially grown on the surface in the peripheral circuit region 12 (see FIG. 55B). The silicon oxide film 30 is to be used as a tunnel oxide film of the flash memory cells 46.

Figure 56A:
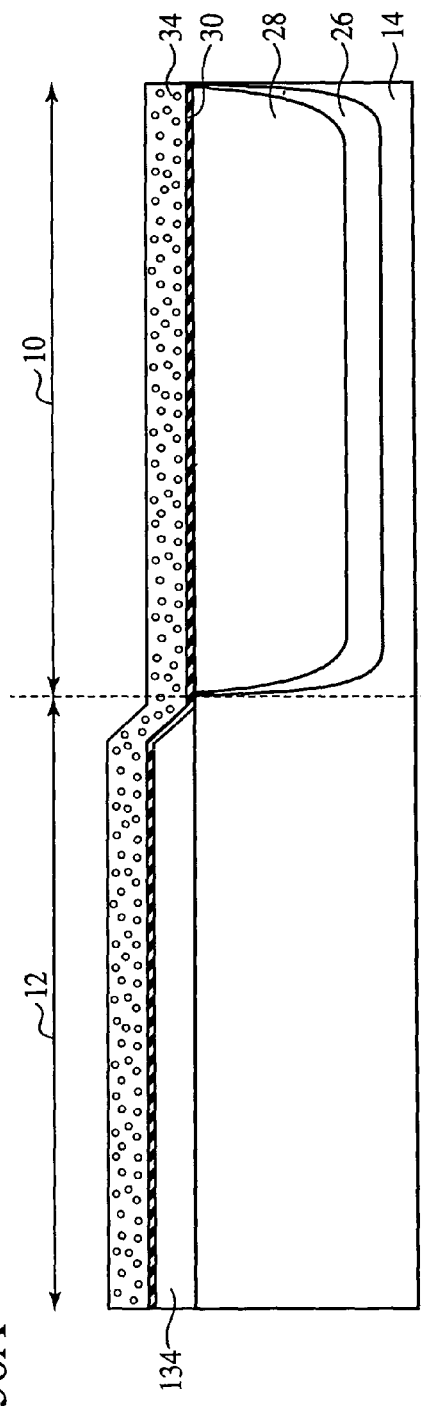

Next, a doped amorphous silicon film 34 of, e.g., a 70 nm-thickness is deposited on the silicon oxide film 30 by, e.g., CVD (see FIG. 56A). The doped amorphous silicon film 34 is to be used as the main portions of floating gates 32 of the flash memory cells 46.

Next, a photoresist film 96 covering the flash memory cell region 10 and exposing the peripheral circuit region 12 is formed on the doped amorphous silicon film 34 by photolithography.

Figure 56B:
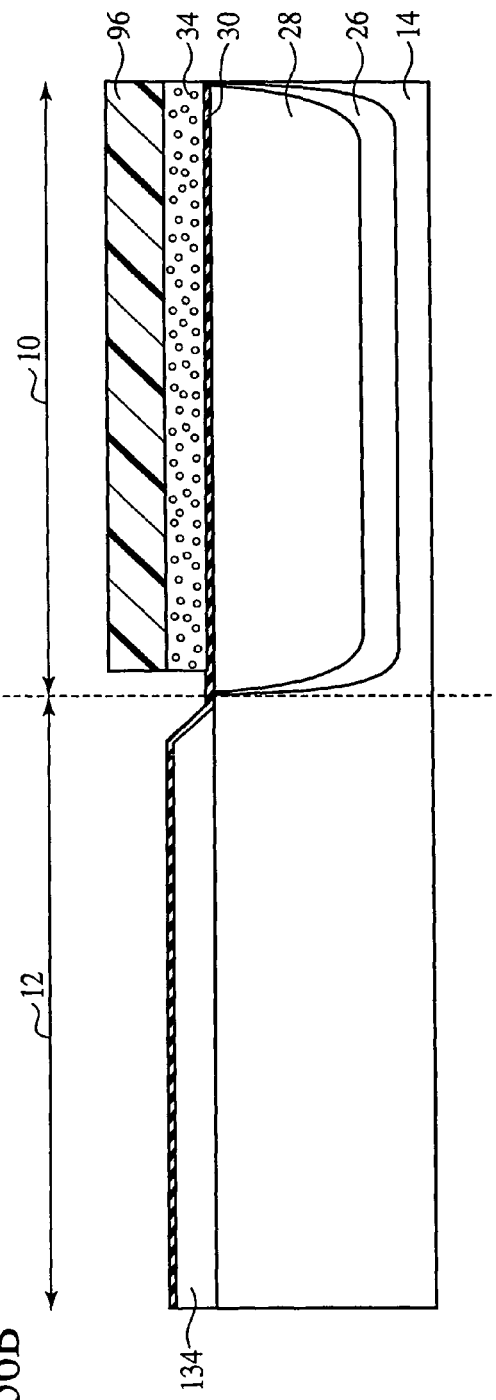

Next, with the photoresist film 96 as the mask and by, e.g., dry etching, the doped amorphous silicon film 34 is etched to remove the doped amorphous silicon film 34 in the region except the flash memory cell region 10 (see FIG. 56B).

Then, with the photoresist film 96 as the mask, the silicon oxide film 30 is etched.

Next, the photoresist film 96 is removed by, e.g., ashing.

Then, thermal oxidation corresponding to, e.g., 10 nm is made to grow a silicon oxide film 98 as a sacrifice oxide film on the silicon layer 134 and the doped amorphous silicon film 34.

Figures 57A, 57B:
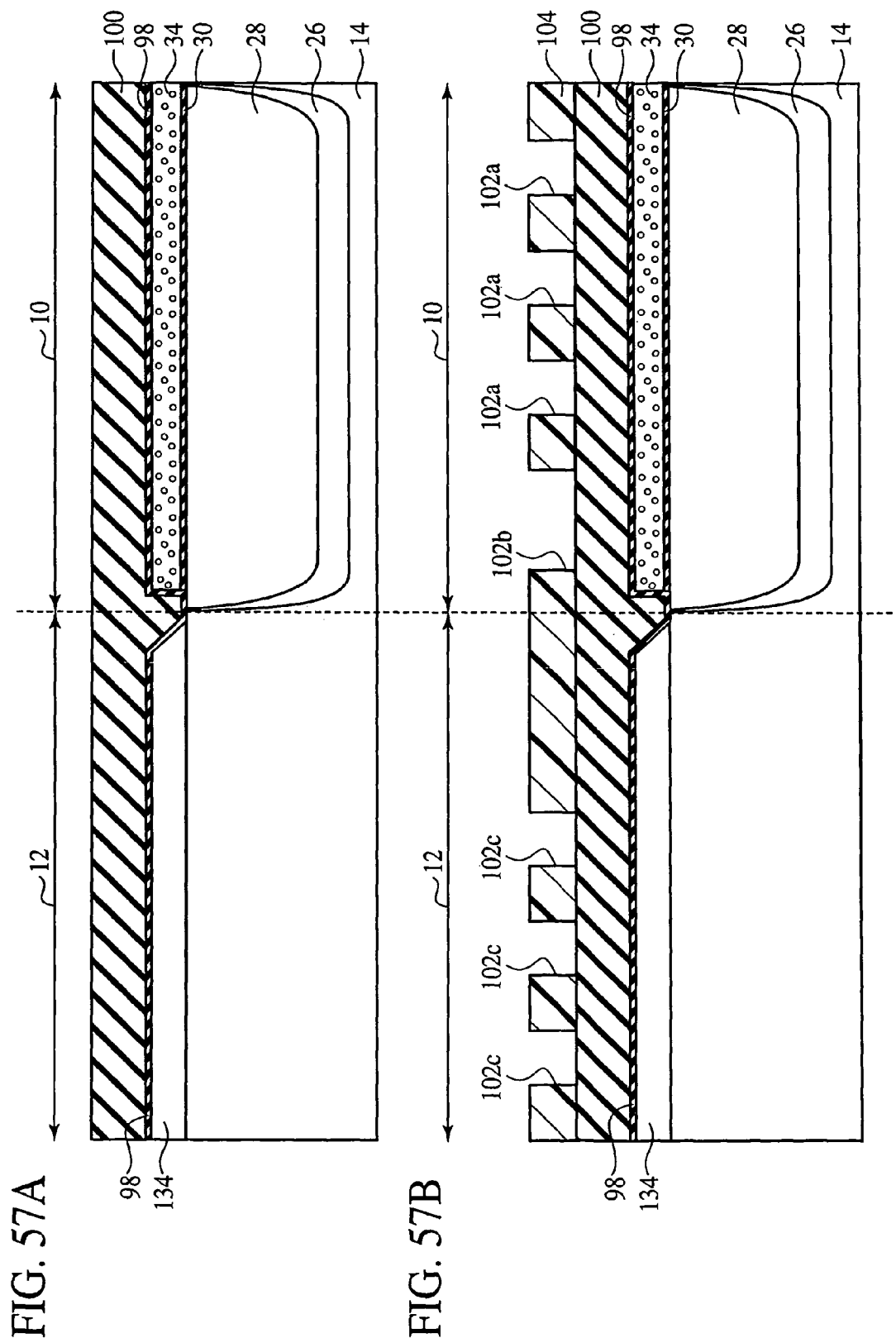

Next, on the silicon oxide film 98, a silicon nitride film 100 of, e.g., a 100 nm-thickness is deposited by, e.g., CVD (see FIG. 57A).

Next, a photoresist film 104 having openings 102a, 102b, 102c exposing regions for the trenches 18, 22, 24 for the device isolation to be formed in is formed on the silicon nitride film 100 by photolithography (see FIG. 57B). The height of the upper surface of the silicon substrate 14 with the silicon layer 134 formed on in the peripheral circuit region 12 is set substantially equal to the height of the upper surface of the doped amorphous silicon film 34 in the flash memory cell region 10, whereby the exposure of the photoresist film 104 by photolithography can be conducted with very high accuracy. Accordingly, the silicon substrate 14 in the peripheral circuit region 12 and the doped amorphous silicon film 34 forming the floating gates 32 can be patterned with high accuracy, which makes it possible to provide a semiconductor device including fine memory cells.

Figure 58A:
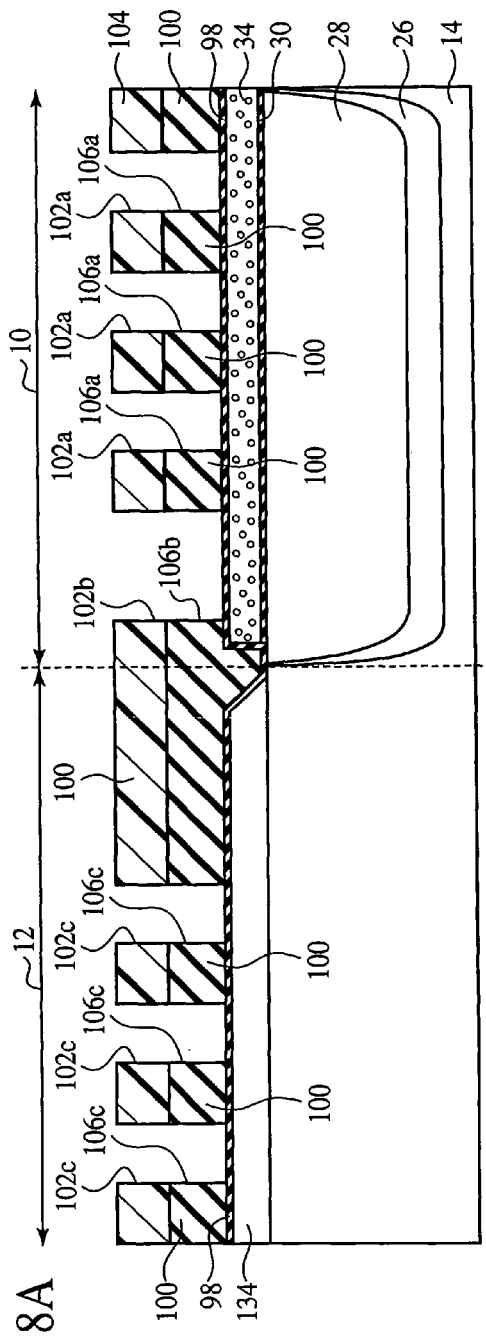

Then, with the photoresist film 104 as the mask and by, e.g., dry etching, the silicon nitride film 100 is etched to form in the silicon nitride film 100 openings 106a, 106b, 106c exposing the regions for the trenches 18, 22, 24 to be formed in (see FIG. 58A).

Figure 58B:
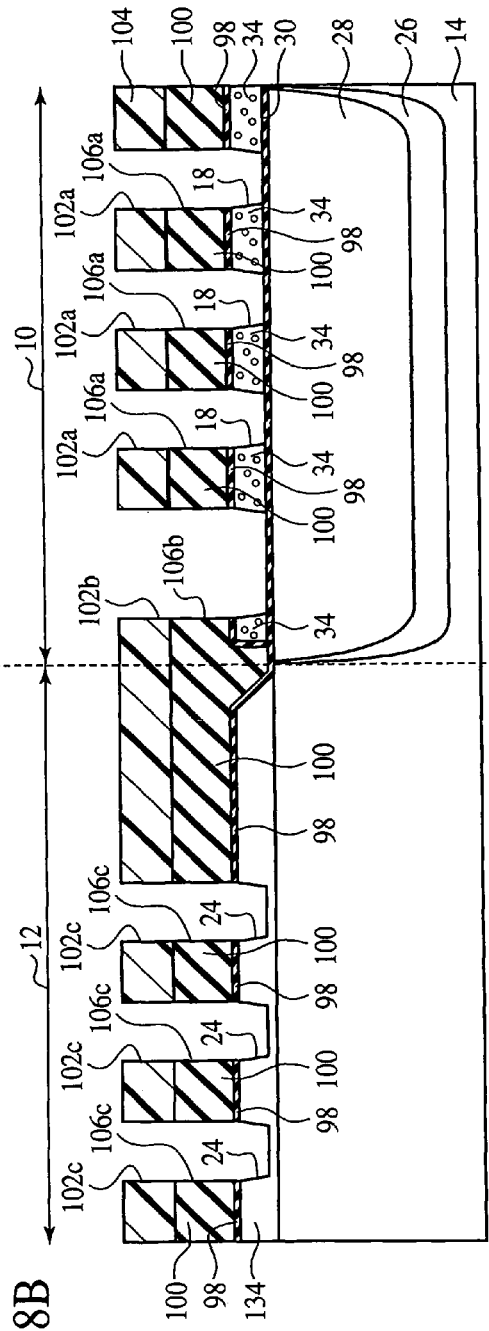
Figure 59A:
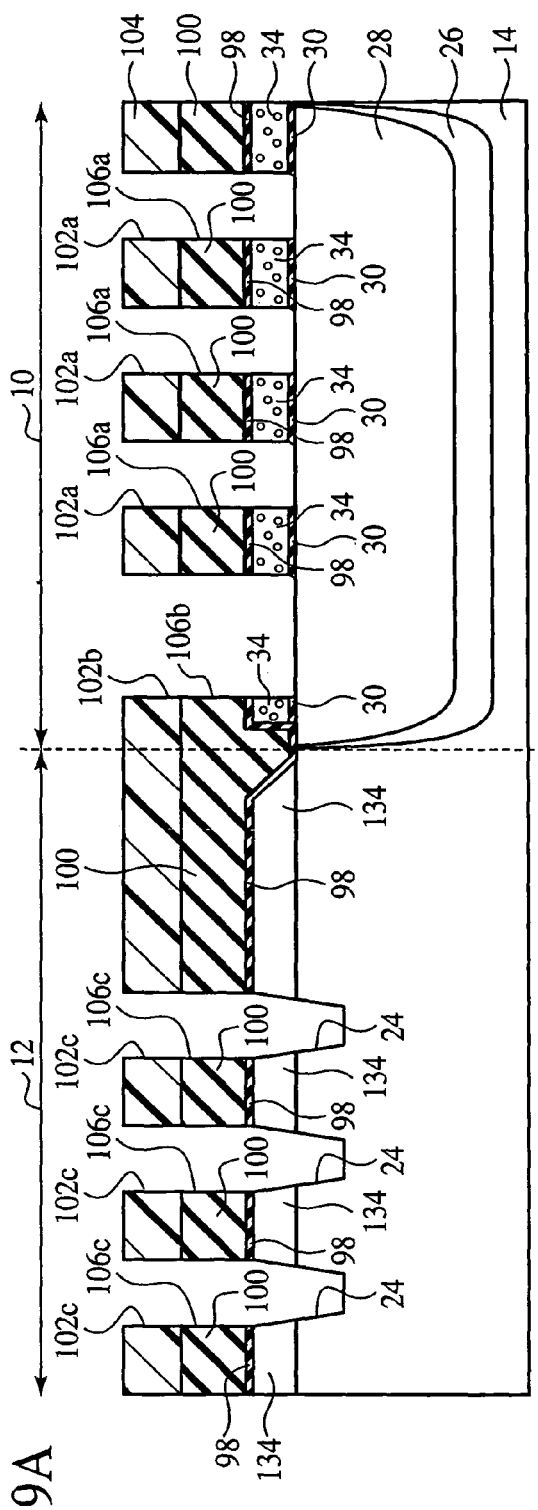
Figure 59B:
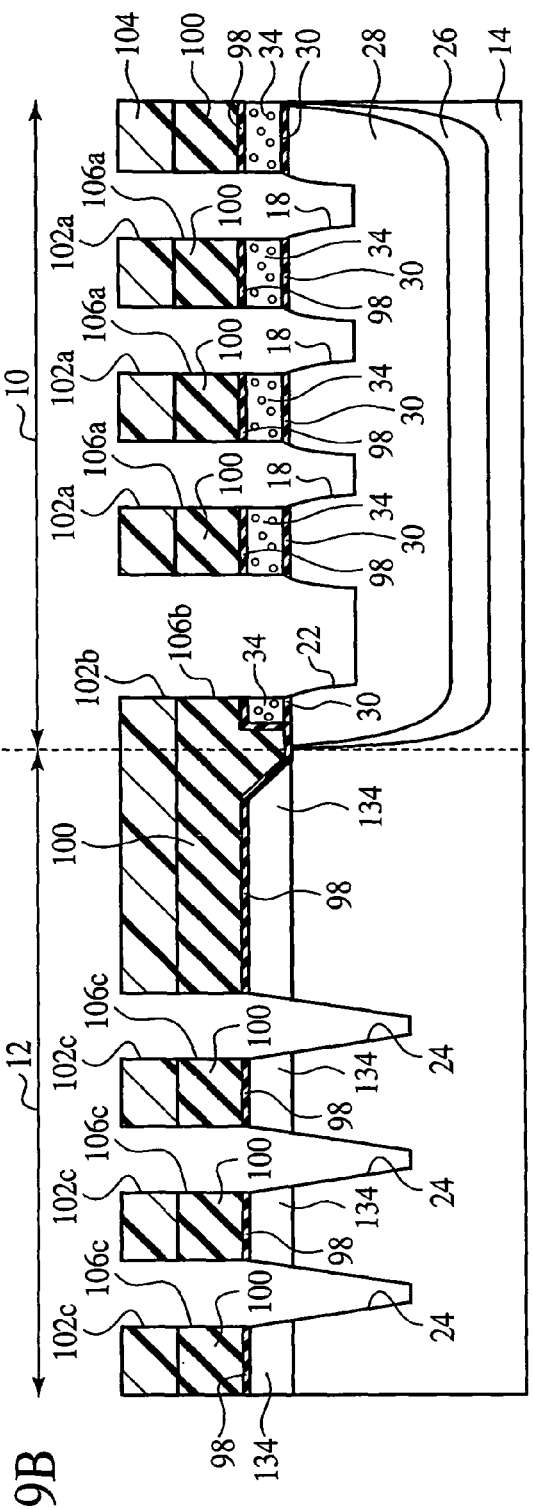

Next, with the photoresist film 104 and the silicon nitride film 100 as the mask, the silicon oxide film 98, the doped amorphous silicon film 34, the silicon oxide film 30 and the silicon substrate 14 exposed in the openings 106a, 106b are etched while the silicon oxide film 98 and the silicon substrate 14 with the silicon layer 134 epitaxially grown on the surface exposed in the opening 106c are etched (see FIGS. 58B, 59A and 59B). Thus, the trenches 18, 22 for the device isolation are formed in the flash memory cell region 10 while the trench 24 for the device isolation is formed in the peripheral circuit region 12 (see FIG. 59B). At this time, etching conditions are set so that the selectivity ratio of the silicon layer (the doped amorphous silicon film 34, the silicon substrate 14 and the silicon layer 134) to the silicon oxide film is, e.g., 10.

Here, after the silicon oxide film 98 has been etched off, the silicon layer (the silicon substrate 14 with the silicon layer 134 epitaxially grown) alone is etched in the opening 106c exposing the region for the trench 24 to be formed in. However, in the openings 106a, 106b exposing the regions for the trenches 18, 22 to be formed in, the silicon oxide film 30 is present below the doped amorphous silicon film 34. In the openings 106a, 106b, the etching advances slower than in the opening 106c because of the silicon oxide film 30 whose etching characteristics are different form those of the silicon layer. Thus, the trenches 18, 22 are formed shallower than the trench 24.

To be specific, first, in the openings 106a, 106b, the doped amorphous silicon film 34 is etched while in the opening 106c, the silicon layer 134 on the surface of the silicon substrate 14 is etched by a depth equal to an etched film thickness of the doped amorphous silicon film 34, and the trench 24 is formed in the silicon layer 134 (see FIG. 58B). For example, in the openings 106a, 106b, the doped amorphous silicon film 34 is etched by a 60 nm-thickness while in the opening 106c, the silicon layer 134 is etched by a 60 nm-depth, and the trench 24 of a 60 nm-depth is formed in the silicon layer 134.

FIG. 58B illustrates the state where the silicon oxide film 30 is exposed in the opening 106 by the etching.

Hereafter, the etching is further advanced, and the silicon oxide film 30 is etched at a relatively low rate in the openings 106a, 106b while the silicon substrate 14 with the silicon layer 134 epitaxially grown is etched at a relatively high rate in the opening 106c (see FIG. 59A). For example, when etching conditions which make the selectivity ratio of the silicon layer to the silicon oxide film become 10 are used, the silicon oxide film 30 is etched by a 10 nm-thickness in the openings 106a, 106b while in the opening 106c, the silicon substrate 14 with the silicon layer 134 epitaxailly grown is further etched by a 100 nm-depth, and the depth of the trench 24 is totally 160 nm.

FIG. 59A illustrates the state where the silicon substrate 14 in the opening 106a is exposed by the etching.

Hereafter, the etching is set on further, and the etching further advances at substantially the same rate in the openings 106a, 106b and the opening 106c (see FIG. 59B). For example, when the silicon substrate 14 is etched by a 140 nm-depth in the openings 106a, 106b, the silicon substrate 14 with the silicon layer 34 epitaxially grown is further etched also by a 140 nm-depth in the opening 106c, and the depth of the trench 24 is totally 300 nm. Thus, the trench 18 of a 140 nm-depth is formed in the silicon substrate 14 in the openings 106a, 106c while the trench 24 of a 300 nm-depth which is deeper than the trench 18 is formed in the silicon substrate 14 with the silicon layer 134 epitaxially grown in the opening 106c.

While the trenches 18, 22, 24 for the device isolation are being formed as described above, in the flash memory cell region 10, the doped amorphous silicon film 34 forming the floating gates 32 and the silicon oxide film 30 are patterned. That is, in the method for fabricating the semiconductor device according to the present embodiment, the trench 18 is formed by self-alignment when the doped amorphous silicon film 34 forming the floating gates 32 is patterned, as in the method for fabricating the semiconductor device according to the first embodiment. The trench 18 is formed when the doped amorphous silicon film forming the floating gates 32 is patterned, whereby the trench 18 can be formed without the pattern alignment of high accuracy. Thus, the present embodiment easily allows the memory cells to be downsized.

Next, the photoresist film 104 is removed by, e.g., ashing.

The following steps are the same as those of the method for fabricating the semiconductor device according to the first embodiment illustrated in FIGS. 18A to 41B, and their explanation will not be repeated.

Modified Embodiments

The present invention is not limited to the above-described embodiments and can cover other various modifications.

For example, in the above-described embodiments, the step is formed in the surface of the silicon substrate 14 by etching the silicon substrate 14 by chemical dry etching or removing the silicon oxide film 132 formed by oxidizing the surface of the silicon substrate 14. However, the technique of removing the surface of the silicon substrate 14 to form the step in the surface is not limited to the above. The step may be formed in the surface of the silicon substrate 14 by, e.g., etching the silicon substrate 14 by wet etching.

In the above-described embodiments, the step is formed in the silicon substrate 14 so that the surface of the silicon substrate 14 in the flash memory cell region 10 is lower than the surface of the silicon substrate 14 in the peripheral circuit region 12. However, depending on sizes of the device patterns, process allowances, etc., the step may not be formed in the surface of the silicon substrate 14.

In the above-described embodiments, the floating gate 32 comprises the main portion 34 and the sidewall portion 36. However, the floating gate 32 may comprise the main portion 34 alone without the sidewall portion 36.

What is claimed is:

1. A method for fabricating a semiconductor device comprising:
   forming a first conduction film to be a floating gate over a semiconductor substrate in a first region and in a second region with a first insulation film formed therebetween, the first insulation film having a first etching characteristic different from a second etching characteristic of the semiconductor substrate;
   removing the first conduction film in the second region;
   forming a mask over the first conduction film in the first region and over the semiconductor substrate in the second region, the mask having a first opening formed in the first region and a second opening formed in the second region;
   performing a first etching process etching the first conduction film exposed in the first opening until the first insulation film is exposed in the first opening while etching the semiconductor substrate exposed in the second opening;
   performing a second etching process etching the first insulation film exposed in the first opening until the semiconductor substrate is exposed in the first opening, while further etching the semiconductor substrate exposed in the second opening, wherein a first etching rate of the first insulation film in the second etching process is lower than a second etching rate of the semiconductor in the second etching process;
   performing a third etching process etching the semiconductor substrate exposed in the first opening while further etching the semiconductor substrate exposed in the second opening,
   forming a second insulation film over the semiconductor substrate etched by the first etching process, the second etching process, and the third etching process,
   forming a control gate over the floating gate with a third insulation film formed therebetween while forming a gate electrode of a transistor over the second region.

2. The method for fabricating a semiconductor device according to claim 1, further comprising before forming the first conduction film, forming a step in a surface of the semiconductor substrate so that a surface in the first region is lower than a surface of the second region.

3. The method for fabricating a semiconductor device according to claim 2, wherein
   in forming the step in the surface of the semiconductor substrate, the surface of the semiconductor substrate in the first region is selectively etched to form the step in the surface of the semiconductor substrate.

4. The method for fabricating a semiconductor device according to claim 3, wherein
   in forming the first conduction film, the first conduction film is formed so that a height of an upper surface of the semiconductor substrate in the second region is substantially the same as a height of an upper surface of the first conduction film in the first region.

5. The method for fabricating a semiconductor device according to claim 2, wherein
   in forming the step in the surface of the semiconductor substrate, the surface of the semiconductor substrate in the first region is selectively oxidized to form an oxide film, and the oxide film is removed to form the step in the surface of the semiconductor substrate.

6. The method for fabricating a semiconductor device according to claim 5, wherein
   in forming the first conduction film, the first conduction film is formed so that a height of an upper surface of the semiconductor substrate in the second region is substantially the same as a height of an upper surface of the first conduction film in the first region.

7. The method for fabricating a semiconductor device according to claim 2, wherein
   in forming the step in the surface of the semiconductor substrate, a semiconductor layer is selectively grown over the surface of the semiconductor substrate in the second region to form the step in the surface of the semiconductor substrate.

8. The method for fabricating a semiconductor device according to claim 2, wherein
   in forming the first conduction film, the first conduction film is formed so that a height of an upper surface of the semiconductor substrate in the second region is substantially the same as a height of an upper surface of the first conduction film in the first region.

9. The method for fabricating a semiconductor device according to claim 2, further comprising after forming the second insulating film and before forming the control gate, forming a sidewall portion of a second conduction film over a side wall of the floating gate.

10. The method for fabricating a semiconductor device according to claim 1, further comprising after forming the second insulating film and before forming the control gate, forming a sidewall portion of a second conduction film over a side wall of the floating gate.

11. The method for fabricating a semiconductor device according to claim 10, wherein
    in forming the sidewall portion, the second conduction film is buried between adjacent ones of a plurality of the floating gates and is etched to be left selectively on the side wall of the floating gates.

12. The method for fabricating a semiconductor device according to claim 1, further comprising, after forming the second insulation film and before forming the control gate:
    forming a second mask covering the second region and exposing the first region; and
    etching a part of the second insulation film in the first region with the second mask used as an etching mask.

* * * * *